United States Patent
Agrawal et al.

(10) Patent No.: US 6,449,082 B1
(45) Date of Patent: Sep. 10, 2002

(54) BUSBARS FOR ELECTRICALLY POWERED CELLS

(75) Inventors: Anoop Agrawal; Juan Carlos Lopez Tonazzi; Robert LeCompte; John Cronin; Steve Kennedy; Kevin McCarthy; Matthew Denesuk; Gimtong Teowee, all of Tucson, AZ (US)

(73) Assignee: Donnelly Corporation, Holland, MI (US)

( * ) Notice: Subject to any disclaimer, the term of this patent is extended or adjusted under 35 U.S.C. 154(b) by 0 days.

(21) Appl. No.: 09/956,341

(22) Filed: Sep. 20, 2001

Related U.S. Application Data

(62) Division of application No. 09/347,807, filed on Jul. 2, 1999, now Pat. No. 6,317,248.
(60) Provisional application No. 60/091,678, filed on Jul. 2, 1998.

(51) Int. Cl.[7] ............ G02F 1/153; G09G 3/19; G09G 3/38
(52) U.S. Cl. ............ 359/275; 359/273; 359/245; 345/49; 345/105; 250/214 SG
(58) Field of Search .......... 359/245, 273, 359/275, 267, 254, 271, 265; 264/1.31, 1.38, 1.7, 1.9; 345/49, 84, 105, 212; 250/214 SG

(56) References Cited

U.S. PATENT DOCUMENTS

| | | | |
|---|---|---|---|
| 3,521,941 A | 7/1970 | Deb et al. | 350/160 |
| 3,807,832 A | 4/1974 | Castellion | 350/160 R |
| 3,813,142 A | * 5/1974 | Buhrer | 359/254 |
| 4,164,365 A | 8/1979 | Saxe | 350/362 |
| 4,174,152 A | 11/1979 | Giglia et al. | 350/357 |

(List continued on next page.)

FOREIGN PATENT DOCUMENTS

| | | |
|---|---|---|
| EP | 0612826 A1 | 8/1994 |
| GB | 2 268 595 | 1/1994 |
| JP | 63-106730 | 5/1988 |
| JP | 63-106731 | 5/1988 |
| JP | 4-324842 | 11/1992 |
| WO | WO 97/38350 | 10/1997 |

OTHER PUBLICATIONS

C.M. Lampert, "Electrochromic Materials and Devices for Energy Efficient Windows", Solar Energy Materials, 11,1–27 (1984).

N.R. Lynam, "Electrochromic Automotive Day/Night Mirrors", SAE Technical Paper Series, 870636 (1987).

N.R. Lynam and A. Agrawal in "Automotive Applications of Chromogenic Materials", Large Area Chromogenics: Materials & Devices for Transmittance Control, Optical Engineering Press, Bellingham, Washington, pp. 46–84 (1989).

N. Basturk and J. Grupp in "Liquid Crystal Guest–Host Devices and Their Use as Light Shutters", Large Area Chromogenics: Materials & Devices for Transmittance Control, Optical Engineering Press, Bellingham, Washington, pp. 557–576 (1989).

(List continued on next page.)

*Primary Examiner*—Loha Ben
(74) *Attorney, Agent, or Firm*—Fitzpatrick, Cella, Harper & Scinto

(57) ABSTRACT

Edge busbars on a substantial perimeter of an electrochromic device are disclosed having electrical paths wrapping over the perimeter edge. Internal busbars interior from the perimeter are disclosed which lower the conductivity of the conductive layer of an electrochromic device. Signals supplied to the busbars to control the electrochromic device are controlled by a switching power supply that allows the maintaining of the color of the electrochromic device without application of continuous power.

9 Claims, 41 Drawing Sheets

U.S. PATENT DOCUMENTS

| | | | |
|---|---|---|---|
| 4,298,970 A | 11/1981 | Shawhan et al. | 367/82 |
| RE30,835 E | 12/1981 | Giglia | 350/357 |
| 4,338,000 A | 7/1982 | Kamimori et al. | 350/357 |
| 4,652,090 A | 3/1987 | Uchikawa et al. | 350/357 |
| 4,671,619 A | 6/1987 | Kamimori et al. | 350/357 |
| 4,702,566 A | 10/1987 | Tukude | 350/357 |
| 4,712,879 A | 12/1987 | Lynam et al. | 350/357 |
| 4,761,061 A | 8/1988 | Nishiyama et al. | 350/357 |
| 4,768,865 A | 9/1988 | Greenberg et al. | 350/357 |
| 4,793,690 A | 12/1988 | Gahan et al. | 350/279 |
| 4,799,768 A | 1/1989 | Gahan | 350/279 |
| 4,902,108 A | 2/1990 | Byker | 350/357 |
| 5,007,718 A | 4/1991 | Minoura et al. | 350/357 |
| 5,066,111 A | 11/1991 | Singleton et al. | 359/275 |
| 5,066,112 A | 11/1991 | Lynam et al. | 359/267 |
| 5,073,012 A | 12/1991 | Lynam | 359/265 |
| 5,076,673 A | 12/1991 | Lynam et al. | 359/271 |
| 5,076,674 A | 12/1991 | Lynam | 359/274 |
| 5,122,647 A | 6/1992 | Lynam et al. | 250/201.1 |
| 5,142,407 A | 8/1992 | Varaprasad et al. | 359/276 |
| 5,148,014 A | 9/1992 | Lynam et al. | 250/214 |
| 5,151,824 A | 9/1992 | O'Farrell | 359/604 |
| 5,187,607 A | 2/1993 | Endo et al. | 359/266 |
| 5,193,029 A | 3/1993 | Schofield et al. | 359/604 |
| 5,202,787 A | 4/1993 | Byker et al. | 359/267 |
| 5,212,583 A * | 5/1993 | Vali et al. | 359/245 |
| 5,220,317 A | 6/1993 | Lynam et al. | 340/785 |
| 5,231,531 A | 7/1993 | Defendini et al. | 359/275 |
| 5,239,406 A | 8/1993 | Lynam | 359/275 |
| 5,241,411 A | 8/1993 | Arribart et al. | 359/269 |
| 5,293,546 A | 3/1994 | Tadros et al. | 359/269 |
| 5,365,365 A | 11/1994 | Ripoche et al. | 359/267 |
| 5,377,037 A | 12/1994 | Branz et al. | 359/265 |
| 5,384,578 A | 1/1995 | Lynam et al. | 345/105 |
| 5,424,898 A | 6/1995 | Larson et al. | 361/101 |
| 5,472,643 A | 12/1995 | Varaprasad et al. | 252/583 |
| 5,604,626 A | 2/1997 | Teowee et al. | 359/265 |
| 5,657,149 A | 8/1997 | Buffat et al. | 359/275 |
| 5,657,150 A | 8/1997 | Kallman et al. | 359/265 |
| 5,668,663 A | 9/1997 | Varaprasad et al. | 359/608 |
| 5,694,144 A * | 12/1997 | Lefrou et al. | 345/49 |
| 5,724,176 A | 3/1998 | Nishikitani et al. | 359/271 |
| 5,744,267 A | 4/1998 | Meerholz et al. | 430/1 |
| 5,910,854 A * | 6/1999 | Varaprasad et al. | 359/273 |
| 6,124,886 A | 9/2000 | Deline et al. | 348/148 |
| 6,245,262 B1 * | 6/2001 | Varaprasad et al. | 264/1.31 |

OTHER PUBLICATIONS

N.R. Lynam, "Smart Windows for Automobiles", SAE Technical Paper Series, 900419 (1990).

Selkowitz, S.E., Lampert C.M., Large–Area Chromogenics: Materials and Devices for Transmittance Control, SPIE Optical Engineering Press, Bellingham, Washington, pp. 22–45 (1990).

Sapers, S.P., et al. in "Monolithic Solid–State Electrochromic Coatings for Window Applications", Proceedings of the Society of Vacuum Coaters Conference, pp. 248–255 (1996).

Matthew, J.G.H. et al., "Large Area Electrochromics for Architectural Applications", Journal of Non–Crystalline Solids 218, pp. 342–346 (1997).

Gao, J. et al., Applied Physics Letters, vol. 71, pp. 1293–1295 (1997).

Matthew, J.G.H. et al., Proc. of 3d Symposium on Electrochromic Materials, The Electrochemical Society, Proc. vol. 96–24, Pennington, NJ, 1997, pp. 311–325.

Badding, M.E., et al., Proc. of 3d Symposium on Electrochromic Materials, The Electrochemical Society, Proc. vol. 96–24, Pennington, NJ, 1997, pp. 369–385.

\* cited by examiner

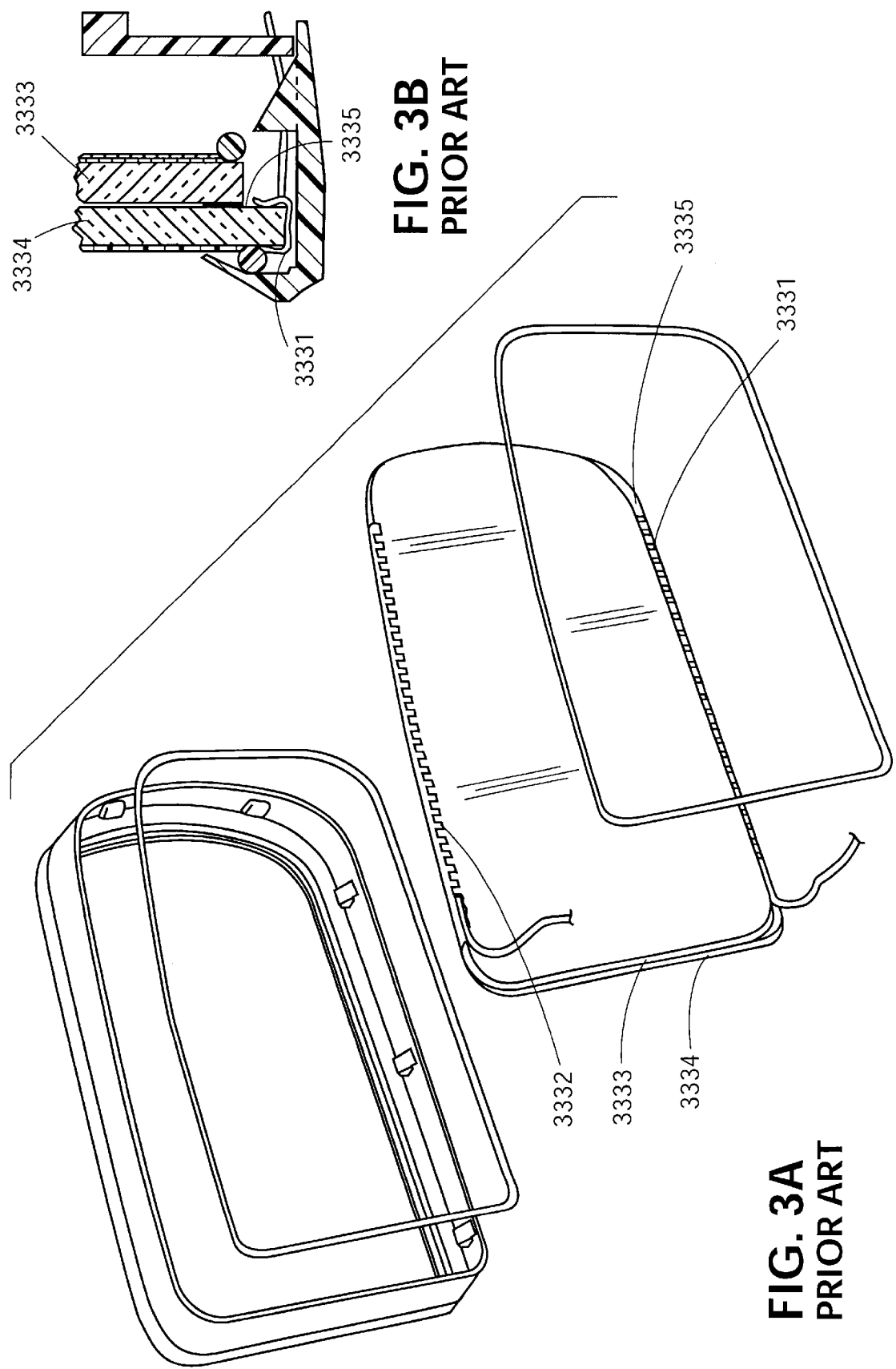

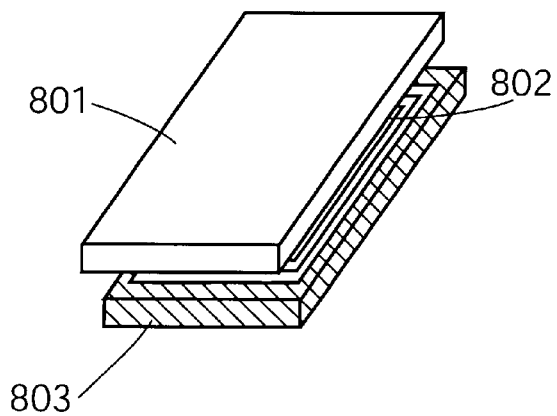
FIG. 8A
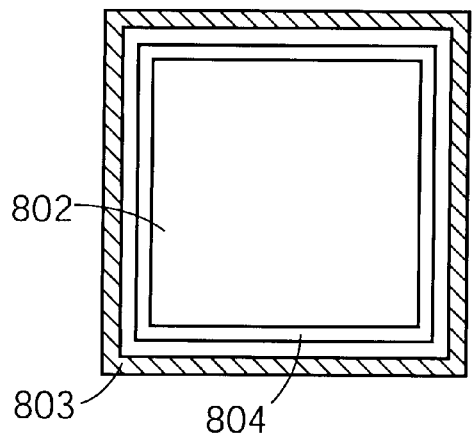    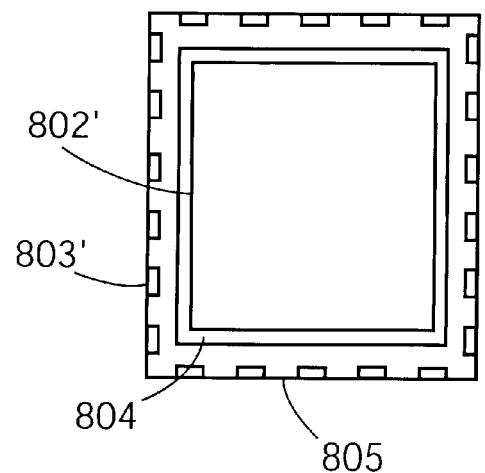
FIG. 8B    FIG. 8C

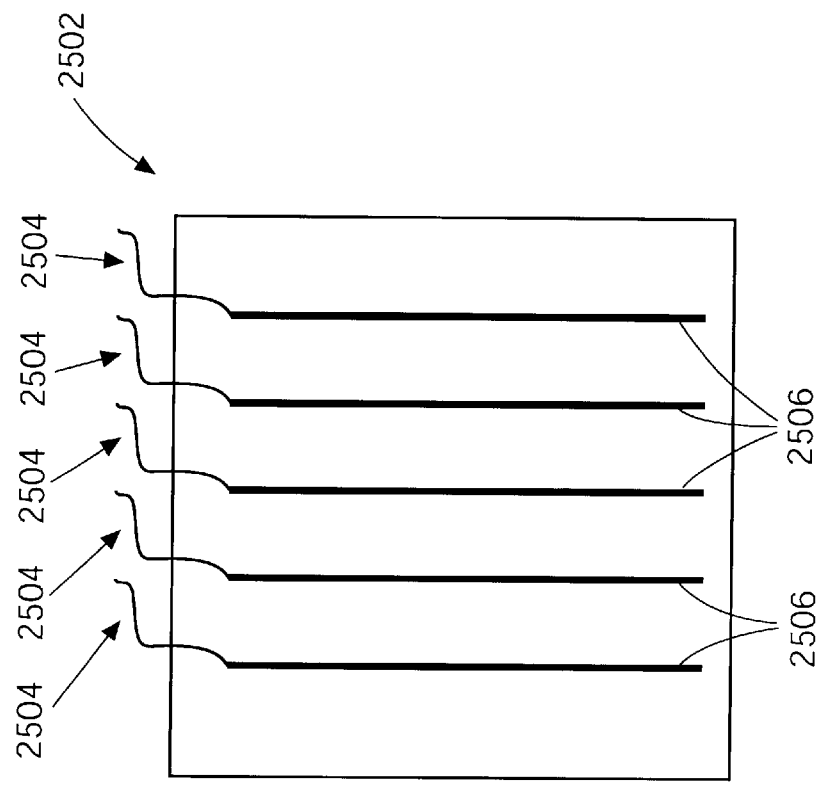
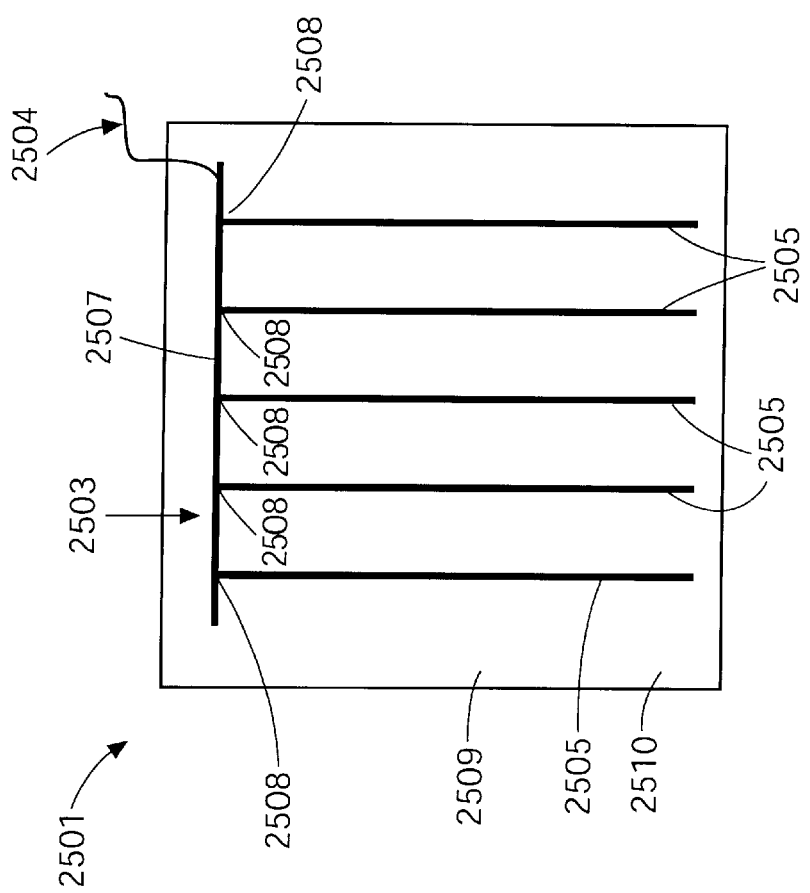

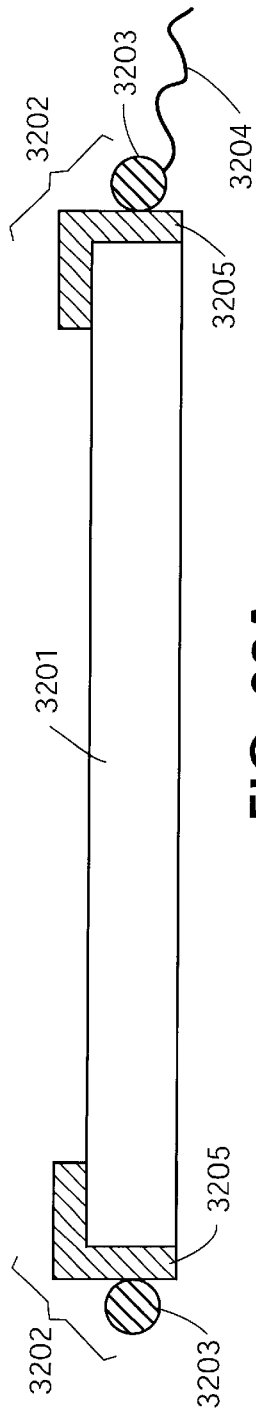
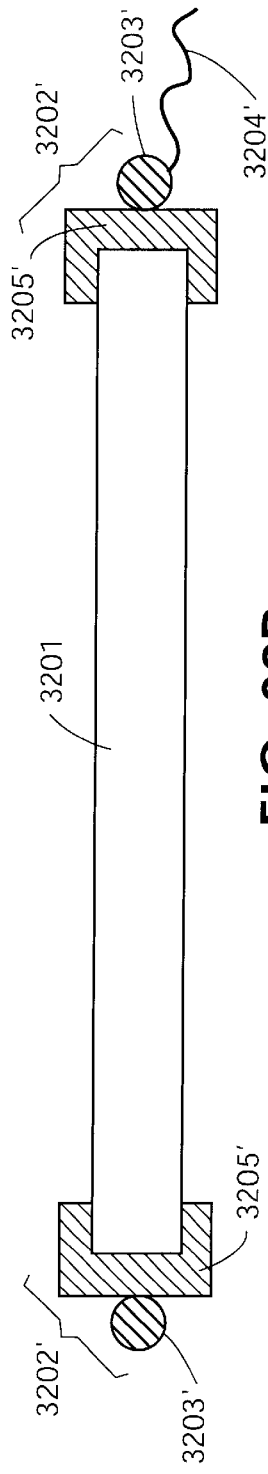
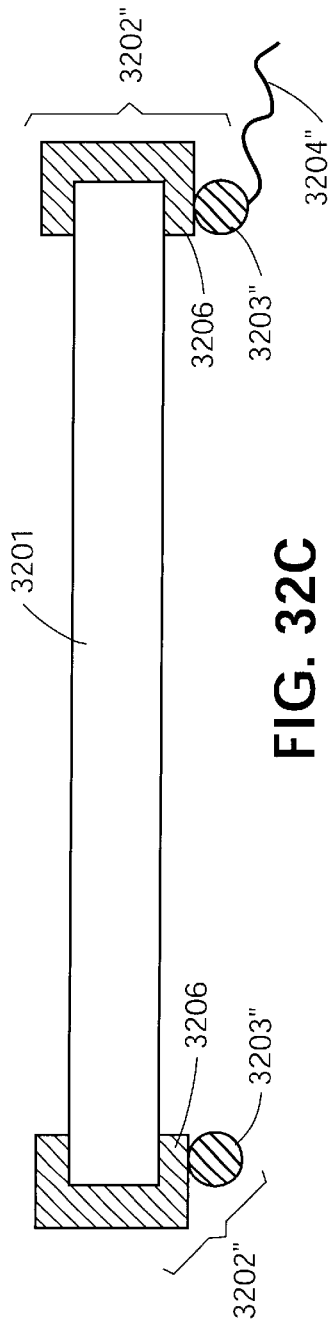
FIG. 32A
FIG. 32B
FIG. 32C

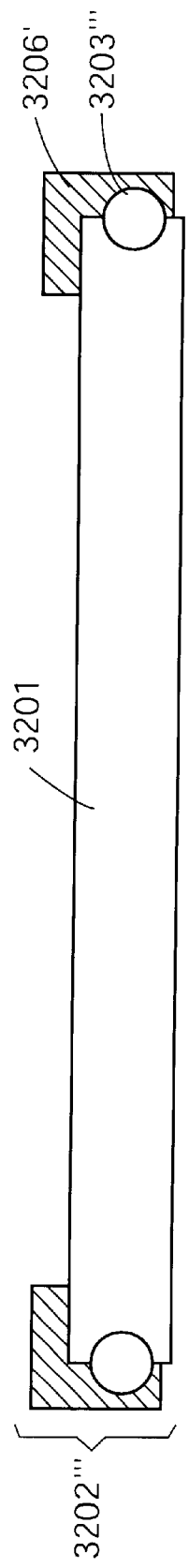
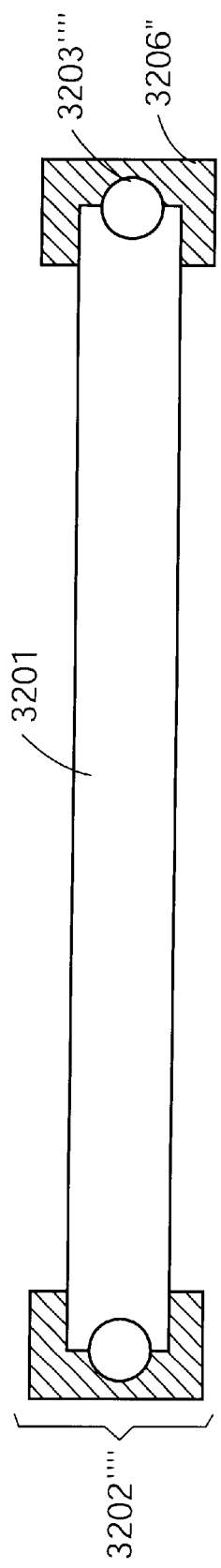
FIG. 32D
FIG. 32E

*notes: pins 4,5,6,7, and 7 are not used.

*notes: pins 4,5,6,7, and 7 are not used.

*notes: pins 4,5,6,7, and 7 are not used.

BUSBARS FOR ELECTRICALLY POWERED CELLS

This application is a divisional of U.S. patent application Ser. No. 09/347,807, filed Jul. 2, 1999, now U.S. Pat. No. 6,317,248 which claims the benefit of U.S. Provisional Application No. 60/091,678, filed Jul. 2, 1998.

BACKGROUND OF THE INVENTION

Field of the Invention

This invention relates to busbars utilized in electrically powered cells. In particular, this invention relates to edge and internal busbars utilized in electrochromic devices. This invention also relates to edge and internal busbars that can be utilized in other electrically powered cells such as electroluminescent and photochromic devices, thin-film batteries, and other cells that use geometries similar to the electrochromic devices described herein. Further, this invention relates to control circuits and methods to control the coloration of such electrochromic devices through an intermittent application of power.

Electrochromic (EC) devices are devices in which a change in an electrical signal applied to the EC device results in a change in an optical property of the EC device. Typically, the optical property is optical transmittance, although other properties can be affected such as, for example, optical spectral distribution or polarization. Electrochromic devices can be used for many applications, such as rear view automotive mirrors, windows, sunroofs, shades or visors for automotive and mass transportation applications, architectural windows, skylights, displays, light filters and screens for light pipes, displays, and other electro-optical devices.

A variety of technologies exist for producing chromogenic members. "Chromogenic devices", as used herein, is employed as commonly known in the art. Examples of these chromogenic devices include electrochromic devices, photochromic devices, liquid crystal devices, user-controllable-photochromic devices, polymer-dispersed-liquid-crystal devices, and suspended particle devices.

For example, electrochromic devices are discussed by N. R. Lynam and A. Agrawal in "Automotive Applications of Chromogenic Materials", *Large Area Chromogenics: Materials & Devices for Transmittance Control*, Optical Engineering Press, Bellingham, Wash. (1989), incorporated herein by reference. Other pertinent references include N. R. Lynam, "Electrochromic Automotive Day/Night Mirrors", *SAE Technical Paper Series*, 87036 (1987); N. R. Lynam, "Smart Windows for Automobiles", *SAE Technical Paper Series*, 900419 (1990); C. M. Lampert, "Electrochromic Devices and Devices for Energy Efficient Windows", *Solar Energy Materials*, 11, 1–27 (1984); JP 58-20729; and U.S. Pat. Nos. 3,521,941, 3,807,832, 4,174,152, 4,338,000, 4,652,090, 4,671,619, 4,702,566, 4,712,879, 4,793,690, 4,799,768, Re. 30,835, 5,066,112, 5,073,012, 5,076,674, 5,122,647, 5,142,407, 5,148,014, 5,239,406, and 5,657,149 each incorporated herein by reference.

Electrochromic panels are also discussed by Sapers, S. P., et al. in "Monolithic Solid-State Electrochromic Coatings for Window Applications", Proceedings of the Society of Vacuum Coaters Conference (1996), incorporated herein by reference, with regard to devices of the type shown in FIG. 1E. Devices comparable to that shown in FIG. 1E, and having photovoltaic layers for self-biasing operation are also described in U.S. Pat. No. 5,377,037.

Other related references of interest include U.S. Pat. No. 5,241,411, U.K. Patent No. 2,268,595, Japanese Laid-Open Patent No. Appln. No. 63-106730, Japanese Laid-Open Patent No. Appln. No. 63-106731, and U.S. Pat. No. 5,472,643, each incorporated herein by reference. Also pertinent is International Application No. PCT/US 97/05791, incorporated herein by reference, which pertains to electrochromic devices that can vary the transmission or reflection of electromagnetic radiation by applying an electrical stimulus to an EC device. International Application No. PCT/US 97/05791 uses a selective ion transport layer in combination with an electrolyte having at least one redox active material to provide a high-performance device.

Also suitable for use in this invention are liquid crystal devices such as those described by N. Basturk and J. Grupp in "Liquid Crystal Guest-Host Devices and Their Use as Light Shutters", *Large Area Chromogenics: Materials & Devices for Transmittance Control*, Optical Engineering Press, Bellingham, Washington (1989), incorporated herein by reference.

User-controllable-photochromic devices (UCPC) are discussed in U.S. Pat. No. 5,604,626, entitled "Novel Photochromic Devices", incorporated herein by reference.

Polymer-dispersed-liquid-crystal (PDLC) devices are described by N. R. Lynam and A. Agrawal, "Automotive Applications of Chromogenic Materials", *Large Area Chromogenics: Materials & Devices for Transmittance Control*, Optical Engineering Press, Bellingham, Wash. (1989), incorporated herein by reference.

Suspended particle devices are discussed in U.S. Pat. No. 4,164,365, incorporated herein by reference.

Examples of chromogenic devices that emit light are described in Applied Physics Letters, Vol. 71, page 1293 (1997).

Examples of chromogenic devices that can store image patterns due to a change in an optical property of a material are described in U.S. Pat. No. 5,744,267, incorporated herein by reference.

The general control of chromogenic devices is discussed in U.S. Pat. Nos. 4,793,690, 4,799,768, 5,007,718, and 5,424,898, incorporated herein by reference.

The phenomenon of prolonged coloration of chromogenic devices is discussed in U.S. Pat. Nos. 5,076,673 and 5,220,317, each incorporated herein by reference.

FIGS. 1A through 1E depict typical examples of known electrochromic devices, while FIG. 1F shows another known type of chromogenic device.

For example, FIG. 1A depicts a layered EC device which includes a substrate 101, transparent conductor 103, electrochromic (redox) medium 105, transparent conductor 103' and substrate 101'.

FIG. 1B illustrates a layered EC device which includes a substrate 101, transparent conductor 103, EC layer 107, electrolyte (redox medium) 109, transparent conductor 103' and substrate 101'.

FIG. 1C shows another layered EC device having a substrate 101, transparent conductor 103, EC layer 107, ion-selective transport layer 111, electrolyte (redox medium) 109, transparent conductor 103' and substrate 101'.

Still another such EC device is shown in FIG. 1D. This device includes a substrate 101, transparent conductor 103, EC layer 107, electrolyte 113, counterelectrode 115, transparent conductor 103' and substrate 101'.

FIG. 1E shows an EC device having a substrate 101, transparent conductor 103, EC layer 107, electrolyte (ion-conductive layer) 117, counterelectrode 115 and transparent conductor 103'.

A typical liquid crystal or PDLC device is shown in FIG. 1F. This device includes a substrate 201, transparent conductor 203, liquid crystal or PDLC medium 205, transparent conductor 203' and substrate 201'.

Since the above chromogenic devices are known to those skilled in the art, a detailed explanation of the manner of construction and operation of such devices is not necessary.

In general, it is important to distribute the voltage to an electrochromic (EC) device uniformly in order to (i) maintain the uniformity of the coloration and bleaching of the EC device during changes between such states of coloration and bleaching, (ii) to improve uniformity in such colored and bleached states, and finally (iii) to enhance the kinetics of coloration and bleaching. As the size of an EC device increases, it becomes increasingly more difficult to maintain the desirable voltage distribution uniformity because increased size typically leads to increased resistance of various components. Such increased resistance results in voltage drops and current losses that adversely affects the uniformity of voltage distribution.

In other electrical devices, a particular spatial voltage distribution profile often is desired. As the size of such devices increases, similar to the example of EC devices, it also becomes increasingly more difficult to maintain the desired spatial voltage distribution profile because of the increasing electrical resistance of various components.

An applied voltage is commonly distributed at the periphery of EC devices through the use of an edge busbar which distributes an applied voltage to a surface conductor electrode. The applied voltage causes a response in a particular responsive property of an EC device. Consequently, spatial or temporal differences in the applied voltage will cause spatial or temporal differences in the responsive property. Ohmic losses along an edge busbar can therefore critically affect the even distribution of voltage, leading to undesirable non-uniformities in the coloration and bleaching of an EC device.

Furthermore, EC devices often employ thin film transparent conductors such as indium tin oxide (ITO) and doped tin oxides (DTO) for the surface conductor electrode. Such thin film transparent conductors are also used in a wide range of applications in other areas such as displays, solar cells, and liquid crystal devices. If the magnitude of the electrical currents in such devices is large, there can be a considerable electrical potential drop across the transparent conductor. Similar to the effect of voltage variations along an edge busbar, variations of voltage in thin film transparent conductors can also lead to spatial inhomogeneities in the device behavior as well as to slower overall device kinetics. Such effects become increasingly noticeable and problematic with increasing device area.

Another related aspect of electrochromic devices is that they are current consuming devices. Accordingly, it is advantageous for the transparent conductors, i.e., the surface electrodes, to be very conductive. For applications such as large area EC panels, where current consumption is large, it is particularly important that the transparent conductors possess high effective conductivities. Present conventional large-area EC devices fabricated from commercially available transparent conductors such as, for example, ITO and DTO, generally possess slow kinetics and often display nonuniform coloring. For example, large-area EC devices presently are often darker at the edges than in the center.

EC devices can be fabricated on one substrate as described in U.S. Pat. No. 4,712,879; J. Gordon H. Matthew et. al., *Proc. of 3d Symposium on Electrochromic Materials*, The Electrochemical Society, Proc. Volume 96–24, Pennington, N.J., 1997, p. 311; and Badding, M. E., et al., *Proc. of a 3d Symposium on Electrochromic Materials*, The Electrochemical Society, Proc. Volume 96–24, Pennington, N.J., 1997, p. 369, each incorporated herein by reference.

Electrochromic devices can also be made using two substrates as described in U.S. Pat. Nos. 4,761,061, 4,768,865, 4,902,108, 5,142,407, 5,231,531, 5,472,643, and U.S. patent application Ser. No. 09/155,601, filed Aug. 9, 1997, each incorporated herein by reference.

Prior art EC devices are also described in Lynam N. R., Agrawal, A., *Automotive Applications of Chromogenic materials, in Large-Area Chromogenics: Materials and Devices for Transmittance Control*, SPIE Optical Engineering Press, Bellingham, Wash., 1990, p. 46 and Lampert C. L., Selkowitz, S. E., *Large-Area Chromogenics: Materials and Devices for Transmittance Control*, SPIE Optical Engineering Press, Bellingham, Wash., 1990, p. 22, each incorporated herein by reference.

U.S. Pat. Nos. 5,202,787 and 5,151,824, each incorporated herein by reference, show the way busbars in an EC device are typically put on the substrate edges in the prior art. As shown in FIGS. 2, 3A, and 3B, taken from the referenced patents, in a commercial EC automotive mirror which features two substrates 2223 and 2224, or 3333 and 3334, the substrates are staggered slightly with respect to each other. Spring clips 2221 and 2222, or 3331 and 3332, of a conductive material such as a copper sheet or a beryllium copper coated with tin are clipped to the two staggered edges of substrates 2223 and 2224, or 3333 and 3334, in order to provide an electrical connection to substrates 2223 and 2224, or 3333 and 3334. The two substrates must be offset, or staggered, from each other in order to expose surfaces 2225 and 3335 for the attachment of clips 2221 and 2222, or 3331 and 3332. The surfaces 2225 and 3335 are minimized in order to maximize the optical throughput area of the device—that is, to maximize the overlapping area of the two substrates. Accordingly, the prior art provides electrical connections at less than one half of the perimeter of each substrate.

When a potential is applied to the wire clips 2221 and 2222, or 3331 and 3332, only a small potential drop occurs in these clips because of their high conductivity. The small potential drop can be neglected for small dimensions. However, as the dimensions of the application increases, the potential drop can become significant. Such potential drops can be a problem because the potential drop comes at a cost to the potential available to the chromogenic elements themselves. Further, significant current flow can occur at the clips and clip junctions, thereby adversely adding to the overall current load.

The resistance of a typical wire clip used in commercial automotive mirrors that are about 12 inches (30 cm) in length is about 0.2 Ω. The conductivity associated with the clip depends on the intrinsic conductivity of the material, the geometric parameters of the clip (such as thickness, width and the length of the strip), and on the relevant contact resistance.

To demonstrate the current consumption in the EC devices, a commercial EC automotive mirror was colored by applying a DC step voltage of 1.4V. The mirror initially consumed a current of 3 mA/cm$^2$, decreasing to 0.9 mA/cm$^2$ in the fully colored state.

According to Hichwa, B.Pl, "Large Area Electrochromics for Architectural Applications", *International Conference on*

*Coatings on Glass*, Saarbrucken, Germany, October 1996, an EC window device made from all thin films on a single substrate when powered at 1.8V showed an initial current consumption of about 2 mA/cm$^2$ which decreased to about 1 $\mu$A/cm$^2$ in the colored steady-state. By assuming that such devices can be fabricated with the above current values scaling with size while keeping similar performance characteristics, the current consumption can be calculated for an EC automotive mirror and a single substrate EC window at different dimensions.

Table 1 shows the current consumption of the devices with two different active areas: (1) 6 inches by 6 inches (15 cm×15 cm) and (2) 12 inches by 12 inches (30 cm×30 cm).

TABLE 1

| Device type/Size | Initial current consumption | Colored (steady state) current consumption |
|---|---|---|
| Auto Mirror, 6 inch (15 cm) | 0.7 A | 0.2 A |
| Thin film window, 6 inch (15 cm) | 0.5 A | 0.2 mA |
| Auto Mirror, 12 inch (30 cm) | 2.8 A | 0.8 A |
| Thin film window, 12 inch (30 cm) | 1.9 A | 0.9 mA |

Therefore, as the size of the EC device increases, the current loads that the electrodes must carry are substantially increased.

Table 2 shows the resistance characteristics of several materials and the resistance associated with a tape with a dimension of 1 meter in length, 2 mm in width and 0.1 mm in thickness. Table 2 also shows the resistance drop in these tapes when they carry 0.1, 1 and 10 A of current.

As seen in Table 2, several materials incur serious voltage drops across their resistance runs (for a specific geometry) for the amount of current that must be provided to the EC cell. Since EC devices are typically powered at 1 to 3 volts, the voltage drop can significantly affect the actual voltage applied to the EC material, causing increases in coloration and bleach times, and in certain devices, leading to nonuniform coloration in the steady state condition. The problem of the voltage drop, resulting from the electrode resistance, is compounded by the increase in current when the size of the device gets larger as seen previously in Table 1. This invention is particularly useful for those EC devices where the current consumption exceeds 0.1 A during either coloring or bleaching processes.

When chromogenic devices are fabricated using two coated substrates, the typical gap between the substrates is in the range of from 10 to 1000 micrometers. As the size of the devices increases, such as for a six inch by six inch (15 cm×15 cm) device, in order to increase the charge throughput and to distribute the charge uniformly, it is important that busbars be applied to as much of the device perimeter as possible.

One prior art approach for a rectangular device as shown in FIG. 4, is to offset substrates 3301 and 3302 simultaneously around two edges of a corner to provide two exposed L-shaped surfaces 3304. Then, busbars 3303 are attached in a conventional way.

In another prior art approach, busbars 5503 are applied on opposite edges of exposed surface pairs 5504 by employing the geometry as shown in FIG. 5 where the rectangular substrates 5501 and 5502 are pivoted from each other so that the long dimension of each rectangular substrate is parallel to the short dimension of the other rectangular substrate.

Neither approach provides busbar coverage of a substantial perimeter of a substrate. As used herein, "substantial perimeter" means more than half of the perimeter of a substrate which is covered by a continuous busbar. For

TABLE 2

| Material | Resistivity at 25° C. (10$^{-8}$ $\Omega$m) | Resistance ($\Omega$) | Data for one m long tape with a width of 2 mm and a thickness of 0.1 mm | | |
|---|---|---|---|---|---|
| | | | Voltage drop at 0.1 A (v) | Voltage drop at 1 A (v) | Voltage Drop at 10 A (v) |
| Aluminum | 2.71 | 0.1355 | 0.01355 | 0.1355 | 1.355 |
| Copper | 1.71 | 0.0855 | 0.00855 | 0.0855 | 0.855 |
| Gold | 2.21 | 0.1105 | 0.01105 | 0.1105 | 1.105 |
| Silver | 1.62 | 0.081 | 0.0081 | 0.081 | 0.81 |
| Tungsten | 5.39 | 0.2695 | 0.02695 | 0.2695 | 2.695 |
| ITO | 200 | 10 | 1 | 10 | 100 |
| Stainless steel type 304 | 72 | 3.6 | 0.36 | 3.6 | 36 |
| Tin | 11.5 | 0.575 | 0.0575 | 0.575 | 5.75 |
| Copper/beryllium (98/2) | | | | | |
| Indium | 8 | 0.4 | 0.04 | 0.4 | 4 |
| Nickel | 7.12 | 0.356 | 0.0356 | 0.356 | 3.56 |
| Rhodium | 4.3 | 0.215 | 0.0215 | 0.215 | 2.15 |
| Nichrome | 150 | 7.5 | 0.75 | 7.5 | 75 |
| Solder (Pb/Sn, 67/33) | 16 | 0.8 | 0.08 | 0.8 | 8 |
| Solder (Sn/Ag, 95/5) | 25 | 1.25 | 0.125 | 1.25 | 12.5 |
| Conductive epoxy Ablebond ® 8380 | 300 | 15 | 1.5 | 15 | 150 |
| Silver Frit (Dupont, 1991) | 7 | 0.35 | 0.035 | 0.35 | 3.5 | larger devices such as those bigger than about 6 inches (15 cm) in width and length, it is especially desirable to put the busbars all around the device, in a manner which covers a substantial perimeter of each substrate in order to provide the applied signal to the entire chromogenic panel evenly.

Nevertheless, as described above, as the length of the busbar run increases, the resistance undesirably increases. As a result, the prior art increases the thickness of the busbar material for large devices in order to increase the conductivity/unit length of the busbar in an attempt to maintain the desirably low resistance of the busbar. However, a major problem with the use of conventional busbars such as spring clips and wires for such large chromogenic applications arises when the thickness of the busbar exceeds the typical cell gaps. Even when the thickness of the busbar does not exceed the cell gap, the geometries of the prior art busbars and their placement limit the allowable increases to conductivities. Further, there may also be a problem around substrate corners when one continuous strip of the prior art busbar clip is used.

Another method with substantial coverage is provided all around the periphery, by using thin conductors, as shown in U.S. Pat. No. 5,066,112. However, in this case, the conductor thickness is limited by the gap between the substrates and its width.

Another approach is to make the two substrates dissimilar in size so that the edges of one substrate extend from all around the perimeter of the other substrate. In this configuration, conventional wire clip busbars can be used on the larger substrate. However, it is difficult to attach conventional wire clip busbars to the smaller substrate due to the limited gap available between the two substrates. The very close geometry could cause electrical shorting of the two substrates at the conventional wire clip busbar of the smaller substrate.

As noted above, in addition to the problem of voltage drops from the edge busbar clips, if the magnitude of the electrical currents in EC devices is large, there can be a considerable electrical potential drop across the thin film transparent conductor, leading to detrimentally slower overall device kinetics and spatial inhomogeneities in the EC device behavior. Therefore, for applications where current consumption is large, and especially where the area of the EC devices is large (e.g., chromogenic panels), it is particularly important that the transparent conductors possess large effective conductivities. Large-area EC devices fabricated from commercially available transparent conductors such as, for example, indium tin oxide (ITO) and doped tin oxide (DTO) generally possess slow kinetics and often display nonuniform coloring (e.g., darker at the edges to which the busbars are connected than in the center).

Values for the sheet resistance of commercially available transparent conductors such as ITO and DTO are typically greater than about 5 $\Omega$/sq (the units are also commonly written as $\Omega$/■) to about 15 $\Omega$/sq. Lower sheet resistances may be obtained by increasing the thickness of the transparent conductor, but this adversely affects the optical properties (e.g., increased haziness and/or diminished transmissivity) and also adds appreciably to the cost. It is desirable to form substrates which possess appreciably lower effective sheet resistance (can be less than 1 $\Omega$/sq) at a cost that is attractive for applications such as those described above.

U.S. Pat. No. 5,293,546, incorporated herein by reference, describes a method for making a display device in which one of the electrodes is preferably a metallic grid. Preferred line widths were 20 micrometers with line spacings of 500 micrometers and line heights of 0.2 to 3 micrometers. The grid is then coated by a metal oxide (e.g., 1000 Å of ITO). The invention relates to displays in which high resolution processing equipment must be used for depositing the grid pattern. Thus the cost is high, particularly if large substrates such as 6 inch×6 inch (15 cm×15 cm) or bigger are required because maintaining high precision in such a fine grid pattern over increasing areas is costly. Further, since these substrates must be over-coated with ITO, they are unable to use more cost effective, mass produced transparent conductors, such as mass produced ITO or inexpensive DTO deposited onto glass sheets in a float line.

U.S. Pat. No. 4,768,865, incorporated herein by reference, describes the use of a free-standing metallic grid as one of the transparent conductors. In this invention, the metal grid participates directly in the electrochemical reaction in the EC cell. However, for most EC devices, it is not desirable for the electron conductor also to participate in the reaction.

U.S. Pat. No. 5,724,176, incorporated herein by reference, describes the use of a counterelectrode for a smart window that contains a transparent substrate and a linear electrically conductive material formed on a surface of the transparent substrate. A layer of an electrochromic material is formed on the window's surface, and a layer of an electrolyte is arranged between the counterelectrode and the electrochromic electrode and in contact with the layer of the electrochromic material. Various patterns are described for the placement of the linear electrically conductive material.

U.S. Pat. No. 5,066,111, incorporated herein by reference, describes laminated EC devices. A metal grid on a glass substrate is employed as one electrode and a longitudinal set of busbars, preferably composed of a metal foil such as copper, or an electroconductive ceramic frit deposited on glass or on the surface of an electro-conductive film, is employed as the other electrode. The electrochromic film is deposited over the second electrode. Thus, the metal foil or frit conductors of the U.S. Pat. No. 5,066,111 invention are always in direct contact with either the electrochromic coating or the electrolyte. However, such direct contact can decrease the device lifetime because of reaction between the coating and the electrolyte or electrochromic coating. Moreover, if put on glass and then coated with the transparent conductive coating (TCC), other problems can arise. Most importantly, the TCC is usually deposited in a thickness of less than 0.3 micrometers. In comparison, tapes or underlying frits, etc., are typically in thicknesses of 10 to 1000 times the thickness of TCC. Thus, vacuum methods that are typically used to coat TCC have difficulty getting a conforming coating that adequately covers the edges. The reference does not address the relationship of the busbar thickness and width to the device size.

POLYCHROMIC™ solid films are described in European Patent Publication No. EP 0 612 826 A1, incorporated herein by reference. The reference describes how polychromic solid films may be used in electrochromic devices, particularly glazings and mirrors, whose functional surface is substantially planar or flat or that are curved with a convex curvature, a compound curvature, a multi-radius curvature, a spherical curvature, an aspheric curvature, or combinations of such curvature.

Often, a demarcation means, such as a silk-screened or otherwise applied line of black epoxy, may be used to separate the more curved, outboard blind-spot region from the less curved, inboard region of such electrochromic mirrors. The demarcation means may also include an etching of a deletion line or an otherwise established break in the electrical continuity of the transparent conductors used in such mirrors so that either one or both regions may be individually or mutually addressed. Optionally, this deletion line may itself be colored black. Thus, the outboard, more curved region may operate independently from the inboard, less curved region to provide an electrochromic mirror that operates in a segmented arrangement. As described in European Patent Publication No. EP 0 612 826 A1, upon the introduction of an applied potential, either of such regions may color to a dimmed intermediate reflectance level, independent of the other region, or, if desired, both regions may operate together in tandem.

An insulating demarcation means, such as demarcation lines, dots and/or spots, may be placed within electrochromic devices, such as mirrors, glazings, optically attenuating contrast filters and the like, to assist in setting out the interpane distance of the device and to enhance overall performance, in particular the uniformity of coloration across large area devices. Such insulating demarcation means, constructed from, for example, epoxy coupled with glass space beads, plastic tape or die cut from plastic tape, may be placed onto the conductive surface of one or more substrates by silk-screening or other suitable technique prior to assembling the device. The insulating demarcation means may be geometrically positioned across the panel, such as in a series of parallel, uniformly spaced-apart lines, and may be clear, opaque, tinted, or colorless, and appropriate combinations thereof, so as to appeal to the automotive stylist.

As described in European Patent Publication No. EP 0 612 826 A1, a demarcation means may be used that is conductive as well, provided that it is of a smaller thickness than the interpane distance and/or a layer of an insulating material, such as a non-conductive epoxy, urethane or acrylic, is applied thereover so as to prevent conductive surfaces from contacting one another and thus short-circuiting the electrochromic assembly. Such conductive demarcation means include conductive frits, such as silver frits like the #7713 silver conductive frit available commercially from E.I. du Pont de Nemours and Co., Wilmington, Delaware, conductive paint or ink and/or metal films. Use of conductive demarcation means, such as a line of the #7713 silver conductive frit, having a width of about 0.09375" (0.238 cm) and a thickness of about 50 μm, placed on the conductive surface of one of the substrates of the electrochromic device may provide the added benefit of enhancing electrochromic performance by reducing busbar-to-busbar overall resistance and thus enhancing uniformity of coloration, as well as rapidity of response, particularly over large area devices. However, the non-conductive layers are applied in a way which does not prevent the underlying frit lines from making contact with the electrolyte or electrochromic layers. Thus, this frit may potentially react, especially when coloring and bleaching potentials are applied.

As described above, electrochromic (EC) devices are used to reversibly vary the light transmission or reflection by application of an electrical voltage. Applications of electrochromic devices include windows for architectural use (windows, interior partitions, skylights, light pipes), windows in transportation (automobiles, trucks, planes, trains, boats, etc.), eye-wear, and displays (including large area signage).

Electrochromic windows in buildings can provide higher energy efficiency as compared to static transmission windows, while increasing the user comfort by controlling illumination and reducing glare. The same benefits can accrue for transportation uses where the user comfort is enhanced by reducing solar heat and glare during the day, while reducing the cooling load on the air-conditioner. In many of these applications the EC device can be required to be kept in a certain desired state of transmission for long periods of time. For example, a window may be kept in a darkened or bleached state for many hours of the day and may even be kept in this state for many days.

Thus, it is desirable to enhance the durability of EC devices that are used in this long single state mode, while reducing energy consumption of the EC devices. Reducing energy consumption is particularly useful in circumstances where solely a battery is used to power such a device and thus, it is important to ensure that the battery drain is minimized. Such circumstances include use in a car, aircraft, watercraft, or eyeware. One aspect of the present patent describes circuitry which addresses one or more of these issues.

U.S. Pat. No. 5,148,014, incorporated herein by reference, describes the use of a linear regulated power supply to power an EC mirror.

U.S. Pat. No. 5,193,029, incorporated herein by reference, describes the use of a Zener diode and transistor, which is essentially a linear regulation, to provide voltage to an EC mirror.

U.S. Pat. No. 5,220,317, incorporated herein by reference, describes the use of a voltage divider consisting of series resistors to scale down the voltage provided to EC elements.

Electrochromic devices which will benefit from this invention are well known in the art. For example, these are described in U.S. patent application Ser. Nos. 09/155,601 and 08/699,940, filed Apr. 9, 1997 and Aug. 20, 1996, respectively.

For those EC devices which are colored by applying a voltage, it would be desirable not to require applying continuously the coloring potential after the required coloration depth has been reached. Such continued application of the coloring potential, while promoting EC reactions, can also promote side reactions which could have detrimental effect on the device longevity. This applies for all EC devices which need to be maintained in a state of coloration that is different from their natural transmission state. The natural transmission state of an EC device is measured at equilibrium with no applied potential and when the potential difference between the opposing electrodes is zero.

Typically, the EC devices can be kept colored for a finite period of time when the coloring potential is removed, i.e., the color of the device will change towards its natural state over a period of time. This change could occur over a wide range of time intervals, from fast over several seconds or minutes, to as slow as extending up to many days, depending on the device. A device where this change is fast is said to have short "memory" and one where the change is slow is said to possess long "memory". For example, U.S. patent application Ser. No. 09/155,601 discloses devices with long memories and compares them with devices that have short memories.

It is clear that is would be advantageous to be able to maintain a coloration setting without having to maintain an applied voltage to electrochromic devices because circuitry that allows intermittent adjustment of the voltage as needed to maintain a coloration setting would lead to lower power consumption in the device.

U.S. Pat. No. 5,384,578 (to Lynam et.al.), incorporated herein by reference, describes the use of intermittent voltages for continuously variable mirror and windows, but does not relate to changing the voltage-on or voltage-off periods and voltage-time shapes under different conditions as discussed in the present invention.

U.S. Pat. No. 4,298,970 (to Saegusa), incorporated herein by reference, describes a technique for utilizing an intermittent technique to drive EC displays with memory. The patent only describes bimodal displays which have only two states, i.e., colored and bleached states and does not discuss devices which need continuously variable light transmission across a continuum of transmissive states.

U.S. Pat. No. 5,007,718, incorporated herein by reference, describes a method of driving electrochromic elements by using a current stabilizing circuit and a voltage stabilizing circuit in tandem with a power supply to form a stabilized power source, and applying a gradually increased coloring voltage and a gradually decreased discoloring voltage to keep the current flow within predetermined amounts.

U.S. Pat. No. 5,365,365, incorporated herein by reference, describes an electrochromic system for controlling the color state by determining the charge needed to obtain a set color from the discharge potential of the system and the coloration set-point. An integrator measures the charge passing through the system and compares it to the charge to be transferred, which is measured by a differential amplifier which compares a discharge potential measured by a capacitor with a selected color set-point.

U.S. Pat. No. 5,231,531, incorporated herein by reference, describes an electrochromic system in which a voltage generator is connected to electrically conductive films by an electrical control circuit. The voltage generator receives a set-point from a control unit and generates a potential differences as a function of the temperature of the electrolyte.

SUMMARY OF THE INVENTION

This invention is related to edge and internal busbars that lower the overall effective resistance of electrical devices, particularly EC devices, thereby enabling large devices to maintain desirable electrical properties. The present invention describes the benefits of applying the busbars of the present invention to a substantial perimeter of an EC device, as well as the m aterials and processes to accomplish this.

As shown later, the contact points with the conductive coatings constituting the EC devices may be less than half of the perimeter, but the busbar of the present invention runs continuously for more than half of the device perimeter. The term "busbar" refers to a conducting medium that provides a substantially uniform voltage to all those points on the device perimeter that are connected to the busbar. The busbar should be capable of carrying substantial current with a voltage drop of preferably less than $\frac{1}{10}$th of the applied voltage, or a voltage drop less than that which causes a perceptible change in the kinetics of the device (rate of coloration and bleach) or in the depth of coloration.

The voltage drop should be less than that voltage drop which would cause a perceptible change in the kinetics or coloration properties of the device. Thus, for some particular devices, higher voltage drops can be accommodated so long as such perceptible changes do not occur. Generally, however, such voltage drops are less than $\frac{1}{10}$th of the applied voltage.

The conductance of the edge busbar conductor is dependent on the cross-section, length and the intrinsic conductivity of the busbar material. Since the gap between the two substrates for a EC cell is limited, the thickness of the busbar conductors must be within the limitations imposed by the cell's size. To maximize the EC device viewing area, the width of the conductor in the prior art is limited as shown in FIGS. 4 and 5, where the width is limited to the exposed areas 3304 and 5504. Typically, this width is less than 25 mm, preferably less than 10 mm, in order to maximize effective cell area. At times, this width can be on the order of less than 2 mm. Further, for a device made by substrates that are exactly stacked on one another and separated by a gap of 100 micrometers, the thickness of the conductor on each substrate located between the two substrates is typically limited to less than 50 micrometers.

The present invention teaches the use of materials and processes to deposit busbars on a substantial portion of the device perimeter while overcoming the geometric constraints described above. A copper conductor which is 35 micrometers thick and 3 mm wide exhibits a resistance drop of 0.16 Ω per meter. Accordingly, for a device that is one meter square, a continuous conductor around the device periphery will exhibit a drop of 0.32 Ω from one diagonal edge to the other. For a device that will carry a current as low as even one ampere, the drop of 0.32V at an applied potential of about 1.5V is significant. This can result in non-uniform coloration, slow kinetics, etc. In such devices, it is preferable to maintain the potential drop below $\frac{1}{10}$th of the applied voltage or below any voltage that will cause a perceptible change in the color uniformity of the device or a decrease in the kinetics.

Since the current consumption of an EC device changes with time, particularly when step potentials are used, it is preferable that the potential drop in the busbar is kept within the limits described above during both the switching period and also when the steady state is reached. If other materials from Table 2 are used instead of copper, except for silver, the resistance drop will be even higher for the same busbar dimensions. Thus the geometry of the busbar (such as thickness and width) of the tape will have to be increased for best performance.

An object of the present invention is to overcome the prior art constraints on edge busbar effective resistance arising from the geometrical limitations of busbar length, width, and thickness. The present invention uses specific geometry, materials and processes to form the edge busbars.

This invention overcomes these geometrical limitations by forming a conductive path from the electrode on a front side of a substrate to the edges of the substrate and then extending this conductive path on to the back of the substrate. On the edge of the device, on the back, or on both the edge and the back, highly conductive paths such as reinforcing conductors may be employed to lower the busbar resistance. The conductive path from the front of the substrates to the back could be the continuation of the same material which is used for the transparent conductor, such as indium tin oxide, or can be fabricated from a different material, so long as dimension and conductivity requirements are met. That is, the conductivity must be effective to prevent a potential drop of 10% or a potential drop that would detrimentally affect the performance of the EC panel, while the dimensions must be effective to allow the substrates to maintain a close proximity to each other. Once the conductive path is formed on the back of the substrates, the geometrical limitations on the thickness and the width of the busbar conductor are relieved substantially.

Accordingly, the present invention provides an edge busbar for an electrical device, wherein the edge busbar comprises at least one electrically conductive connector portion effective to form an electrically conductive path from a surface of the electrical device, wrapping around a portion of an edge, to an opposite surface of the electrical device, and an electrically conductive perimeter portion in electrical contact with the connector portion, wherein the perimeter portion is peripherally on a substantial perimeter of the electrical device.

The connector portion of the edge busbar of the present invention can be continuous peripherally on a substantial perimeter of the electrical device, can be continuous peripherally on an entire perimeter of the electrical device, or can be composed of a plurality of connector portions. That is, the connector portion can wrap completely around an entire perimeter edge of the electrical device, can wrap completely around a substantial perimeter portion of the perimeter of the electrical device, or it can be a series of smaller portions that each wrap around smaller portions of the perimeter of the electrical device. Regardless, there is a perimeter portion of the edge busbar of the present invention which is peripherally on a substantial perimeter of the electrical device and connects to the various connector portion(s) of the present invention.

The front of a substrate is generally defined as the surface having the conductive electrode layer thereon.

In the case of a two substrate device, the front of a substrate is the surface facing the other substrate. In the case of a single substrate EC device, the front of a substrate is the surface facing the EC stack. In general, the layer of transparent conductive material is on the front of a substrate.

Although other parameters such as the conductivity of the transparent conductors (electron conductors), the ionic conductivity of the electrolyte layer, and the intercalation rate in the EC coating and other coatings if used, might also influence the kinetic parameters of EC devices, as shown above, the resistance of the edge busbar itself can have an important affect on the performance of the EC device. Accordingly, it is an object of the present invention to minimize the contribution of the edge busbars towards slowing the EC device kinetics. The edge busbars of the present invention may also assist in promoting a spatially uniform rate of color change during coloring and bleaching cycles.

In one embodiment of the present invention, an edge busbar includes a connector portion that has a separation or separating portion. However, the connector portion at each side of the separation is electrically connected by the conductive electrode coating layer of the electrical device. The separation is relatively small between the connector portions on each side of the separation, so that there is negligible resistance across the break. In other words, the separation is electrically bridged by the conductive electrode coating layer. This allows the connector portion to be effectively continuous peripherally about the entire perimeter of the electrical device even though separations exist in the connector portion. Advantages to this configuration include ease of manufacture and reduced complexity of design.

Busbars of the present invention can be advantageously used in pairs. Another embodiment of the present invention provides an edge busbar pair for an electrical device, each edge busbar comprising a connector portion and a perimeter portion, wherein each connector portion is effective to form an electrically conductive path from a front surface of a substrate, wrapping around a portion of an edge of the substrate, to an opposite back surface of the substrate. The perimeter portions being in electrical contact with its respective connector portion, and wherein each perimeter portion is peripherally on a substantial perimeter of each respective substrate, and wherein the front surfaces of each substrate face each other with each substantial perimeter proximate to and substantially opposite to the other substantial perimeter.

As discussed previously, each edge busbar of an edge busbar pair can be continuous peripherally on a substantial perimeter of its substrate, can be continuous peripherally on an entire perimeter of its substrate, or can be composed of a plurality of connector portions. It is advantageous for each edge busbar to be composed of a plurality of connector portions. It is particularly advantageous for each connector portion of each edge busbar to be in an alternating relation with connector portions of the other edge busbar. As shown later, when the connector portions are in such alternating relation, the thickness of the busbar material can be thicker than one half of the total gap distance between the substrates and yet still not cause an electrical short. Further, a sealant and/or an insulator can be added to assure against any shorting. Nonetheless, as explained earlier, thicker busbar material is desirable in order to maximize conductivity.

The present invention can be implemented for single substrate devices or dual substrate devices. The edge busbars of the present invention can be used singly as needed advantageously (as contrasted with the prior art). However, single substrate devices can nonetheless require a pair of edge busbars because such devices, as described earlier and as known in the art, often are made by forming an EC stack onto a substrate. In such cases, the EC stack requires a pair conductive electrodes as well as the substrate. Accordingly, both conductive electrodes have electrical signals applied to them which would benefit from the advantages of the edge busbars of the present invention.

In the present invention, an edge busbar is used having a portion that can be fabricated of any convenient material with an effective maximum thickness that can be inserted in the cell gap without shorting from touching with the other busbar or with the opposing conductive substrate. At the same time, the edge busbar of the present invention provides sufficient conductivity such that a negligible voltage drop (preferably less than one tenth of the applied voltage) occurs in the edge busbar. Further, the edge busbar of the present invention covers a substantial portion of the device perimeter and can include the internal busbars of the present invention.

The present invention also relates to the construction of substrates, especially transparent conducting substrates, which possess relatively large effective conductivities by the inclusion of internal busbars.

The present invention further relates to the use of the aforementioned substrates to construct affordable large area EC devices that can be used for architectural applications, (e.g. windows, partitions, skylights, diffuser panels, light pipes, etc.), automotive (windows, sunroofs, etc.) or other transportation (windows for planes, trains, buses, boats, etc.) applications, or signage applications (including large area displays such as those used at stock exchanges, airports and other such facilities).

The present invention also provides substrates which possess appreciably lower effective sheet resistances (can be less than 1 $\Omega$/sq or $\Omega$/■) at a cost that is attractive for applications such as those described above.

The present invention teaches means for lowering the sheet resistance of thin film transparent electrically conducting assemblies for use in chromogenic devices, particularly electrochromic (EC) devices. The present invention permits the manufacture of EC devices which possess significantly improved kinetics with regard to coloration and/or bleaching, even for devices which possess relatively large active areas. The present invention also results in devices which possess considerably improved coloration and bleaching uniformity.

Most practical EC devices, as shown in FIG. 6, are comprised of an "EC Assembly" 6601 which is effectively bound on either side by electronically conducting electrodes (ECE) 6602. Generally speaking, electrodes 6602 may be comprised of any of a variety of electronic conducting materials. Because EC devices are generally used to modulate light, however, at least one of the ECE 6602 should possess reasonable transparency at the wavelengths of interest (mirrors and many displays, e.g., typically possess only one transparent ECE; and window-type devices typically possess two transparent ECE's). The present invention provides improved effective conductivity of transparent ECE's in a manner readily integrated into the device structure.

The present invention forms internal busbars by providing strips of highly conductive material electrically connected to interior portions of a transparent ECE. The internal busbars add regions of increased conductivity into a transparent ECE, thereby lowering the overall effective resistance of the transparent ECE. Such lowered overall resistance leads to large device advantages.

The internal busbars of the present invention have increased conductivity compared to the transparent ECE when measured along the longitudinal direction of the conductive strips of the present invention. That is, in a top view of the transparent ECE with an internal busbar strip, when one compares a section of the conductive strip having a length L and a width W with a section of the transparent ECE also having the dimensions of W×L, the conductivity of the W×L section of the internal busbar will be higher than the conductance of the W×L section of the transparent ECE, along either dimension L or W. Preferably the conductivity of the conductive strip will be greater than about 2 times the conductivity of the transparent ECE, more preferably greater than about 10 times.

The internal busbars of the present invention achieves such higher conductance by several ways. According to one embodiment of the present invention, materials having inherently higher conductivities are used for the busbars. According to another embodiment of the present invention, the busbar strips are made thicker than the surrounding transparent ECE. Such thicker strips can be embedded below the transparent ECE and/or into the underlying substrate. It is important that these two—that is, the internal busbars and the transparent ECE—are in electrical contact with each other (continuous or spatially intermittent). One may even use a material, to enhance or to tailor the electrical characteristics of this electrical contact, different from that material of the internal busbars or of the transparent ECE.

In another embodiment, the internal busbar strips are formed on a different surface from that surface which has the transparent ECE. Strip connecting portions connect interior portions of the transparent ECE or device with segments of the internal busbar strip. Such strip connecting portions can extend through the substrate. The internal busbars of this embodiment are nonetheless "internal" because they connect to regions of the transparent ECE away from the periphery.

The present invention also is directed to circuitry which uses low power. Another object of the present invention are circuits which apply intermittent coloration power to EC devices in order to maintain or control the EC devices' coloration while compensating for the EC devices' inherent coloration decay without needing a constant application of coloration power.

BRIEF DESCRIPTION OF THE DRAWINGS

FIG. 3A is an perspective exploded view of a prior art arrangement of edge busbar clips on two substrates.

FIG. 3B is a sectional view of a prior art arrangement of edge busbar clips on two substrates.

FIG. 8A is a perspective view of an EC device with a substrate having edge busbars of the present invention.

FIG. 8B is a schematic top plan view of a substrate having a continuous conductive path of the present invention.

FIG. 8C is a schematic top plan view of a substrate having strip conductive paths of the present invention.

FIG. 25A is a schematic plan view of a group of internal busbars addressable as a group according to an embodiment of the present invention.

FIG. 25B is a schematic plan view of a group of internal busbars individually addressable according to an embodiment of the present invention.

FIG. 32A is a schematic sectional view of an electrically reinforced edge busbar according to an embodiment of the present invention.

FIG. 32B is a schematic sectional view of an electrically reinforced edge busbar according to an embodiment of the present invention.

FIG. 32C is a schematic sectional view of an electrically reinforced edge busbar according to an embodiment of the present invention.

FIG. 32D is a schematic sectional view of an electrically reinforced edge busbar according to an embodiment of the present invention.

FIG. 32E is a schematic sectional view of an electrically reinforced edge busbar according to an embodiment of the present invention.

DETAILED DESCRIPTION OF THE INVENTION

Edge Busbars

Figure 7A:
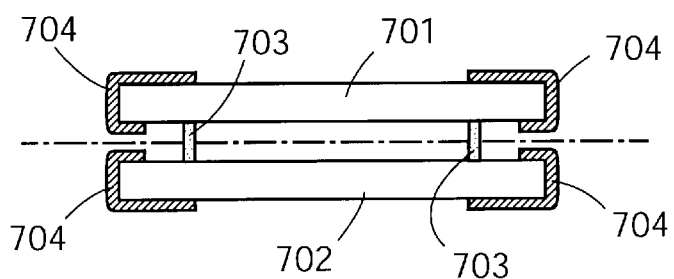
FIG. 7A is a schematic sectional view of an EC device having edge busbars of the present invention.
Figure 7B:
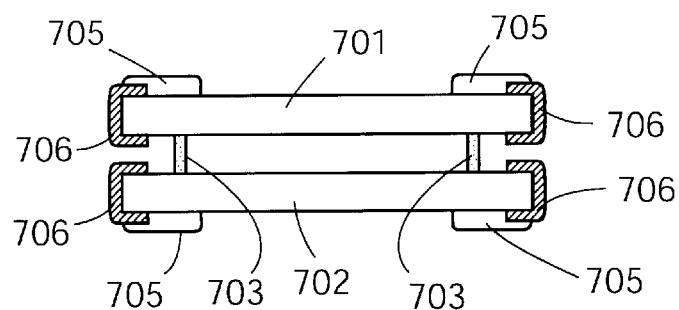
FIG. 7B is a schematic sectional view of an EC device having edge busbars and conductive paths of the present invention.

In the present invention, a conductive path is formed from the electrodes to the edges of the substrate. Preferably, this path is extended on to the back of the substrate as shown in FIGS. 7A and 7B (the details of other coatings employed in the device have been omitted). Two substrates 701 and 702 are shown attached to each other at close proximity by cell adhesive 703. On the edge of the device, preferably including on the back, highly conductive paths are employed to lower the busbar resistance. FIG. 7A shows an edge busbar 704 of the present invention which wraps around the edge of the substrate to provide highly conductive paths on three sides of the edge. FIG. 7B shows a conductive path 706 of the present invention to which is attached a highly conductive perimeter portion 705.

The conductive path 706 from the front of the substrates to the back could be the continuation of the same material which is used for the transparent conductor on the substrate, such as indium tin oxide, or can be fabricated from a different material. Once the conductive path is formed on the back of the substrates, the geometrical limitations on the thickness and the width of the busbar conductor are relieved substantially because the perimeter portion can cover a larger area without concerns about thickness. The busbar of the present invention includes the conductive path and the perimeter portion.

Conductive path 706 forms an electrical connection from the front to the back. Therefore, the paths can be called connector portions. These electrical connector portions can be made using conductive adhesives, silver frits (e.g., available from Dupont Electronic Materials, Research Triangle Park, North Carolina or FX 33-246 available from Ferro Inc. of Santa Barbra, Calif.), solder materials, physical vapor deposition, chemical vapor deposition, electroless deposition of metals, metallo-organics (e.g., available from Engelhard Electronic Materials, New Jersey) and conductive tapes. The conductivity of these connector portions need not be as high as the perimeter portions that connect to these connector portions because the connector portions only have to carry the current over a short distance, hence their actual effective resistance is low.

These connector portions could be continuous, thereby merging with the perimeter portion, or in strips. Either connector portion configuration, continuous or strips, encompasses a substantial portion of the device perimeter. FIG. 8A shows two substrates 801 and 802, separated for clarity. Substrate 802 is shown with a continuous conductive path 803. FIG. 8B shows substrate 802, continuous conductive path 803, and an adhesive 804. FIG. 8C shows a substrate 802', strip conductive paths 803', and adhesive 804. In FIG. 8C, perimeter portion 805 connects strip conductive paths 803'. Perimeter portion 805 extends to a back perimeter region (not shown).

According to the present invention, referring to FIGS. 8B and 8C, it is not necessary to have a width of the substrate exposed between the sealant or adhesive 804 and the connector portion or conductive paths 803 and 803'. Depending on the nature of the sealant and connector portion and their bonding characteristics, a partial or a complete overlap may exist. If the connector portion of the present invention is used in the strip form as shown in FIG. 8C, the connector portion strips on the bottom and on the top substrates may be offset from each other, may be stacked on top of each other, or may have no particularly set geometric relationship.

In a preferred configuration where the connector portion strips are offset, the thicknesses may be increased almost to the point where they occupy the entire gap between the substrates without shorting. Such connector portion strips are offset effective to allow an insulating distance between a particular connector portion strip and any neighboring connector portion strips connected to an opposite substrate, as well as between the particular connector portion strip and the opposite substrate. The insulating distance can include insulating material. The insulating material can also be preformed on the conductive strips. In a particularly preferred configuration, the connector portion strips from one substrate are in an alternating relationship to the connector portion strips of the other substrate.

The perimeter portion materials could be selected from the same list of materials as the connector portions. However, to enhance their conductance, materials with high conductivity could be selected and/or the geometry (i.e., increased thickness, width, perimeter portions etc.) may be different from the connector portions.

Thick metallic strips and wires may also be used as perimeter portions. The conductive path of the connector portions of the present invention overcomes the prior art's dependence on the busbars' specific conductivity because the present invention provides a broad area of conductance to which the connector portion is attached.

The devices are preferably assembled (e.g., by bonding together two substrates) after the connector portion strips or front to back connections are attached to each of the substrates. If counterelectrode coatings are required in the EC device, such strip connector portions can be formed or positioned before or after these coatings are deposited. Further, the part of the connector portion strips on the back of the substrates can be joined or reinforced (such as with conductive copper tapes) with highly conducting medium either before or after the device assembly. The adhesive in the copper tapes may be pressure sensitive adhesive (PSA), or may be curable later into a thermosetting material by the application of pressure, heat, radiation, moisture, or more than one of these methods.

As described above, and further below, the edge busbars of this invention can be augmented ("reinforced") in conductivity. That is, the electrical conductivity is augmented or reinforced in order to increase the busbar electrical conductivity, by such methods as (i) by wrapping a continuous connector from the front to the back of the substrate, thus providing a wider conductor resulting in higher electrical conductivity, (ii) by attaching the connector to a conductive wire, foil, or tape positioned on the back of the substrate so that the connector's conductivity can be augmented by the conductance of the wire, foil, solder, frit, or tape, and (iii) attaching a wire or conductor on the edge of the substrate to electrically contact the connector in order to augment the conductance of the connector.

A preferred method to form the edge busbar is to use a conductive tape with a conductive adhesive layer that conducts through the adhesive layer thickness. FIG. 9B shows a conductive tape 909 having a conductor 911, a conducting adhesive layer 912 and an optional insulating layer 910. A continuous strip of such a tape is shown in FIG. 9C. Tape 909 includes the continuous conductor or perimeter portion 913, and fingers or connector portions 914 that will form the contact with the transparent conductor on the front side of the substrate. The front side, as defined previously, refers to the substrate side that faces the other substrate of an EC device, while the back of a substrate refers to the side, opposite to the front side, that faces away or is farther away from the other substrate. Tape 909 connects the front of the substrate (facing inward) by way of connector portions 914 to perimeter portion 913 at the back of the substrate. An edge portion 915 of connector portion 914 lies on the edge of the substrate.

As shown in FIG. 9C, perimeter portion 913 and strip connector portion 914 could be integrally connected, i.e., one piece of tape of the perimeter portion is preferably aligned with the bottom edge of the substrate, or is on the backside of the substrate. The flat side is folded and adhered to the substrate back. For a rectangular device with sharp corners, the tape in the corner could be folded over the back side to form a crease without effecting the connector portions at the front side. Since there is effectively no limitation on the gap or tape thickness on the back side (or the outside) of the device, the procedure of the present invention can be used without affecting the separation distance of the substrates. Instead of a crease on the back side, the tape can be cut and the tape strips running at an angle to each other can be folded on top of each other on the corners. The corners may also be bridged by a piece of another tape, wire, solder, etc., to keep preferably one continuous electrical path forming a perimeter portion for each substrate. The tape or the strip on the back can be made more conductive by reinforcing the tape with a more conductive medium, e.g., more tape, wire, metallic strip, etc. Accordingly, the perimeter portion can be multilayered or made from a number of components.

In this description, the use of the above shape of the tape (i.e. tape with connector portions or fingers extending from a continuous perimeter portion) avoids any kinds of creases or kinks on the front surface. Such kinks can develop as the tape traverses over the corners of the substrate. It is readily understood that as an edge bends to form a curve or to form a corner, an inner path which is a certain distance from the outer edge will trace a different distance from the outer edge. In the case of a convex curve, the inner path will be shorter. Accordingly, a non-stretching material will tend to crease or kink to try to accommodate the excess material on such an inner path. The recesses between each connector portion prevents accumulation of excess material on the front side between the substrates.

The above description shows a tape that is easily and advantageously used for applications where a pair of edge busbars can be placed correspondingly opposite each other on two substrates without physical interference or electrical shorting because of the innovative geometry of the edge busbar pairs of the present invention. Such geometry innovatively allows the pair of edge busbars to nest together in an alternating relation. Such geometry further innovatively allows each of the pair of edge busbars to be thicker than half the gap separating the substrates on which they cover, thereby increasing the edge busbar conductivity without shorting to each other. Such geometry also allows edge busbars to wrap around corners without interfering busbar material in between the substrate separation gap.

For those EC panels that are rectangular in shape, it is particularly at the corners that certain configurations of the present invention are important. It is important to ensure that no fingers are located on those areas of the tape which bend around the sharp corners. Furthermore, the fingers are spaced such that they do not overlap each other over the conductive substrates. Any kinks, overlaps, or creases on the front (conductive) side can interfere with the predetermined gap between the two substrates and, depending on the materials employed, could also lead to electrical shorting between the two substrates.

The tape shown in FIG. 9C can optionally have an additional row of strip connector portions 914 (not shown) on the side of perimeter portion 913 opposite the side with the row of strip connector portions 914 shown. In this optional configuration, perimeter portion 913 is affixed to the edge of the substrate and the each opposite rows of strip connector portions 914 are affixed to respective opposite surfaces of the substrate.

Besides for substrates with sharp corners, the geometry of the tapes described above can be similarly employed for substrates with circular, elliptical, or any other regular or irregular shapes. For shapes that have a gradual change, such as a circle, the width of the strip connector fingers and the spacing between them should be such so that no noticeable kink is introduced on the front side of the substrate for the reasons described above.

The electrical connections to the device are made from the perimeter portion on the back of the substrate by using more conductive tape, solder, adhesive, wires, etc., or preferably the tape described above may be provided in a pre-cut size and shape that has a connector or a connector attachment already assembled.

Figure 9A:
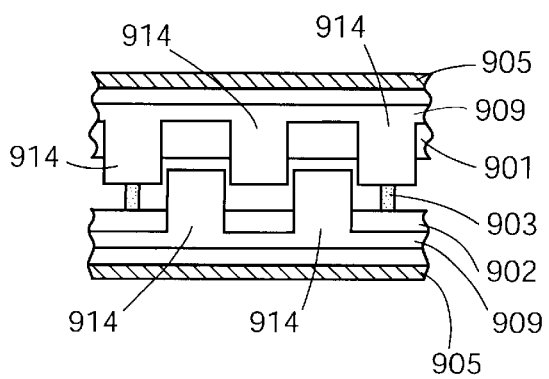
FIG. 9A is a schematic side view of a pair of edge busbars of the present invention.
Figure 9B:
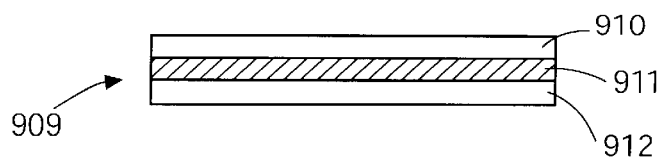
FIG. 9B is a schematic side view of an adhesive multilayer strip for the fabrication of an edge busbar of the present invention.
Figure 9C:
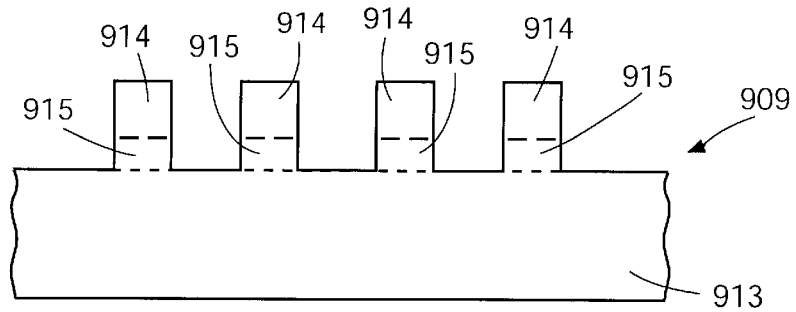
FIG. 9C is a plan view of an adhesive multilayer strip for the fabrication of an edge busbar of the present invention.
Figure 9D:
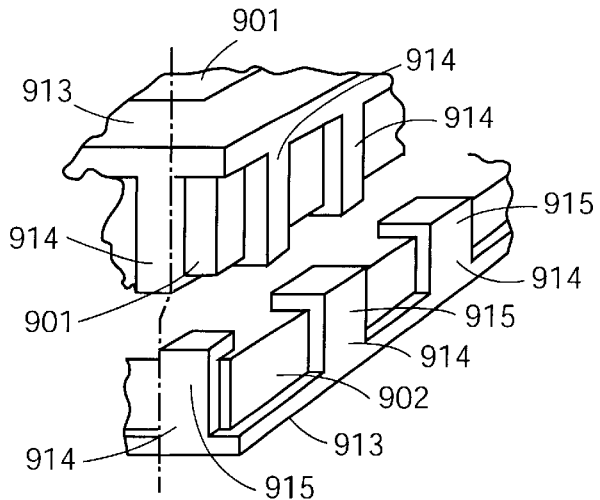
FIG. 9D is a perspective partial view of a pair of edge busbars of the present invention at a corner.

As shown in FIG. 9A, it is preferable for connector portion 914 of each tape 909 to be in an alternating relationship with the connector portions 914 of the other tape 909 to minimize the chances of shorting or of overlapping of fingers. As shown in FIG. 9D, a corner of substrate 901 and a corner of substrate 902 meet without any connector portions 914 at the corners. The connector portions 914 remain in an alternating relationship to prevent any overlap of tape conductive material.

As shown in FIG. 9B, tape 909 employed for this purpose can be coated or laminated with a nonconductive material insulating layer 910 on the side that is non-adhering. This will reduce the chances for shorting of the two substrates should the fingers inadvertently overlap or if there is a malfunction, for example, when one of the strip fingers lifts off the surface.

In another method, highly conductive busbars are made by wrapping the connector from the substrate front to the substrate edges and then reinforcing the edge portion with a highly conductive material. This is shown in FIGS. 32A and 32D. The connectors are shown as 3205 and 3205" and the reinforcements as 3203 and 3203'" forming the busbars 3202 and 3202'". The reinforcement can be any convenient shape such as a cylindrical wire, as shown for example. Another shape is a flattened wire. In this example the conductor is shown significantly thicker at the edges than its thickness on the front of the substrate. In FIG. 32D, the reinforcement is located in a precut groove on the edges of the substrate.

FIG. 32E shows highly conductive reinforced busbars having the reinforcement in a groove with the conductive connector wrapping from the front of the substrate around the edge to the opposite side of the substrate.

The busbars can be made by any convenient method such as, for example, by feeding the reinforcing wire and solder (as connector) so that both can be put in place simultaneously. Another method could be where the wire is pre-attached, e.g., by wrapping and then mechanically tightening around the perimeter of the substrate. The solder is then deposited on the front and the edge thus electrically attaching the reinforcement with the connector. In this method it may be advantageous to have a precut groove on the perimeter edge of the substrate in which the wire can be placed, as shown in FIG. 32D.

The arrangement shown in FIG. 32A can be modified as shown in FIGS. 32B and 32C where the connector wraps around from the front to the back. Similarly, the conductor shown in FIG. 32D can be extended by having a wrap around connector (as shown in FIG. 32E). Further, the wire may be placed in a groove on the edge (as shown in FIG. 32D) or in a groove made in the back of the substrate close to the perimeter edge (not shown).

The connector may be deposited by using a soldering iron, with its tip shaped so that the solder can be melted and simultaneously deposited on two adjacent surfaces (as shown in FIG. 32A) or on three adjacent edges (as shown in FIG. 32B). Instead of using a solder, a conducting adhesive may also be applied. The solder or adhesive may be applied from a bath of molten solder or uncured liquid adhesive by dipping the substrate edge in the bath and then moving the part (e.g., rotationally) effective to cover a substantial perimeter of the substrate.

Figure 10:
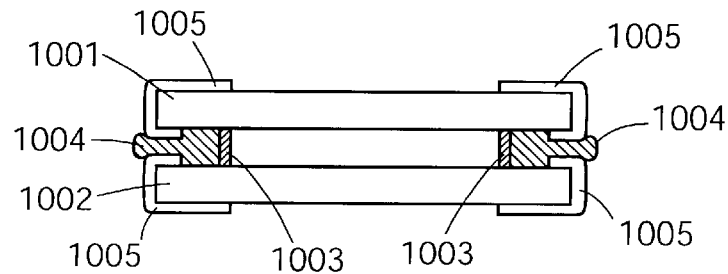
FIG. 10 is a schematic cross sectional view of a pair of edge busbars of the present invention.

To improve the reliability of the connections, it is preferred to seal the device using a non-conducting adhesive. As shown in FIG. 10, it may even be desirable to allow the edge sealant adhesive to fill in the remaining gap between the substrates and preferably extend to the substrates edges for improved reliability. Substrates 1001 and 1002 are separated and attached to each other by cell adhesive 1003. Edge busbars 1005 including conductive paths that wrap around to the fronts of substrates 1001 and 1002 have an edge sealant 1004 filling the respective gaps between each opposite pairs of edge busbars. Any convenient non-conducting material can be used such as, for example, a curable formulation such as a caulking, a heat or radiation curable material, or a hot melt adhesive that cures later, or a non-curable formulation such as a hot-melt adhesive. Some examples of materials used in sealants are silicones, polysulfides, butyls, urethanes, epoxies, vinyls, polyolefins, polyamides and acrylics, etc. Hot melt urethanes that cure later due to the diffusion of moisture may be preferred as a sealant because devices so made could be handled soon after fabrication and a non-flowable, non-sagging bond is obtained after curing. One may preferably employ the cell adhesive 1003 to be the same as edge sealant 1004. This adhesive may have spacers so that the cell spacing is governed by the size of these spaces and the thickness of edge busbars 1005. This avoids electrical shorts between the two substrates, due to busbar peel, moisture condensation or conductive impurity.

Although the present invention has been discussed in terms of electrochromic devices, it can also be useful in photochromic devices (U.S. Pat. No. 5,604,626, incorporated herein by reference), liquid crystal based devices as described in Motogomery, G. P., in *Large-Area Chromogenics: Materials and Devices for Transmittance Control*, SPIE Optical Engineering Press, Bellingham, Wash., 1990, p. 577, suspended particle devices (Research Frontiers Inc., Woodbury, N.Y.) and other devices.

Figure 12:
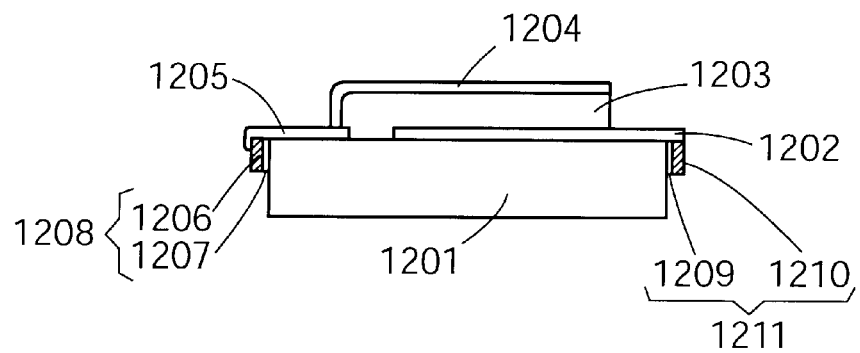
FIG. 12 is a schematic side sectional partial view of a prior art stacked substrate arrangement.

Highly conductive busbars may be deposited on single substrate devices in a number of ways to achieve substantial perimeter contact. In the prior art, for example in U.S. Pat. No. 5,187,607, incorporated herein by reference, the busbars for an EC device do not cover a substantial perimeter of the device. As shown in FIG. 12 (taken from U.S. Pat. No. 5,187,607) a busbar is formed on the edges of the substrate. The first transparent coating layer (bottom conductor) is deposited so that it touches both the busbars, but it is not continuous. This coating is either etched or deposited in such a way (e.g., by masking) that there is no electrical continuity between the two busbars. The coatings which comprise the EC stack are substantially deposited on one of these sections. However, the top conductor is deposited in such a way that it touches the second part of the bottom conductor and is electrically insulated from the first part of the bottom conductor by the EC stack. Thus, in this design none of the two busbars occupies a substantial perimeter of the device. Instead, the busbars run along the two edges similar to the prior art discussed previously.

Figure 11A:
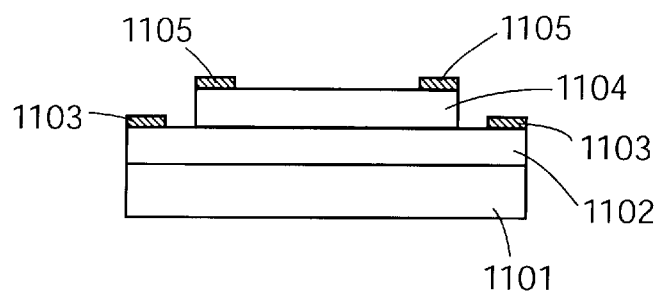
FIG. 11A is a side view of a prior art stacked substrate arrangement.
Figure 11B:
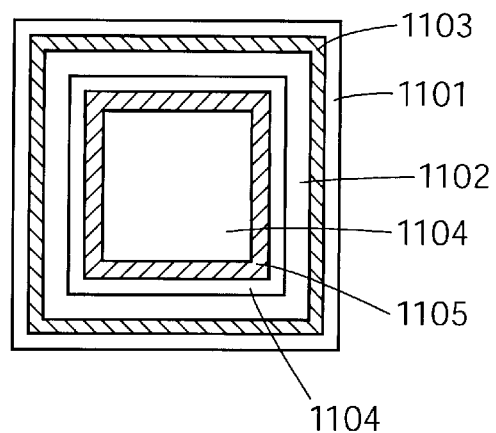
FIG. 11B is a top view of a prior art stacked substrate arrangement.

As shown in FIGS. 11A, and 11B, the use of busbars according to the present invention which are deposited on a substantial perimeter of an electric cell can be effectively employed for those devices that use thin coatings on one substrate. A substrate 1101 has a transparent electrode 1102 on its front surface. An EC stack 1104 is on the transparent conductor 1102. A bottom busbar 1103 is formed on the perimeter of the transparent conductor 1102 while a top busbar 1105 is formed on the perimeter of the top of the EC stack. Electric leads are connected to each busbar.

Figure 13:
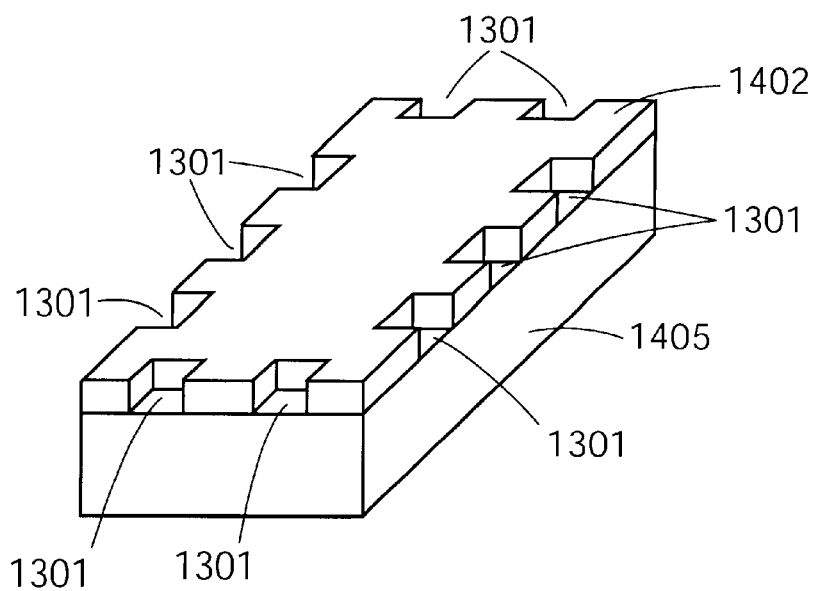
FIG. 13 is a perspective view of a single substrate with a bottom conductor applied according to an embodiment of the present invention.

As shown in FIG. 13, a bottom electrode 1402 is formed on substrate 1405 in a pattern with recesses 1301 at the edges of bottom electrode 1402. Bottom electrode 1402 can be formed by any convenient method such as, for example, by depositing the bottom electrode (e.g. made from ITO, doped tin oxide, doped zinc oxide, etc.) over an appropriate mask, or by etching through an appropriate mask after deposition. Preferably, the sheet resistance of the transparent conductors is less than about 30 Ω/■, more preferably less than about 15 Ω/■, and most preferably less than about 10 Ω/■.

The EC stack is then deposited along with the top electrode only onto the device area, and recesses 1301 in the electrode border area. Optionally, one can deposit the EC stack over the device area and only the top electrode layer would extend into recesses 1301 of the electrode border. It is important to keep the top electrode layer and the bottom electrode layer from shorting, thus it is desirable that the top electrode be deposited in such a way that it covers only a portion of recesses 1301 in the border region to avoid shorting. Optionally, an insulating layer can be deposited.

Figure 14:
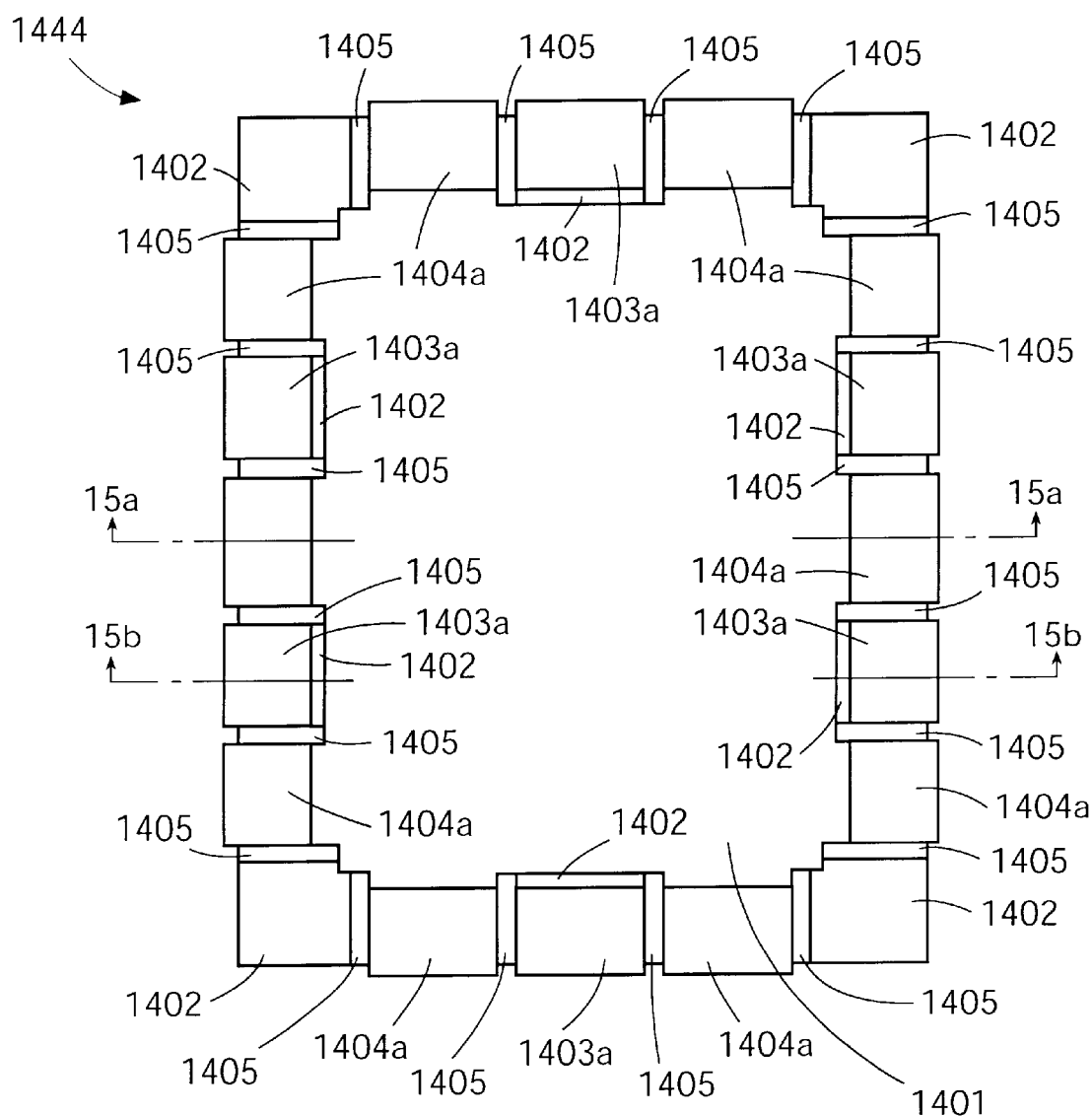
FIG. 14 is top view of a single substrate with a top conductor applied according to an embodiment of the present invention.
Figure 15A:
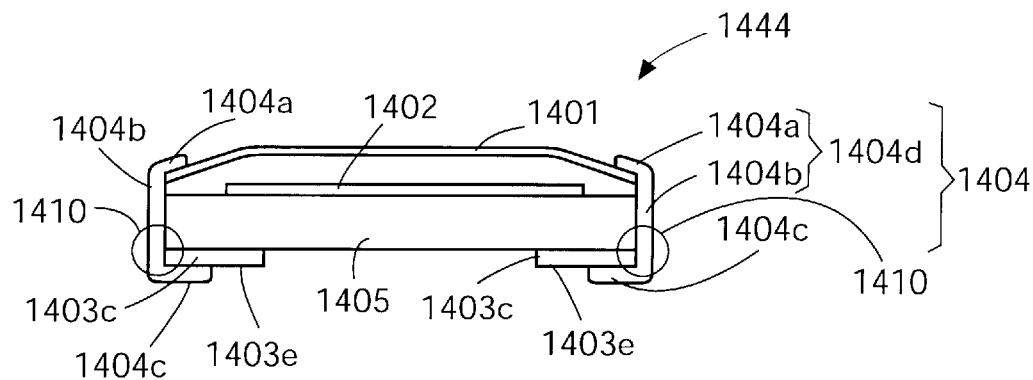
FIG. 15A is a schematic sectional side view of a single substrate with a top and bottom conductors applied according to an embodiment of the present invention.
Figure 15B:
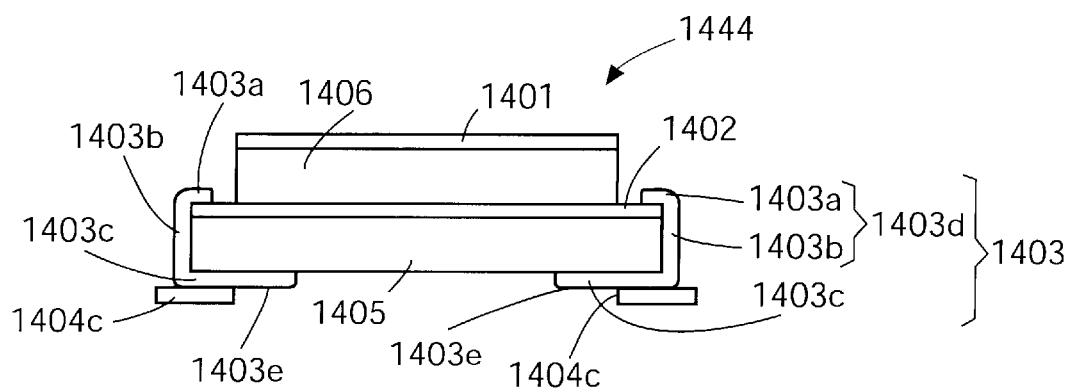
FIG. 15B is a schematic sectional side view of a single substrate with a top and bottom conductors applied according to an embodiment of the present invention.

As shown in FIGS. 14, 15A, and 15B, one embodiment includes forming an EC stack 1406 on bottom electrode 1402. A top electrode 1401 is formed on EC stack 1406. An edge busbar 1404 connects to top electrode 1401, while an edge busbar 1403 connects to bottom electrode 1402. Edge busbar 1404 comprises a perimeter portion 1404C and a connector portion 1404D. Connector portion 1404D includes a contacting portion 1404A and an edge portion 1404B. Contacting portion 1404A electrically contacts a surface of top electrode 1401. Edge busbar 1403 comprises a perimeter portion 1403C and a connector portion 1403D. Connector portion 1403D includes a contacting portion 1403A and an edge portion 1403B. Contacting portion 1403A electrically contacts a surface of bottom electrode 1402. Connector portion 1404D and 1403D are in alternating relationship on each side of EC device 1444.

One method to form the continuous busbar on this device is to utilize a tape as shown in FIGS. 9B and 9C. As described earlier, the first tape is placed around the periphery of the device with its fingers touching the bottom electrode in the connector border area. The continuous body of the tape is folded and adhered to the back of the substrate. The fingers of the tapes form the connector portions 1403D and 1404D. The fingers of the second tape are then adhered on the top electrode (in the connector border area) and folded and adhered to the back of the substrate.

The tapes, after assembly, appear as shown in FIGS. 15A and 15B in a cross-section view (two sections shown from FIG. 14). One of the tapes is wider, in order to protrude out. Perimeter portion 1403C extends beyond perimeter portion 1404C to expose surface 1403E. This allows connection to be made to both edge busbars 1403 and 1404 directly to any convenient point or points on perimeter portion 1404C and to any convenient point or points on exposed perimeter portion 1403E.

Figure 15C:
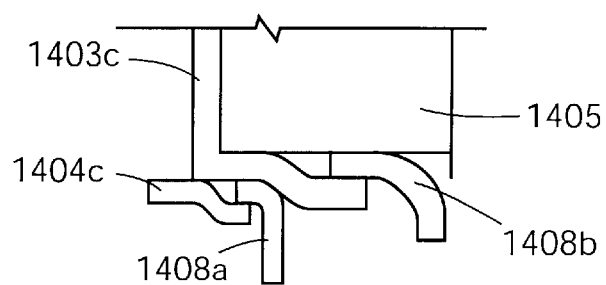
FIG. 15C is a schematic sectional side detail view of a substrate with a bottom conductor and signal connections according to an embodiment of the present invention.

Referring to FIG. 15C, the connection can be made by removing the insulating layer locally, or the tape may come with a connector-adapter and/or connector pre-attached as discussed earlier. Connections 1408A and 1408B are shown connecting to perimeter portions 1403C and 1404C, respectively while being insulated from perimeter portions 1404C and 1403C, respectively. Connections 1408A and 1408B can be, for example, a conductive wire or tape connected to an exterior signal connector. Connections 1408A and 1408B can be attached at only one corner (a smaller portion of the device perimeter), or at a longer portion of the device perimeter such as, for example, a substantial perimeter.

In all cases, one must be careful that the two busbars 1403 and 1404 do not electrically short in the regions 1410 where an edge of perimeter portion 1403C meets edge portion 1404B at the edge of substrate 1405. Shorting can be avoided by ensuring that the insulator layer of the tape extends out and covers the edges of the conductor. Alternatively, after adhering the first tape, these edges can be treated with an insulating material (tape, adhesive, coating) before the second tape is applied.

Once all the edge busbars are in place, the edges of the EC device 1444 can be encapsulated, for example, by injection molding (e.g., using thermoplastic elastomers or plasticized polyvinyl chloride) or reaction injection mold (e.g., using polyurethane) with a resin that can be solidified to ensure the reliability of the connections. It may even be desirable to cover the entire device with another substrate (preferably a glass or a plastic sheet) for mechanical and environmental protection before edge encapsulation. This cover substrate may also incorporate UV blocking characteristics. The edge encapsulation may be achieved such that a connector plug (which is internally connected to the busbars) is molded therein which can be easily disconnected from the power supply. This will allow EC panels to be quickly serviced and replaced in the field.

Figure 16A:
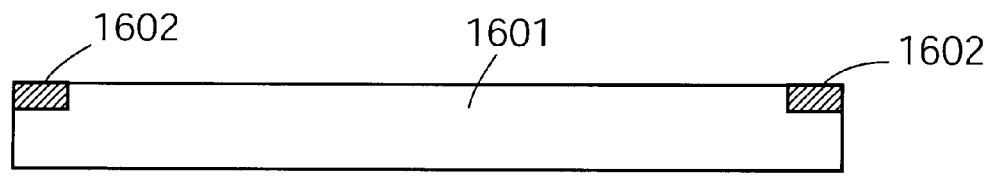
FIG. 16A is a schematic sectional side view of a single substrate with embedded edge busbars according to an embodiment of the present invention.
Figure 16B:
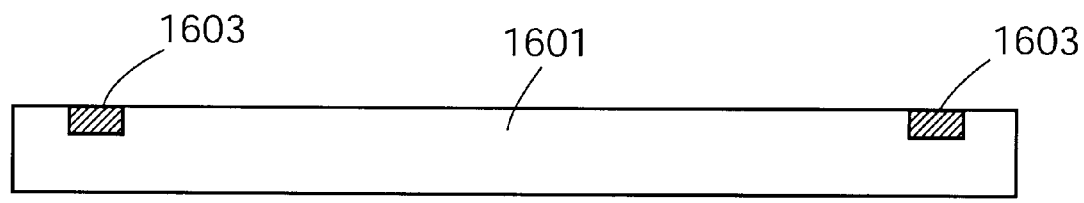
FIG. 16B is a schematic sectional side view of a single substrate with embedded edge busbars according to an embodiment of the present invention.

As shown in FIGS. 16A and 16B, busbars 1602 may be embedded in the edge of a substrate 1601 or busbars 1603 may be embedded in the edge regions of substrate 1601. The appropriate region of the substrate is etched, ablated, or otherwise conveniently removed to form a recess. A highly conductive material (e.g., a metal) is deposited into the recess region. Planarization, to bring the substrate surface and the busbars substantially to a plane, may be necessary prior to the deposition of an additional layer or layers. Such embedded busbars 1602 and 1603 can serve as perimeter portions with connector portions formed (not shown) by any convenient method such as, for example, wrapping tape around the edge to contact the back surface and the embedded busbar, depositing conductive material such as a frit or a coating around the edge from the embedded busbar to the back surface, or attaching a multitude of preformed conductive channels to the edge to contact the back surface and the embedded busbar.

As described previously, the edge busbar of the present invention provides sufficient conductivity such that a negligible voltage drop (preferably less than one tenth of the applied voltage) occurs in the edge busbar. The conductivity can be optionally reinforced by the addition of a supplemental conductor portion as part of the edge busbar of the present invention, as shown in FIGS. 32A, 32B, and 32C. In a preferred embodiment, an ultrasonic solder dispenses an appropriate soldering material on the edge of the substrate. A highly conductive medium (e.g. a wire, conductive tape or foil, etc.) is attached to reinforce the overall conductance around a substantial perimeter of the substrate. It is preferable that both the solder and the wire or strip are dispensed simultaneously to form the edge busbar and the reinforcement at the same time.

The reinforcement bar can also be in the form of a closed loop with a perimeter slightly smaller than that of the substrate. In this case, after applying the edge busbar, the reinforcement is expanded by heating and positioned around the edge making contact with the busbar. Of necessary, it can be soldered to further improve electrical contact. This method is particularly appropriate in the case of cells having circular or oval substrates where the reinforcement can be made in the form of a ring and contracted, by cooling, uniformly around the substrate. Finally, a lead can be soldered to the reinforcement.

Referring to FIG. 32A, an edge busbar 3202 is formed on a peripheral surface and a substantial perimeter edge of a substrate 3201. Edge busbar 3202 includes a reinforcement portion 3203 which can be any convenient conductor such as, for example, wire, foil, or bead of solder. Reinforcement portion 3203 is shown as a circular cross-sectional wire attached to the side of the edge portion 3205 of edge busbar 3202. A connection 3204 provides an external electrical lead to edge busbar 3202.

Referring to FIG. 32B, an edge busbar 3202' is formed on opposing peripheral surfaces and a substantial perimeter edge of a substrate 3201. Edge busbar 3202' includes a reinforcement portion 3203' which is shown as a circular cross-sectional wire attached to the side of the edge portion 3205' of edge busbar 3202'. A connection 3204' provides an external electrical lead to edge busbar 3202'.

Referring to FIG. 32C, an edge busbar 3202'' is formed on opposing peripheral surfaces and a substantial perimeter edge of a substrate 3201. Edge busbar 3202" includes a reinforcement portion 3203" which is shown as a circular cross-sectional wire attached to one peripheral edge portion 3206 of edge busbar 3202". A connection 3204" provides an external electrical lead to edge busbar 3202".

Figure 33A:
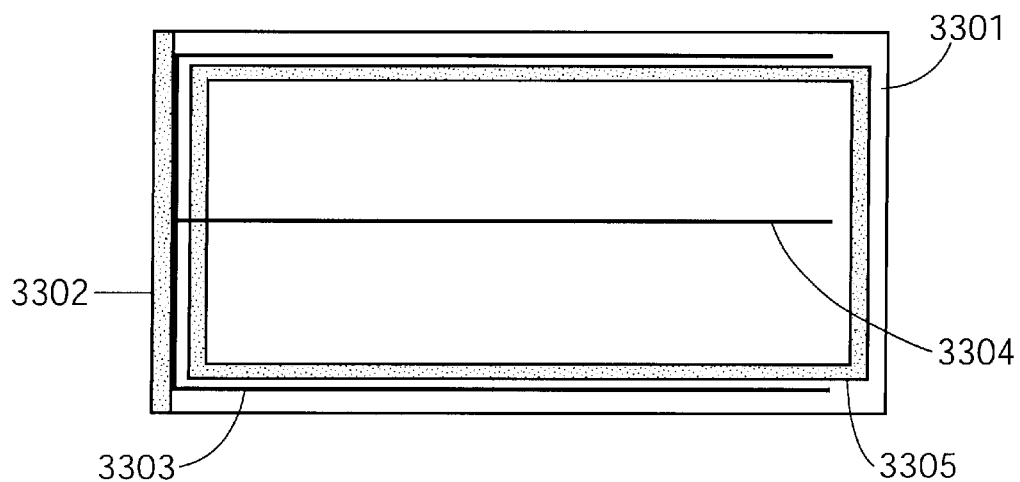
FIG. 33A is a plan view of an electrochromic cell according to an embodiment of the present invention.

Referring to FIG. 33A, a substrate 3301 is shown having a solder edge busbar 3302. Solder edge busbar 3302 is in electrical contact with one segment of a silver frit layer 3303. Another segment of silver frit layer 3303 forms an internal busbar 3304. Internal busbar 3304 is interior to the perimeter formed by a main epoxy seal 3305.

Figure 33B:
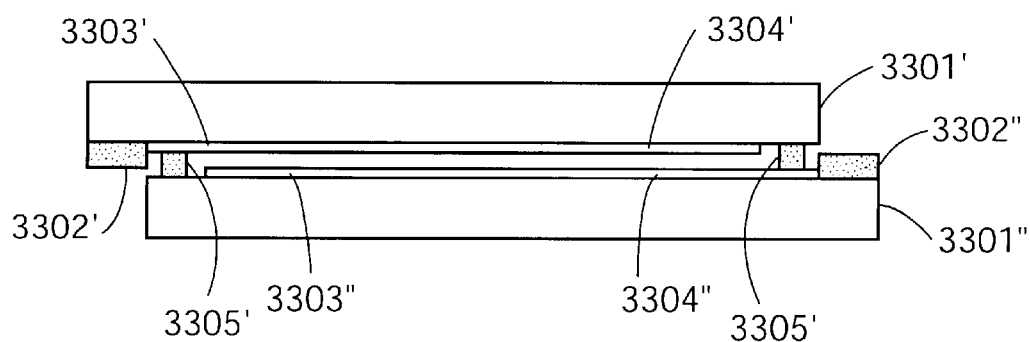
FIG. 33B is a cross-sectional side view of an electrochromic cell according to an embodiment of the present invention.

Referring to FIG. 33B, two substrates 3301' and 3301", each has a solder edge busbar 3302' and 3302" respectively. Each solder edge busbar 3302' and 3302" are in contact with segments of silver frit layers 3303' and 3303". A common epoxy seal 3305' bounds internal busbars 3304' and 3304" which are segments of silver frit layers 3303' and 3303" respectively.

The Examples which follow are intended as an illustration of certain preferred embodiments of the invention, and no limitation of the invention is implied.

EXAMPLES

Example 1 and Comparative Examples 1C and 2C

Figure 2:
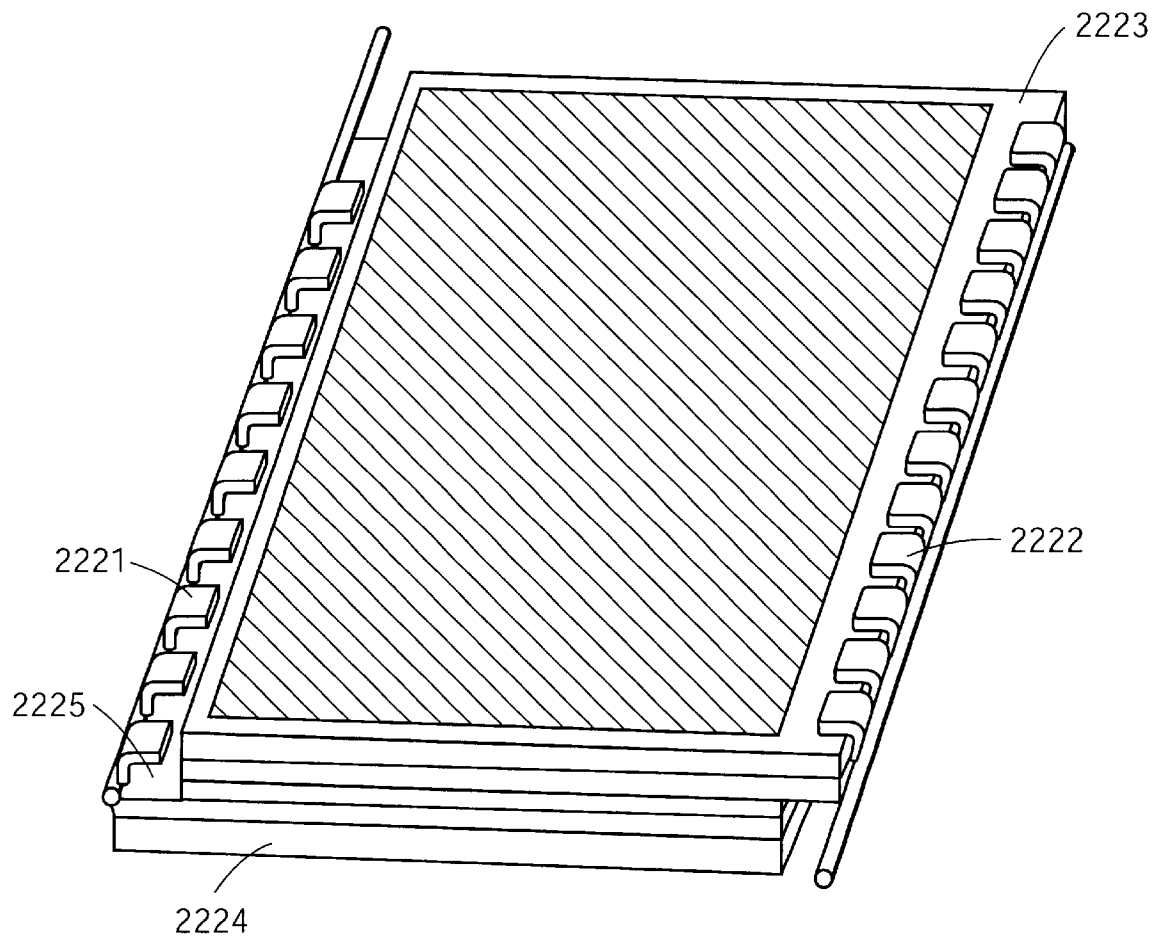
FIG. 2 is a perspective view of a prior art arrangement of edge busbars clips on two substrates.
Figure 5:
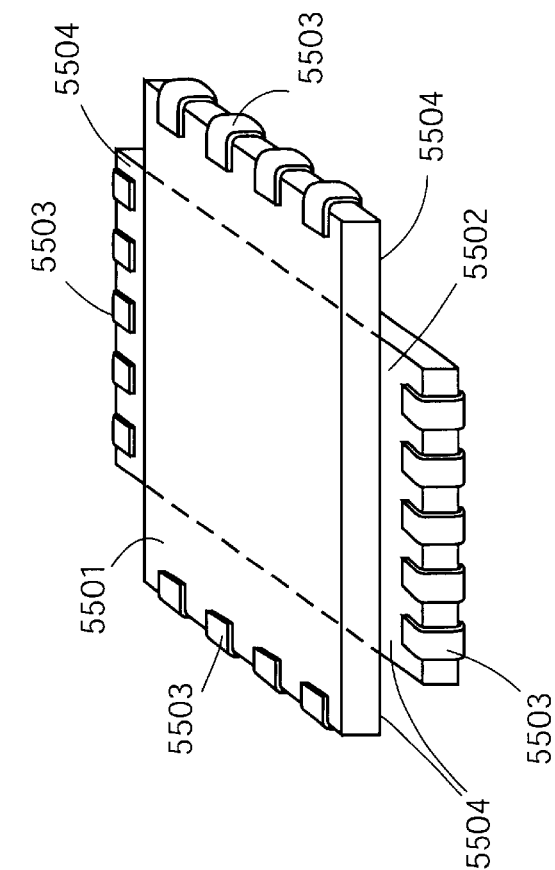
FIG. 5 is a perspective view of a prior art arrangement of edge busbars clips on two substrates.
Figure 4:
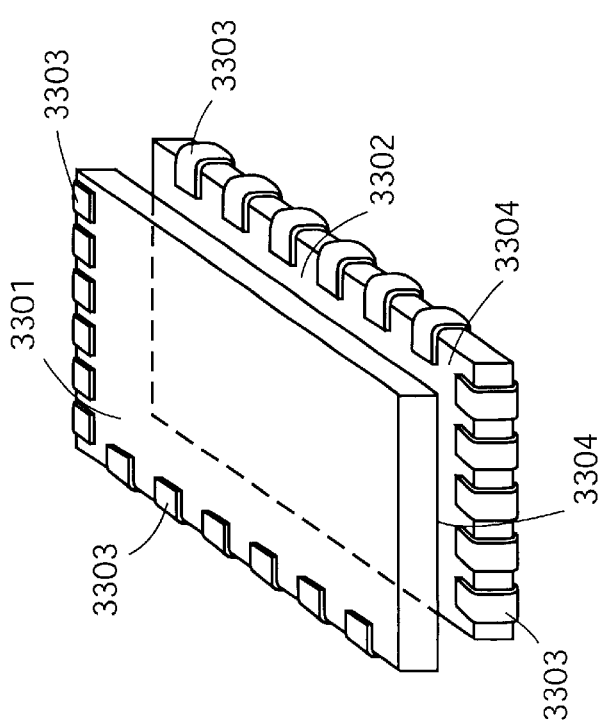
FIG. 4 is a perspective view of a prior art arrangement of edge busbars clips on two substrates.
Figure 6:
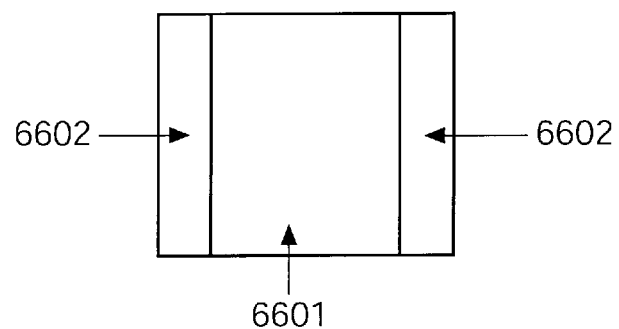
FIG. 6 is a schematic side view of an EC device.
Figure 17A:
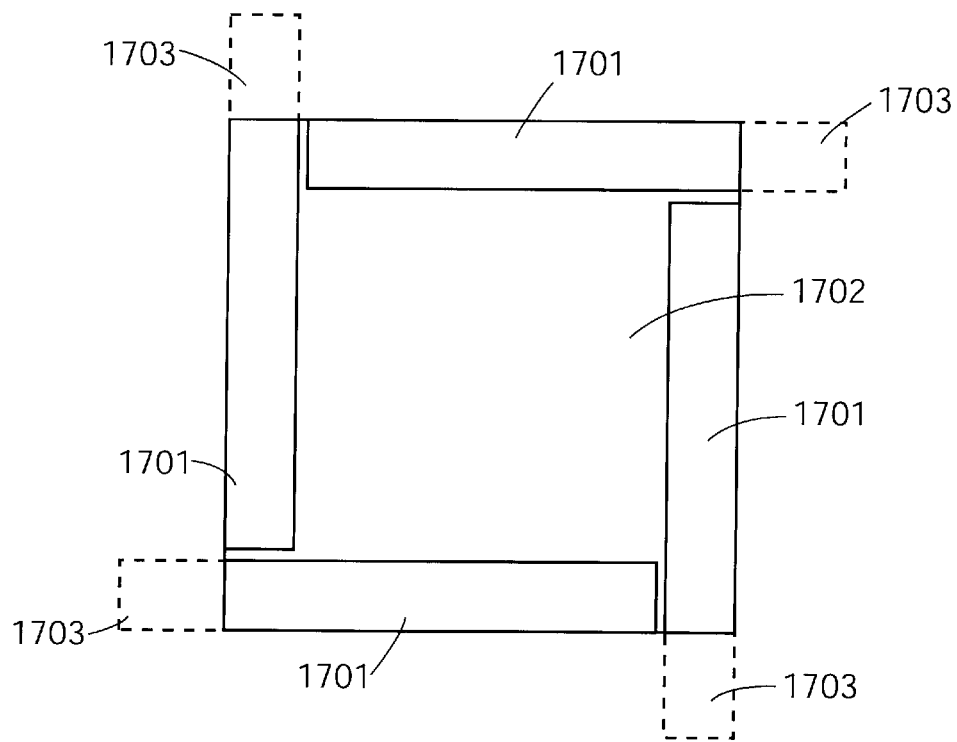
FIG. 17A is a top view of a substrate with a continuous conductor busbar according to an embodiment of the present invention.
Figure 17B:
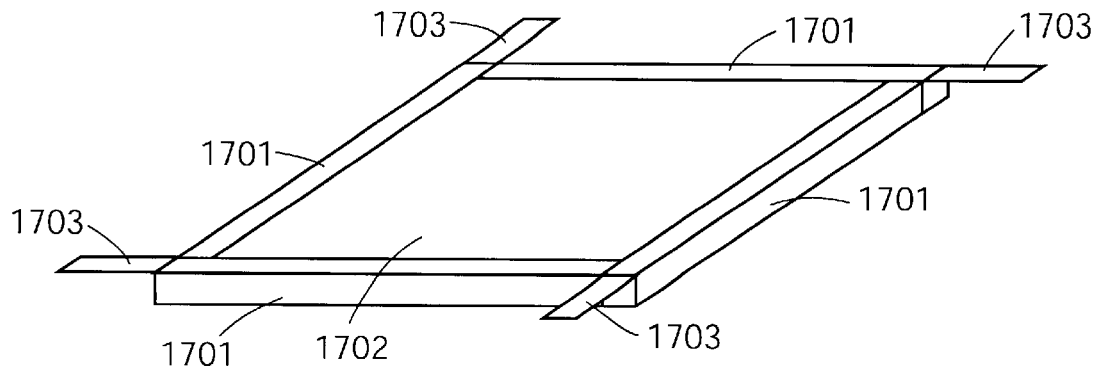
FIG. 17B is a perspective view of a substrate with a continuous conductor busbar according to an embodiment of the present invention at an intermediate fabrication step.

EC devices were made having two substrates, one employing a one half wave ITO (about 12 ohms/square) on glass substrate (from Donnelly Applied Films, Boulder, Colo.) and the other being a TEC 15 glass (from Libby Owens Ford (LOF), Toledo, Ohio). The nominal size of these was 6 inch by 6 inch (15 cm×15 cm). The gap between the substrates was 210 micrometers. Busbars were formed using a copper tape with conductive adhesive. Three different configurations were made: (i) Comparative Example 1C was made in a configuration as shown in FIG. 2, where the edge busbar was on one edge of each substrate, (ii) Comparative Example 2C was made in a configuration as shown in FIG. 4, where the edge busbars are on the two edges of each substrate, and (iii) Example 1 was made in a configuration as shown in FIG. 7A and constructed by a method as shown in FIGS. 17A and 17B, where the edge busbars are on four edges of each substrate. Copper tape (with conductive pressure sensitive adhesive) was used to form the busbars. The thickness of the copper tape was 50 micrometers and a width of 3 mm.

To form the busbar on all four edges, as shown in FIGS. 17A and 17B, four strips of copper tape 1701 were attached to substrate 1702 and then folded on the back of the substrate. Care was taken that these strips were close but not overlapping. On only one of the substrates, the copper tape was covered with a 50 micrometer thick polyimide tape, the latter was wider than the copper tape by about 1/32 of an inch (0.079 cm). This was done to prevent shorting of the two substrates if the copper tape peeled accidentally and touched the other substrate. optionally, tabs 1703 can be formed by extending one portion of copper tape 1701. The two substrates were then adhered to each other in a configuration shown in FIG. 7A. The total gap between the two substrates was 210 micrometers (controlled by the adhesive) and the total thickness of the tape was 150 micrometers.

The assembled cells were powered by connecting power to the busbars. In the case of Example 1, power was connected to one of the copper tabs 1703 sticking out from each of the substrates. In this example the tabs were not joined by a wire or a tape on the back. Since the distance between the adjacent copper strips was small, the potential drop in the intervening ITO was negligible for this device.

Thus, the busbars of Example 1 effectively formed a continuous electrical conductor around each substrate perimeter. The continuous electrical conductor of Example 1 included the connector portions being effectively electrically continuous as well as the perimeter portions being effectively electrically continuous.

Figure 18:
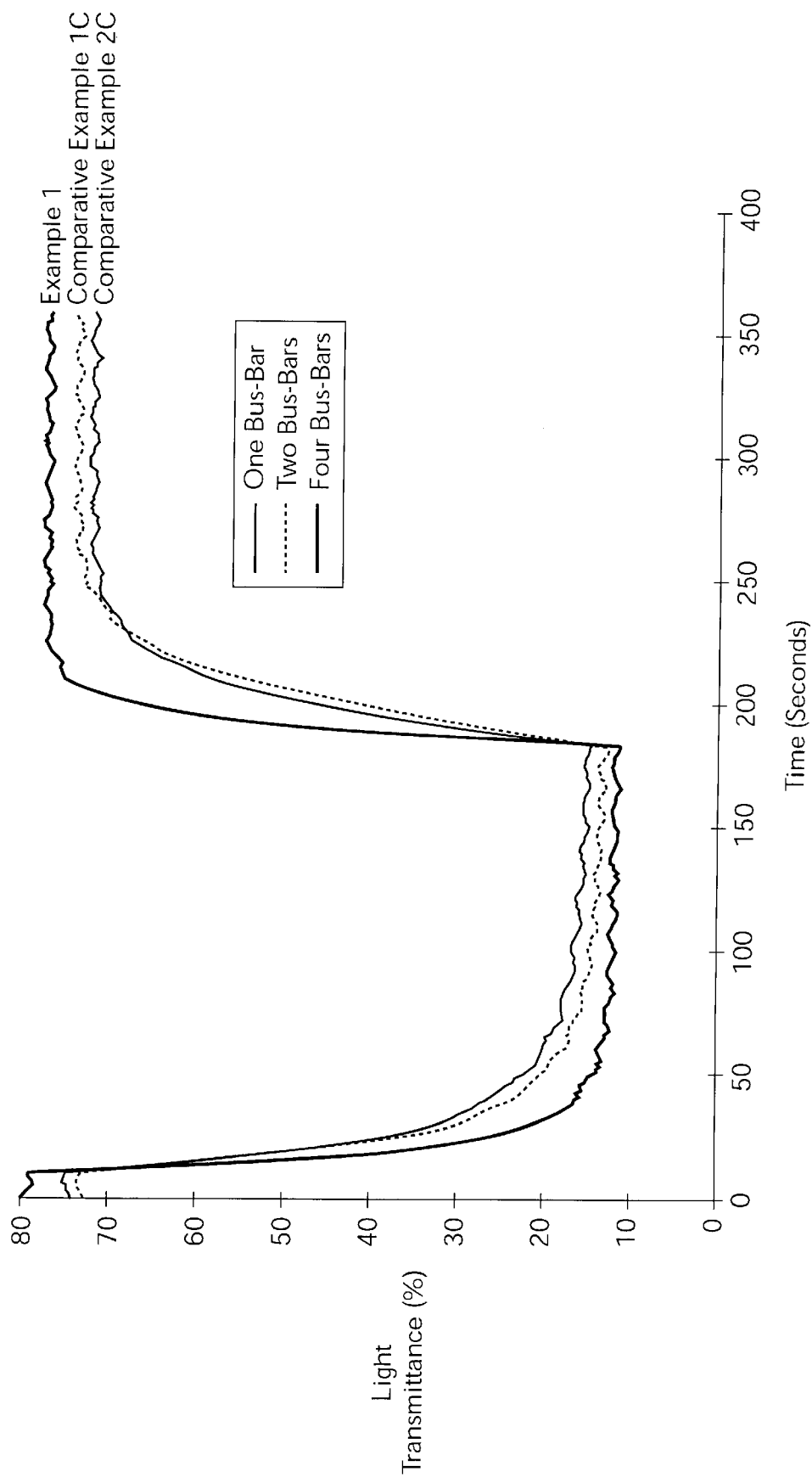
FIG. 18 is a graph of the light transmittance vs. time for different busbar configurations according to the present invention.

FIG. 18 shows the kinetic traces of each of the three devices when they were colored and bleached by applying identical step potentials. Example 1, the cell with busbar on all four sides colors, was the fastest to color and colored the deepest (during the time shown in the graph), while Comparative Example 1C, the one with busbar only on one edge, was the slowest to color and also colored the least deep of the three devices.

Example 2

Figure 19A:
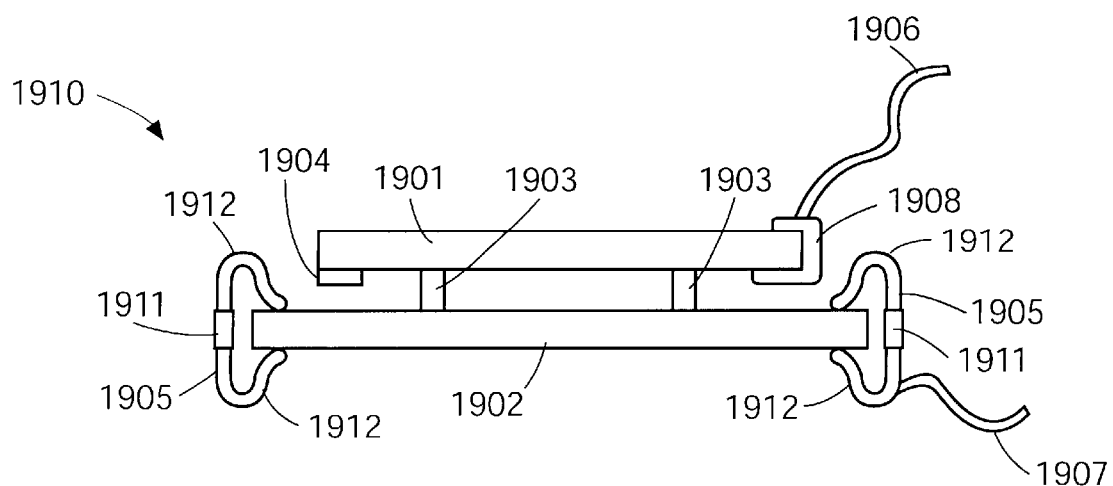
FIG. 19A is a schematic sectional view of a stacked circular substrate arrangement according to an embodiment of the present invention.
Figure 19B:
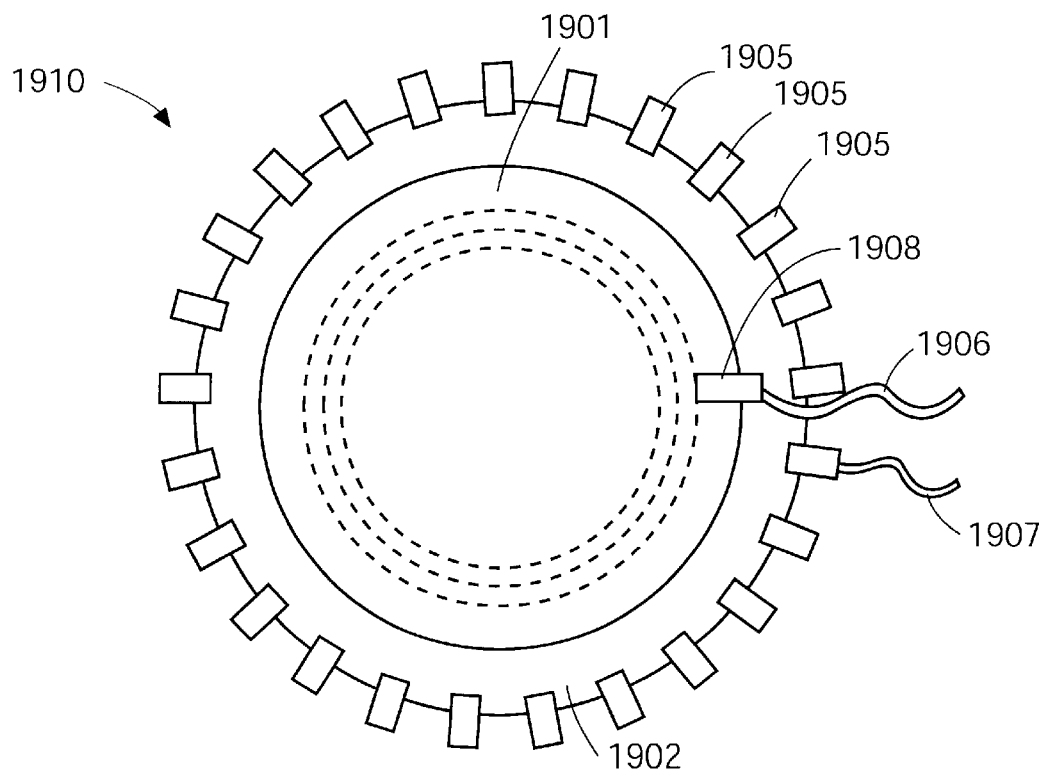
FIG. 19B is a top view of a stacked circular substrate arrangement according to an embodiment of the present invention.

An EC device 1910 was made using two TEC 15 transparent conductive substrates as shown in FIGS. 19A and 19B. Example 2 was a circular EC device 1910 with a substrate 1902 being 13 inches (33.02 cm) in diameter and a second smaller substrate 1901 being 12 inch (30 cm) in diameter. Before EC device 1910 was assembled, a busbar 1904 on the smaller substrate 1901 was formed by screening on a silver frit from Dupont Electronic Materials, Wilmington, Del. (frit Type 7713). The frit forming was deposited in a perimeter ring geometry to form busbar 1904, with the outer dimensions of the ring being substantially the same as that of substrate 1901. The width of the ring was 2 mm and the thickness was 5.5 micrometers. In one part of the busbar 1904 ring the silver frit was painted on the edge (while keeping it connected to the ring) and extended on to the back of the substrate to form a conductive path 1908 of busbar 1904 which is conductive from the front to the back. An electrical conducting wire 1906 is connected to conductive path 1908 on the back.

Substrate 1901 was heated to 575° C. for 6 minutes to consolidate and cure the frit. The busbar 1905 on the larger substrate 1902 was formed by attaching a copper beryllium spring clip 1905 around the circumference. Spring clip 1905 comprises a continuous perimeter portion 1911 which extends circumferentially around the edge of substrate 1902, and finger connector portions 1912 which extends radially from continuous perimeter portion 1911 to substrate 1902. A conducting wire 1907 was soldered to clip 1905 to power substrate 1902. EC cell 1910 was assembled by gluing the two substrates together with adhesive 1903, as shown in FIGS. 19A and 19B. The smaller substrate 1901 was kept concentric with the larger substrate 1902.

Internal Busbars

To produce the desired improvements in EC device behavior, it is necessary to reduce appreciably the effective resistance of the transparent electronic conductors (TC) in the devices or to otherwise transport charge more efficiently laterally across the device. In contrast to the case of a TC, when the transparency of a particular electronically conducting electrode (ECE) is not important, the ECE can generally be made thick enough in the prior art so that its resistance does not adversely affect the device behavior. For example, for a prior art mirror device with an Aluminum (Al) ECE and an ITO ECE, the Al layer can be deposited sufficiently thick. The result, however, is that the effective resistance of the ITO (the transparent electronic conductor or TC) usually is the primary limiting factor which must be overcome to improve the device behavior.

Figure 20A:
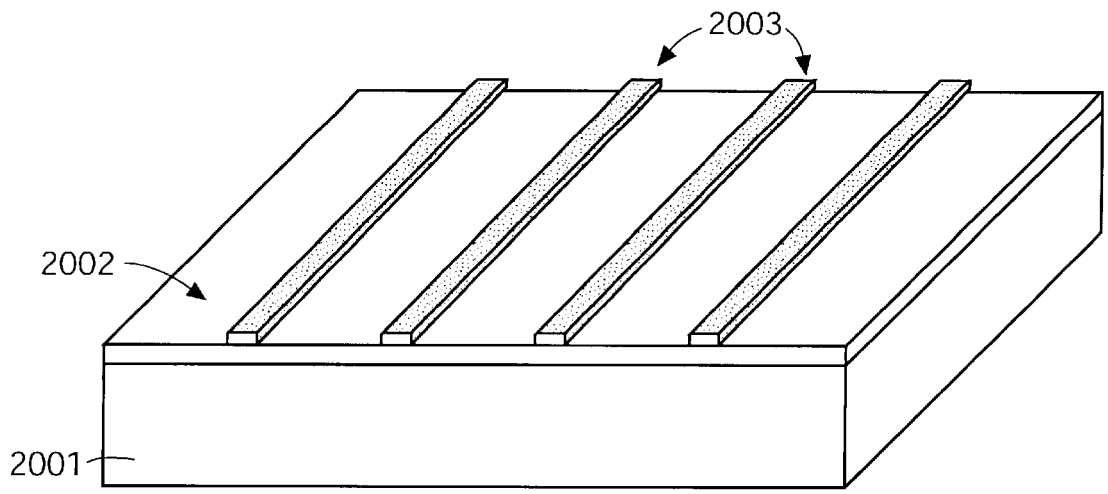
FIG. 20A is a schematic perspective view of a coated substrate with internal busbars formed on the surface according to an embodiment of the present invention.
Figure 20B:
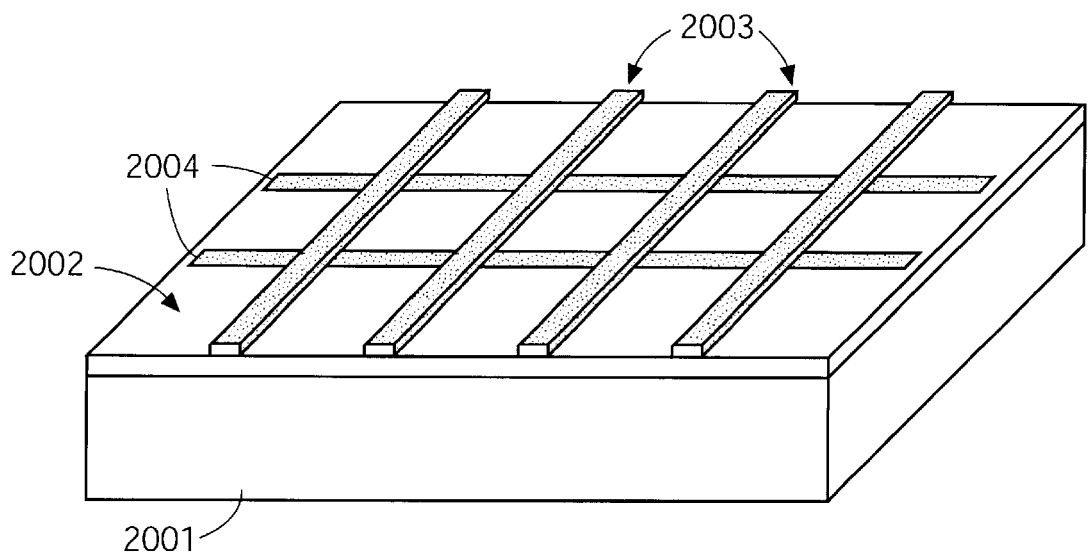
FIG. 20B is a schematic perspective view of a coated substrate with two sets of internal busbars formed on the surface according to an embodiment of the present invention.

In reducing the effective resistance of a TC, it is crucial to ensure that the means employed does not adversely affect other components of the device operation. This is especially problematic when the TC acts as a substrate for an active EC layer or layers (such as for devices which contain EC tungsten oxide deposited on ITO-coated glass substrates). In addition, one must ensure that the means employed do not too strongly diminish the transmissivity or apparent transmissivity of the TC or otherwise adversely affect the cosmetics of the device. For example, the resistance of the TC may be decreased appreciably by increasing its thickness, but increased thickness generally has a strongly negative impact on TC transmissivity characteristics and cost. Means for Decreasing the Effective Resistance of The TC's A desirable means of imparting a relatively high effective conductivity to a TC comprises depositing a pattern of a highly conductive material over, under, or within it (or some combination). Commercially available TC's such as half-wave ITO or doped tin oxide (DTO) can be used and modified by adding internal busbars according to the present invention. As shown in FIGS. 20A and 20B, e.g., the pattern can be formed as lines across the substrate. These lines may or may not intersect. The lines or patterns may be referred to as internal busbars (IB's). FIG. 20A shows a substrate 2001 made of, for example, glass, coated with a transparent conductive coating 2002. Internal busbars 2003 are formed on conductive coating 2002. FIG. 20B shows additional internal busbars 2004 transverse to internal busbars 2003.

It is important to ensure that the materials used for the internal busbars (IB) of the present invention do not react with the cell components. That is, the internal busbars should be chemically and electrochemically isolated from the reactive layers of the cell. Reactive layers are the electrolyte, the ion insertion electrodes, and the electrochromic layers. In these layers, chemical and physical reactions take place when the cell is colored or bleached.

The chemical and electrochemical isolation can be by any convenient means such as, for example, by interposing a barrier layer between the IB and the reactive layer. The property of being not ionically conductive is a requirement of the optical passivation layer so that, when a voltage is applied to the finished cell for coloring or bleaching, no ion transport takes place from any of the cell components to the internal busbars and vice versa.

As described below and in the figures, the isolated IB's of this invention are connected to the conductive layers by connecting portions that are electrically conductive. Accordingly, the IB's of this invention can provide substantial improvement of the electrical properties of the conductive layer while not being in contact with the layer.

A calculation of the effective sheet resistance corresponding to a pattern consisting of parallel lines on a transparent conductor was performed. The physical dimensions of these internal busbars (e.g., their thickness (or height), width, length, resistivity), along with the underlying transparent conductor characteristics, determine the overall effective sheet resistance. Tables 1A, 1B, and 1C below show the calculated effective sheet resistance of the substrates for various values of the relevant parameters. The calculations were made for 5 cm×5 cm square substrates traversed by five (n=5, or "$N_s$") parallel internal busbars, each of width $w_s$ and height $h_s$. For these calculations, the strips were assumed to be composed of Pt-metal ($\sigma=0.96\times10^5 (\Omega\text{cm})^{-1}$). The effective sheet resistance was taken as the resistance that would be measured between an electrode connected on one full side of the square and another connected to the opposite full side. It should be noted that the calculations can be repeated for a grid pattern which may consist of curved lines or non-uniformly dimensioned (e.g., in width and thickness) conductive line patterns.

TABLE 1A

| $h_s$\$w_s$ | $w_s$ | | | |
|---|---|---|---|---|
| $h_s$ | 0.01 mm | 0.05 mm | 0.1 mm | 0.15 mm |
| 100 nm | 13.29 | 13.448 | 13.396 | 13.344 |
| 1 μm | 12.526 | 9.721 | 7.595 | 6.232 |
| 2 μm | 11.683 | 7.595 | 5.283 | 4.051 |
| 3 μm | 10.946 | 6.232 | 4.051 | 3.001 |
| 4 μm | 10.297 | 5.283 | 3.284 | 2.383 |
| 0.1 mm | 1.538 | 0.339 | 0.171 | 0.115 |

Table 1A. Calculated effective sheet resistances Ω/■ for a system comprising 3 strips, where each strip possesses the dimensions ($h_s$, $w_s$) given in the Table.

TABLE 1B

| $h_s$\$N_s$ | $N_s$ | | | | |
|---|---|---|---|---|---|
| $h_s$ | 1 | 2 | 3 | 4 | 5 |
| 100 nm | 13.448 | 13.396 | 13.344 | 13.293 | 13.243 |
| 1 μm | 9.721 | 7.595 | 6.232 | 5.283 | 4.586 |
| 2 μm | 7.595 | 5.283 | 4.051 | 3.284 | 2.762 |
| 3 μm | 6.232 | 4.051 | 3.001 | 2.383 | 1.976 |
| 4 μm | 5.283 | 3.284 | 2.383 | 1.87 | 1.538 |
| 0.1 mm | 0.339 | 0.171 | 0.115 | 0.086 | 0.069 |

Table 1B. Calculated effective sheet resistances Ω/■ for a system comprising $N_s$ strips, where each strip possesses a width of 0.15 mm and a height, $h_s$, as indicated in the Table.

TABLE 1C

| $w_s$\$N_s$ | $N_s$ | | | | |
|---|---|---|---|---|---|
| $w_s$ | 1 | 2 | 3 | 4 | 5 |
| 0.01 mm | 12.232 | 11.181 | 10.297 | 9.543 | 8.891 |
| 0.05 mm | 8.891 | 6.628 | 5.283 | 4.392 | 3.758 |
| 0.1 mm | 6.628 | 4.392 | 3.284 | 2.623 | 2.183 |
| 0.15 mm | 5.283 | 3.284 | 2.383 | 1.87 | 1.538 |

Table 1C. Calculated effective sheet resistances Ω/■ for a system comprising $N_s$ strips, where each strip possesses a height of 4 μm and a width, $w_s$, as indicated in the Table.

The effect of size on the conductance of a 15 Ω/■ (TEC 15) substrate with internal busbars is shown in Tables 2A and 2B below.

Two different systems are considered:

System A: IB's comprise Pt-strips ($\sigma=0.96\times10^5 (\Omega\cdot\text{cm})^{-1}$), each 0.15 mm wide and 41 μm high; and System B: IB's comprise strips of DuPont 7713 Frit with a sheet resistance of $R_s=3$ mΩ/■ at 25 μm thickness. Each strip is 1.5 mm wide and 25 μm high.

The number, $N_s$, of IB's is such that there is a fixed spacing of 1 cm between busbars. Edge busbars are not represented in the calculations (so, e.g., for a L cm×L cm system, there are (L-1) IB's). In all cases, the underlying conducting sheet possesses a sheet resistance of 15 Ω/■.

TABLE 2A

| Calculated effective sheet resistance for Systems A and B | | |
|---|---|---|
| Substrate Area | $R_{Sheet}$ for System "A" | $R_{Sheet}$ for System "B" |
| 5 cm × 5 cm | 1.90 Ω/■ | 0.0250 Ω/■ |
| 10 cm × 10 cm | 1.71 Ω/■ | 0.0222 Ω/■ |

TABLE 2A-continued

Calculated effective sheet resistance for Systems A and B

| Substrate Area | $R_{Sheet}$ for System "A" | $R_{Sheet}$ for System "B" |
|---|---|---|
| 30 cm × 30 cm | 1.60 Ω/■ | 0.0207 Ω/■ |
| 100 cm × 100 cm | 1.57 Ω/■ | 0.0202 Ω/■ |

The effective sheet resistance is useful for comparing substrates of comparable size. However, an effective resistance (R), defined as the effective sheet resistance multiplied by the area of the substrate (thus possessing units of $\Omega \cdot cm^2/$■), is more useful for comparing substrates of different sizes. Table 2B comprises the data for the effective resistance (R), for each sheet, as a function of substrate size.

TABLE 2B

Calculated effective resistances for Systems A and B.

| Substrate Area | Effective Resistance for System "A" | Effective Resistance for System "B" |
|---|---|---|
| 5 cm × 5 cm | 47.4 Ω · cm²/■ | 0.624 Ω · cm²/■ |
| 10 cm × 10 cm | 171 Ω · cm²/■ | 2.22 Ω · cm²/■ |
| 30 cm × 30 cm | 1440 Ω · cm²/■ | 18.6 Ω · cm²/■ |
| 100 cm × 100 cm | 15700 Ω · cm²/■ | 202 Ω · cm²/■ |

It is desired that the width of the internal busbars should be small so that the active area of the EC device can be maximized. Further, such narrow widths also minimize optical interference to viewing through EC devices to which such internal busbars are incorporated. Thus, narrow widths are less obtrusive to vision.

As used herein, unless specified to the contrary, the descriptors "narrow or wide" refer to a "width" dimension parallel to the surface of the feature being described, while the descriptors "thin or thick" refer to a "thickness" dimension orthogonal to the surface of the feature being described.

A preferred geometry of the IB's include patterns which are greater than about 1 μm in thickness, and most preferably greater than about 10 μm in thickness. Although any convenient material can be used and formed by any convenient technology, materials and technologies that allow such thick IB's to be deposited are preferred. Examples of materials which are easy to deposit in these dimensions are typically conductive inks, pastes, and frits. Examples of the methods are described below.

Generally, the overall conductivity of the substrate does not depend appreciably on whether the conductive electrode coating is over the grid, around the grid, under the grid, or in some such combination. In the present invention, if the grid is deposited on the surface of the transparent conductor, the grid should be prevented from reacting or corroding in the device through the use of a protective barrier or passivation coating. The construction and materials of such a barrier coating depends upon the degree of reactivity of the grid material at the potentials encountered during device operation.

The internal busbars of the present invention may not be directly connected to other busbars such as edge busbars or such signal leads. The internal busbars of the present invention can be termed "floating" busbars. The signals are generally conducted to the internal busbars of the present invention by the conductive layer that is in contact with them. By such contact, the conductive layer's conductive is effectively lowered because the internal busbars of the present invention have lower conductivity than the conductive layer they are in contact with. The IB's of the present invention can be optionally connected to other busbars described above, to other IB's, or to electrical leads. However, as discussed below, an IB of the present invention can nevertheless receive an applied signal by the IB's being "bridged" to other voltage sources through the conductivity of the conductive layer the IB is in contact with. There are applications such as, for example, those that call for specific signals being applied to specific internal busbars where the internal busbars of the present invention can optionally be directly connected to a signal source.

In addition to a variety of lateral geometries, the IB's can occupy a variety of transverse locations in a device. For example, a pattern may be deposited on top of the TC. In a device of the form

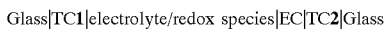

Glass|TC1|electrolyte/redox species|EC|TC2|Glass (where EC refers to an electrochromic film), for example, one may deposit a grid pattern on TC1, on TC2, or on both TC's. Naturally, the height of a grid on TC1 should be significantly less than the cell gap (i.e., the thickness of the electrolyte/redox species medium), preferably much less. For a grid deposited on TC2, one must ensure that the thickness, morphology, and chemistry of the grid do not adversely affect the EC film. Regarding thickness, if the thickness of the grid is much less than that of the EC film, then the grid has little effect on the shape of the EC film. If the thickness of the grid is on the order of or greater than that of the EC film, then the EC film may often form a noticeable "relief" of the grid pattern (or it may even form in separate areas defined by the grid pattern).

The durability of devices with the IB grid of the present invention generally should be similar to devices without the IB grid. Any durability test should yield the same result with or without the grid. That is, the addition of the internal busbars of the present invention should not affect the reliability and durability of the devices. Accordingly, results of any durability tests to qualify a device for a particular application are likely transferable, or can be anticipated to be the same if such tests are repeated with the devices having internal busbars. Because durability is one of the key issues involved in developing a commercially viable device, this is an important parameter. To ensure durability of these devices, it has been discovered that it is preferred to deposit a passivation layer on top of the internal busbars, particularly if the IB's are deposited on top of the transparent ECE's. Materials for passivation are described below.

Figure 21:
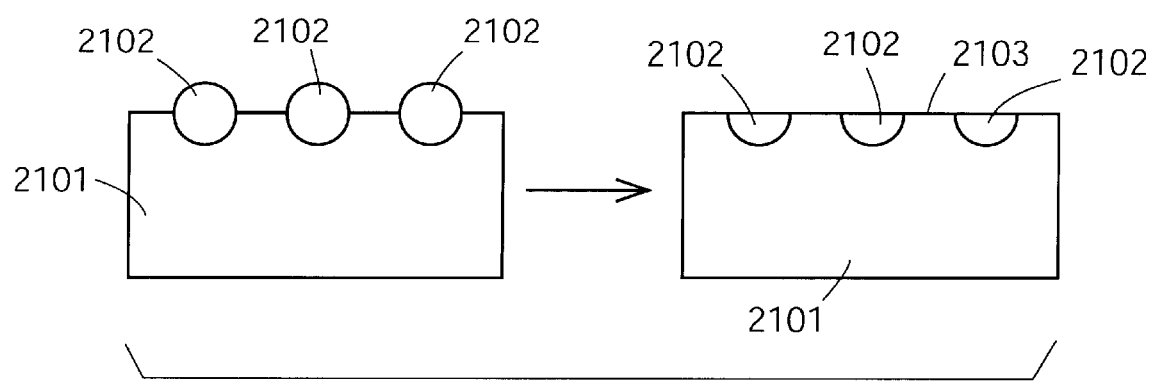
FIG. 21 is a schematic cross sectional view of a process to form embedded internal busbars on a substrate according to an embodiment of the present invention.

As shown in FIG. 21, the "effective height" of the grid may be reduced by embedding the grid conductor partially in the TC and substrate. Internal busbar conductors 2102 are embedded in substrate 2101. The formation of internal busbar conductor 2102 may be done by any convenient way such as, for example, by etching or ablating away a desired pattern in the substrate and then depositing the desired grid material. The effective height of the grid may be reduced by embedding it partially in the glass as well as the TC. One can etch or ablate away consecutively the TC coating and the substrate, followed by depositing the desired grid material. Alternatively, one can deposit the grid onto, or embed the grid into, the glass before the TC is deposited. The portion of busbar conductors 2102 that are above the surface plane of substrate 2101 is removed until the surface and the busbar conductors are at substantially the same plane 2103.

In one embodiment, the grid is partially embedded into the glass and then the surface is planarized by, for example, polishing to produce a structure as shown in the process in FIG. 21. Planarizing may also be done by depositing additional material on to the substrate so that the top surface of this added material is coplanar with the grid. Although FIG. 21 shows conductors 2102 having circular cross section such as commonly found in a wire, it could be of another convenient shape, such as rectangular. Additionally material can be deposited, for example, from solutions, or by physical vapor deposition, etc. Some examples of such materials are polyimide, sol-gel deposited oxides and organic/inorganic hybrids.

A TC is then deposited on the resulting planarized surface and the resulting glass|TC substrates used in the same manner as they are typically used. This process of the present invention has the distinct advantage that the more chemically active components of the device such as the EC film and the electrolyte are not directly exposed to the IB grid material.

Figure 1B:
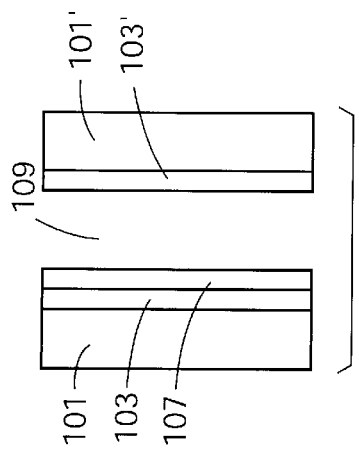
FIGS. 1A, 1B, 1C, 1D, 1E, and 1F are side cross-sectional views of a number of different prior art electrochromic, liquid crystal, PDLC, and photochromic devices suitable for use in the present invention.
Figure 1D:
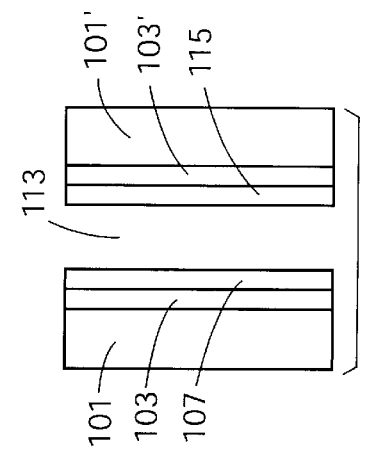
Figure 1F:
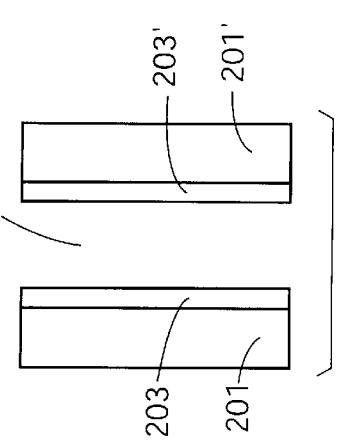
Figure 1A:
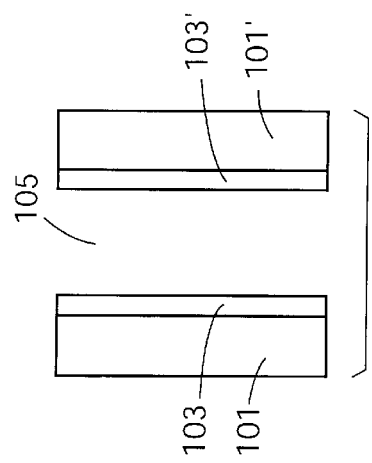
Figure 1C:
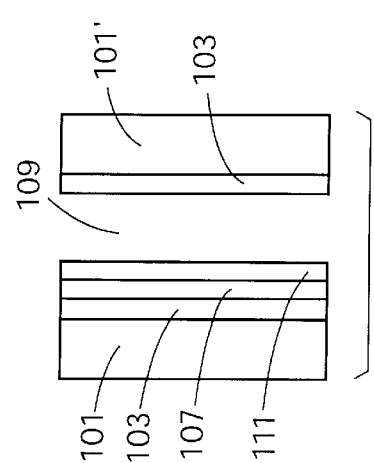
Figure 1E:
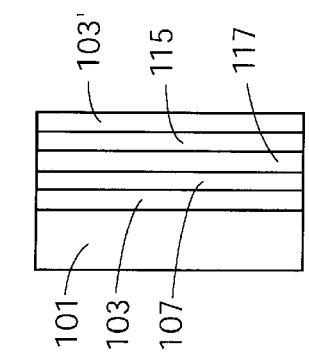

Except for the glass substrates, the layers in single substrate devices (See, for example, FIG. 1E) are generally each quite thin (typically in the 100's of nm). It is therefore particularly preferred to use IB's which are fully embedded under the TC in such devices. The IB on the outer TC (layer 103' of FIG. 1E) could consequentially be of any thickness since it will protrude on the outside of the device.

Whether it is desirable to include IB's on one or both TC's in a device depends on a variety of factors, including the required response time and coloration uniformity characteristics and the cost of manufacturing the devices. Devices generally display faster response times and greater coloration uniformity with the IB's implemented on both TC's.

IB Dimensions

Figure 22:
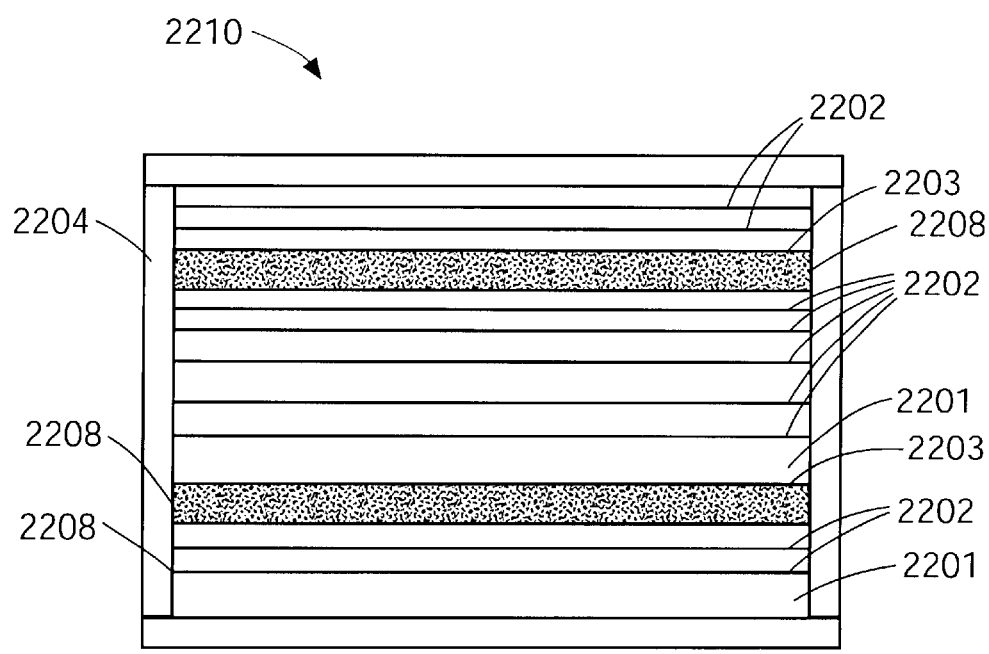
FIG. 22 is a schematic plan view of a device with internal busbars having different widths according to an embodiment of the present invention.

The dimensions of the IB's width and depth can be varied throughout a substrate. As shown in FIG. 22, EC device 2210 has conductive transparent substrate 2201 transversed by narrower internal busbars 2202 and wider internal busbars 2203. Narrower internal busbars 2202 and wider internal busbars 2203 are separated by gaps 2208 from edge busbar 2204. Gaps 2208 are bridged by conductive transparent substrate 2201. Narrower internal busbars 2202 and wider internal busbars 2203 optionally connect directly to edge busbar 2204.

By combining, for example, narrow and wide IB's one can enhance the conductivity of the substrate while maximizing its transmission. However, while incorporating the use of wider IB's decreases their resistance (and thus advantageously decreases the effective resistance of the TC), it also affects the apparent transmission of the device. The transverse or primarily transverse direction is usually the direction of most importance for the optical properties of the devices. Accordingly, increasing the depth (or height) of the IB's is advantageous when compared to increasing the width of the IB because increasing the depth will typically have a much smaller adverse effect on the cosmetic appearance and/or the apparent transmission of the devices than increasing the width.

Another component of the present invention is the use of IB's which will be optically less prominent, by making the IB's much deeper than they are wide. For example, defining the aspect ratio, $r_{ib}$, as the effective width of the internal busbar structure divided by its effective height (thickness), it is generally desirable to have rib smaller than 1, for optical transmission applications where a viewing path is through the surface on which is deposited the busbar structure.

The reason is that, if one is viewing parallel to the height (thickness) of the IB, then increasing the thickness while the other dimensions of the IB remain constant does not substantially affect the appearance of the device; but such increased thickness does desirably reduce the resistance of the IB (and therefore desirably reduces the effective resistance of the corresponding TC). It is therefore generally desirable that the height direction of the IB's be parallel to the primary viewing direction for such applications.

Figure 23:
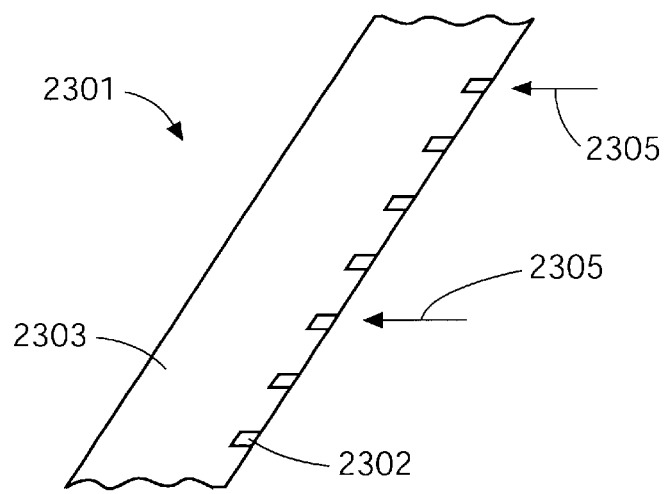
FIG. 23 is a schematic cross sectional side view of a device with internal busbars having a transverse axis parallel to a sight line that is at an angle to the surface normal according to an embodiment of the present invention.

Most commonly, this means that the height direction of the IB's should be transverse to the plane of the substrates of the device. But for some devices such as, for example, an automotive windshield, the primary viewing direction might be at some angle to the approximate plane of the windshield. In such applications it would be preferable to implement the IB's such that their height direction is parallel to such slanted viewing direction. As shown in FIG. 23, device 2301 has internal busbars 2302 embedded in substrate 2303 at an angle parallel to the viewing direction 2305.

Figure 31A:
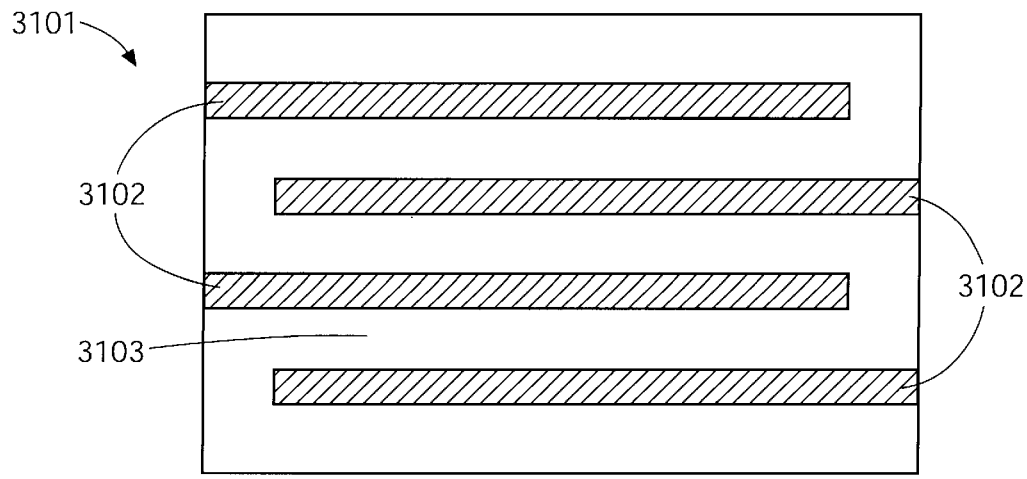
FIG. 31A is a schematic plan view of a set of internal busbars disposed on a substrate according to an embodiment of the present invention.

Another consideration is the need to provide a contiguous channel within the device that allows the electrolyte fluid to flow throughout the gap during filling in order to minimize manufacturing difficulties. Referring to FIG. 31A, a device 3101 has internal busbars 3102 disposed such that no internal busbar blocks a contiguous channel. Internal busbars 3102 are in contact with only one device edge and extend only to the other device edge, thereby forming a contiguous channel 3103. If the device is filled with the electrolyte after edge sealing (such as by vacuum backfilling), only one fill hole is required to perform the filling task.

Figure 31B:
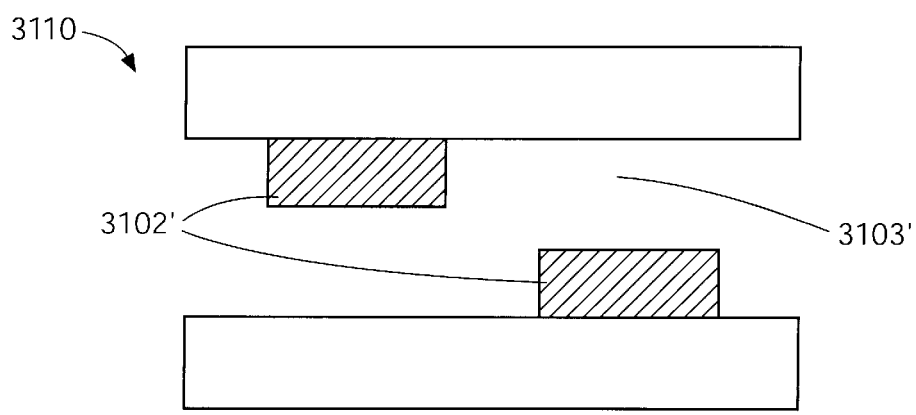
FIG. 31B is a schematic sectional view of a set of internal busbars disposed between two substrates according to an embodiment of the present invention.

Similarly, FIG. 31B shows a device 3110 where internal busbars can extend from one device edge to the other device edge. The internal busbars are arranged in a staggered configuration. Consequently, although internal busbars 3102' might extend from one device edge to the other device edge, and each internal busbar 3102' might be thicker than one half the gap distance, their staggered arrangement forms a contiguous channel 3103' which allows easy filling of device 3110, with electrolyte fluid, without interruption.

Figure 31C:
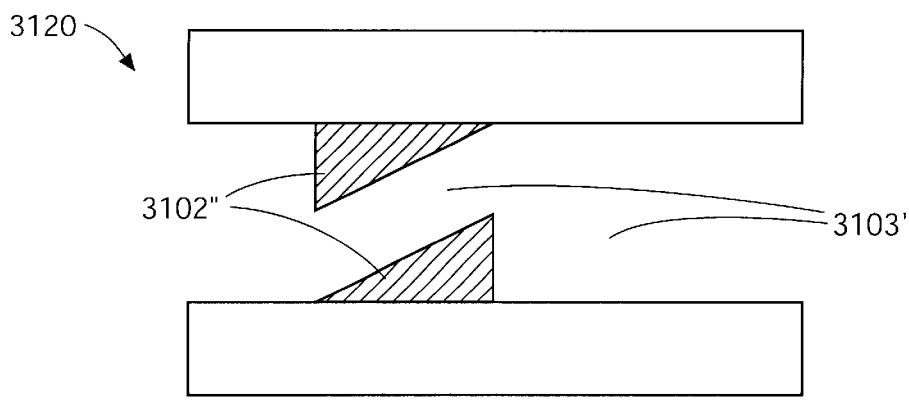
FIG. 31C is a schematic sectional view of a set of internal busbars disposed between two substrates according to an embodiment of the present invention.

FIG. 31C shows a device 3120 which has internal busbars 3102" that can extend from one device edge to the other device edge, and that can be in an overlapping relation. Internal busbars 3102" are, however, in alternate ramped geometries which form a contiguous channel 3102" which allows easy filling of device 3120, with electrolyte fluid, without interruption.

FIGS. 31B and 31C show embodiments of the present invention in which the sum of the thicknesses of the internal busbars is larger than the cell gap distance. Yet, the innovative geometries of the present invention allows such internal busbars use without any problems of electrical shorting or interrupted electrolyte fluid continuity. As described above, the width of the internal busbars should be small so that the active area of the overall EC device can be maximized. The resistance of internal busbars with narrow width can be nonetheless low because the height (thickness) of the internal busbars can be made effectively thick. As described above, geometries and patterns that form IB's having thicknesses greater than about 1 $\mu$m are preferred, and most preferred are thicknesses greater than about 10 $\mu$m. FIGS. 31B and 31C show how such thicker dimensions can be used without causing the gap distance to be disadvantageously thick.

Auxiliary Uses for IB's

The IB's included in devices under the present invention may be used for additional purposes, and these may or may not require modification of the IB design. For example, the IB's may be used as Joule heating elements for purposes such as de-fogging. For this purpose, it is desirable to pass current through the IB's independently of current being used to color or bleach the device.

Figure 24:
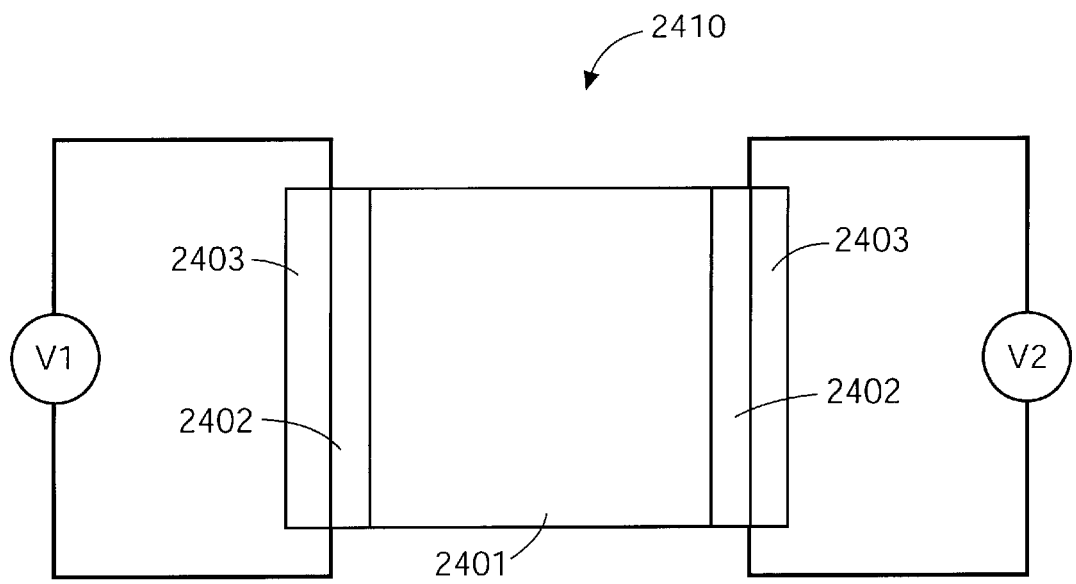
FIG. 24 is a schematic cross sectional diagram of a device according to an embodiment of the present invention having internal busbars that cause a property change when a signal is applied between them, a different property change when a signal is applied along each busbar equally, and changes in both properties when a difference occurs in the signals applied to each busbar according to an embodiment of the present invention.

One means for implementing this purpose according to the present invention includes providing for separate addressing of the two ends of a set of IB strips. FIG. 24 shows a device 2410 with an EC assembly 2401 having two internal busbars 2402 over the layers of TC 2403. Applying a voltage V1 and V2 of equal values across the two ends will induce a current flow along each of the internal busbars 2402 but will not result in EC activity in device 2410 because, with equal voltage potentials at each end, there is no current path or potential drop transverse to the device. If it is desired that EC activity and heating occur contemporaneously, the signals can be adjusted accordingly to provide for a current path and a potential drop transverse to the device by changing V1 and V2 to be unequal. For most EC devices the voltage difference needed between V1 and V2 is less than 2 volts.

If IB's are implemented on both TC's of a window-type device, separate heating of both TC's without inducing EC activity requires balancing of the lateral voltage potentials so that there is no transverse potential. If simultaneous coloring is desired, the potentials can be adjusted accordingly.

The IB's may also be used as antennae for electromagnetic signals. For example, one can use a strip IB as a monopole antenna, letting one end float electrically and connecting the other end to the appropriate signal processing electronics such as, for example, a radio receiver. To obtain a larger signal, the signals from a set of strip IB's forming well known antennae geometries may be combined and the combined signal appropriately processed. Other patterns of IB's forming well known antennae geometries may be used to optimize the antenna functionality. If desired, IB's may also be used as transmitters following well known transmitter grid geometries.

IB's may also be used to provide or enhance the effective shielding from unwanted electromagnetic waves or interference. The penetration depth (or "skin depth") of electromagnetic waves into the devices may be decreased by increasing the effective conductivity of the TC layers. In addition, specific IB patterns may be employed such as, for example, forming a part of a Faraday cage to provide optimal shielding for a particular class of electromagnetic waves.

Separately-Addressable IB's

In an embodiment of the present invention, IB's form a single addressable array. FIG. 25A shows a device 2501 with internal busbars 2505 arranged at an angle to and proximate to a busbar 2507 with proximate gaps 2508 between busbar 2507 and each internal busbar 2505. Proximate gaps 2508 are bridged by conductive layer 2509 on substrate 2510. Busbar 2507 can be an internal busbar or an edge busbar. Busbar 2507 and internal busbars 2505 form a single addressable array 2503 powered by a conductor 2504. Optionally, each internal busbar 2505 is directly connected to busbar 2507.

In another embodiment of the present invention, the IB's are made to be separately addressable. FIG. 25B shows a device 2502 with separately addressable internal busbars 2506, each separately powered by separate conductors 2504.

One can use the separately addressable IB's to obtain an added measure of control over the spatial distribution of the coloring and/or bleaching of an EC device. Whether one needs to be able to address separately the IB's on one of the TC's or on both of the TC's depends upon the degree of control required.

One can utilize the separately addressable busbars (or separately addressable busbar groups) to have an EC device (e.g., a sunroof or windshield) that has differential coloration from one side to the other, or from top to bottom, etc. Such individual control can produce a number of effects such as, for example, a gradient effect, a shade effect, or a geometric pattern effect.

One can employ light sensors and use the signals from the sensors to determine the appropriate signals to apply to the separately addressable IB's to obtain the desired spatial distribution of coloring or bleaching. For example, for an automotive sunroof, one can use light sensors to effectively track the position and intensity of the sun and then color more deeply the appropriate regions of the sunroof. In addition, information (obtained either automatically or manually) regarding the presence and positions of occupants of the automobile may be combined with the signals from the light sensors to determine the appropriate signals to apply to the separately addressable IB's to obtain an appropriate coloring or bleaching pattern. The light sensors should be situated such that they provide effective indications of the light intensity from a variety of directions. The presence and positions of occupants of the automobile may, for example, be sensed via transducers in the seats and/or by detecting the status of the seatbelts.

Under the present invention, a variety of "Smart Devices" can be made by using the signals derived from a system of sensors to determine the appropriate drive signals to be applied to the individually-addressable IB's and edge busbars in EC devices.

Conductive frits are usually pastes and liquids (also termed inks) of a conductive material in a carrier. The carrier typically cures or typically is eliminated during a post-application process such as subjecting to elevated temperatures. Conductive frits for IB can be deposited by any convenient method such as, for example, X-Y Motor Painting/Screening, Doctor Blading/Silk Screening/Circuit Printing, Chemical Vapor Deposition and Physical Vapor Deposition (CVD and PVD):

1. X-Y Motor Painting/Screening: For certain conductive materials, which are applied in the form of viscous liquids, a programmable X-Y table with a fluid dispenser may be utilized to apply the desired pattern to the substrate. The thickness and width of the conductive line is determined by factors such as the size of the dispenser tip opening, the viscosity of the fluid, the dispenser line pressure and the lateral speed of the dispensing tip relative to the substrate, and the distance between the dispensing tip and the substrate. Low viscosity molten metals may also be used for the busbars. These could be sprayed or processed by soldering or welding. These methods could be assisted by ultrasound or other energy imparting means to promote uniformity and/or better adhesion to the substrate.

2. Doctor Blading/Silk Screening/Circuit Printing: This method involves the forcing of a viscous liquid through narrow openings in an appropriate mask, to be deposited on a substrate in a pattern determined by the mask design. This mask may consist of any type of tape, film, or other mask material, such as a silk-screen-like item, placed on top of the substrate, with channels or isolated voids in a desired pattern. An excess of the fluid is then placed at one end of the mask, then a uniform, flat tool (such as a "squeegee" or similar implement) is dragged across the mask, forcing the fluid through the pattern troughs onto the substrate.

Another alternative is to silkscreen, or otherwise use a doctor blade to deposit uniform layers of photoprintable thick film compositions. The internal busbar pattern is then formed by exposing the deposited film to certain wavelengths of light through masks and followed by chemical processing. The passivation materials for internal busbars such as certain dielectric materials can be similarly processed. The advantage of this over conventional silkscreening is to get finer resolution and/or higher densities of conductive lines.

3. Chemical Vapor Deposition and Physical Vapor Deposition (CVD and PVD): CVD is a known process which deposits a coating by decomposing a chemical vapor to provide the depositing material. PVD is a known process which deposits a coating by vaporizing a material and then redepositing this in a substrate in a vacuum chamber. CVD and PVD may be assisted by energy imparting sources such as plasma, ionized beams, microwave, etc.

In these methods, patterns are applied by placing either a shadow mask over the substrate and coating directly onto the surface, or by using photolithographic technology to apply a photoresist mask to the substrate, coating that assembly with metal, and then stripping the photoresist layer away, leaving the metal pattern.

Some exemplary frit, inks and conductive adhesives that may be employed in this invention include:

Frits:

DuPont Electronic Materials, Wilmington, Del., Silver-Bearing Conductors: DuPont Silver Thick Film Composition, Nos. 1991, 1992, 1993, 1997; DuPont Silver Thick Film Composition, #7713; and DuPont Solamet Photovoltaic Compositions such as #E64885-52A.

DuPont Gold-Bearing Conductors.

DuPont Fodel Photoprintable Conductors DC201 and DC010.

Ferro Silver Paste FX 33-246 available from Ferro Inc., Santa Barbra, Calif.

Metal Inks:

Engelhard Electronic Materials, East Newark, New Jersey, Metallo-Organic Inks: Platinum Inks such as #05X, Gold Inks such as #A3622, and Silver Inks such as #R2/321 and low temperature cured flexible materials such as #M5860.

Conductive Epoxies, Silicones, etc.:

Grace Specialty Polymers, Emerson & Cuming Inc. (Woburn, Mass.), Minico M 4200 Flexible Silver Buss Bar; 4xxx series materials; Eccocoat CT 5030 A/B Flexible/Rigid Buss Bar; Minico M 6xxx series silver/copper materials.

When devices are fabricated that use two substrates, such as those described in U.S. Pat. Nos. 5,142,407, 5,241,411 and 4,761,061, one or both of the substrates may have added internal busbars according to the present invention.

Figure 26A:
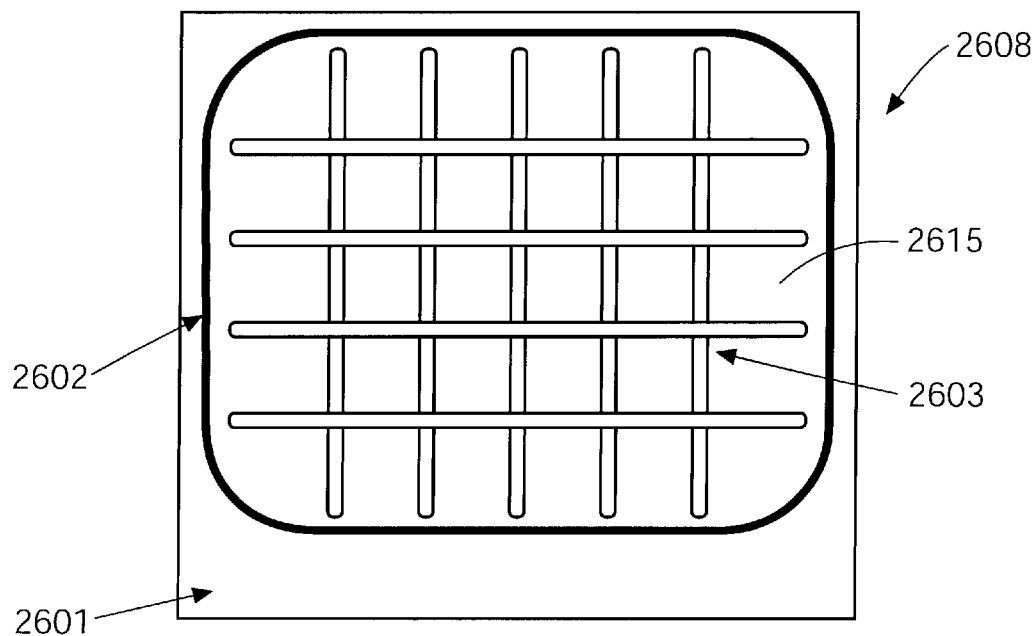
FIG. 26A is a schematic plan view of two groups of internal busbars arranged at an angle to each other according to an embodiment of the present invention.
Figure 26B:
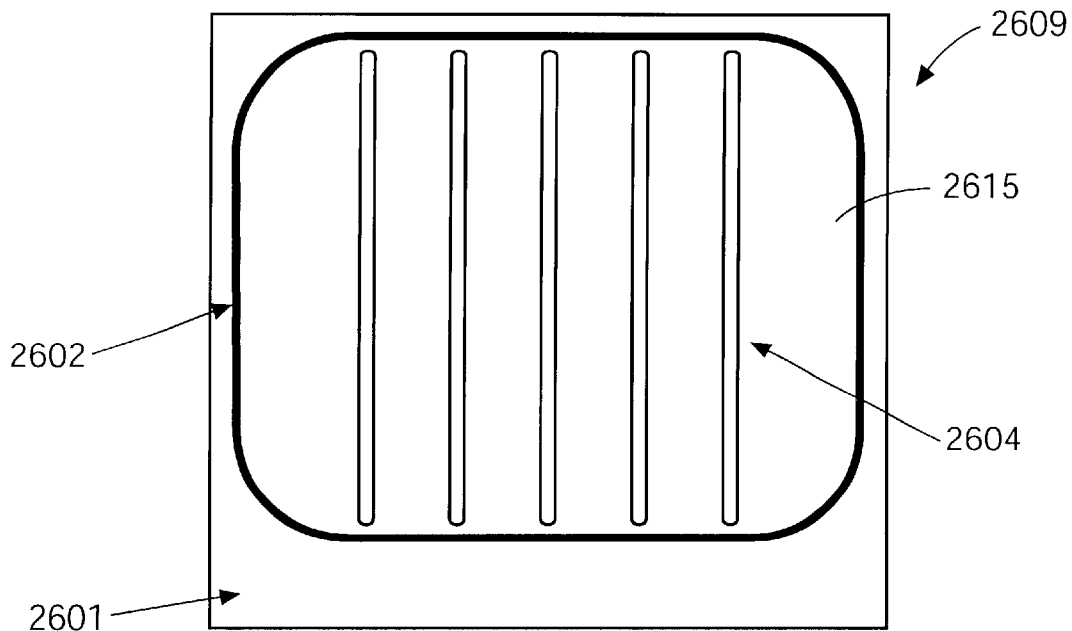
FIG. 26B is a schematic plan view of a group of internal busbars arranged substantially parallel to each other according to an embodiment of the present invention.

FIGS. 26A and 26B show two configurations of various grid patterns according to the present invention that do not extend to the edges. FIG. 26A shows a device 2608 having a perimeter busbar 2602 on substrate 2601. Substrate 2601 has a conductive layer 2615 on its surface. A series of internal busbars 2603 form a crosshatch pattern. Internal busbars 2603 can be on, in, and/or below conductive layer 2615. The perimeters of each internal busbar 2603 are in contact with conductive layer 2615.

FIG. 26B shows a device 2609 having a series of internal busbars 2604 forming a parallel pattern. Neither series of internal busbars 2603 or 2604 touch perimeter busbar 2602. As a result, when an EC device is fabricated using two substrates, the grid pattern an be completely enclosed in the device. The internal busbars conduct a current that travels from the perimeter conductor through the conductive layer 2615 to the internal busbar. This may be advantageous, since the adhesive used to seal the edges of the two substrates need not be modified in composition and no change in processing parameters is needed for ensuring good adhesion to the internal busbars and for accommodating the change in substrate topography.

Figure 26C:
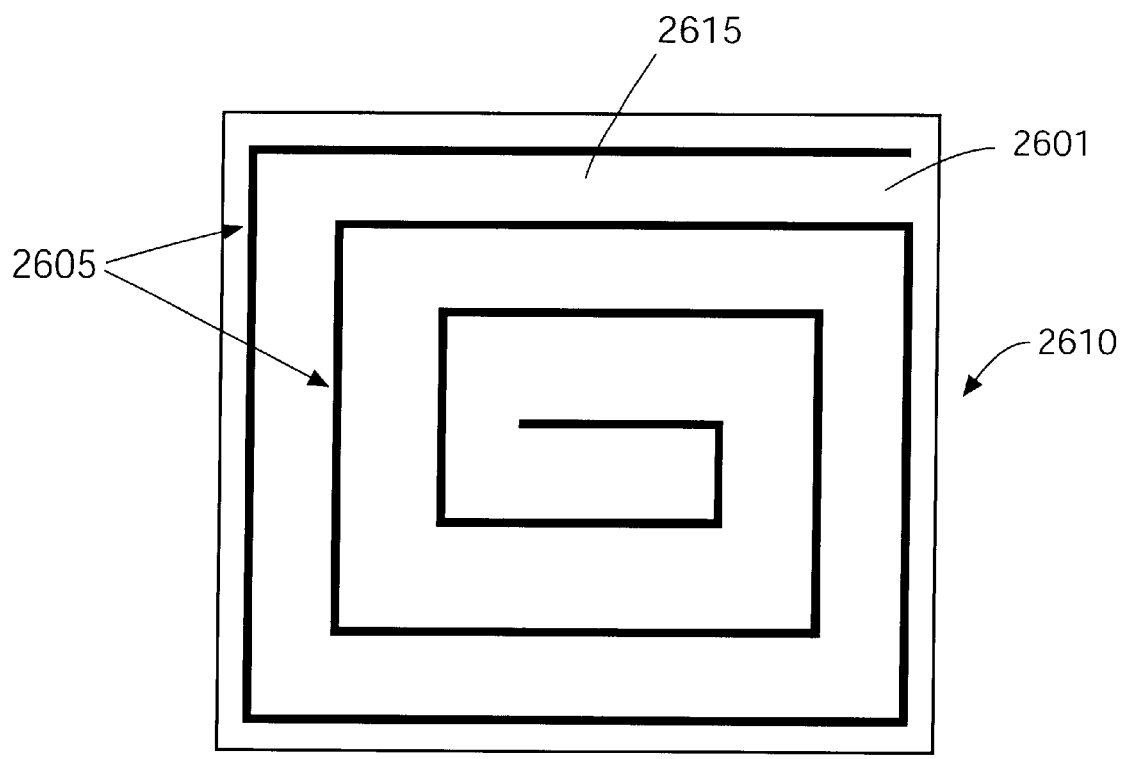
FIG. 26C is a schematic plan view of a spiral internal busbar according to an embodiment of the present invention.

FIG. 26C shows a device 2610 having a coiling internal busbar 2605 which is in contact with conductive layer 2615 at the entire perimeter of internal busbar 2605. Coiling internal busbar 2605 has higher conductivity than conductive layer 2615, which serves to lower the overall resistance of conductive layer 2615, thereby making more homogeneous the applied signal to conductive layer 2615. Coiling internal busbar 2605 can stand alone as shown. Coiling internal busbar 2605 also can be formed in close proximity at its outer coil to a perimeter busbar (not shown). Alternatively, the coiling internal busbar can be attached directly to a signal power by leaving a portion of the coiling internal busbar exposed and attaching a signal wire to the exposed portion.

Since the current at the perimeter has to flow only through gaps of a short distance through the transparent conductors to the internal busbars of FIGS. 26A, 26B, and 26C, the resistance drop will be negligibly small across such gaps. This use of the transparent conductor to connect an internal busbar to the primary busbar has not been discussed or disclosed in any prior art described above.

A passivation layer may be deposited using similar techniques described previously. If certain materials and methods are used to deposit the grid pattern such as silk-screening of metal frits, then post-treatment such as curing or hardening with time, heat, radiation (UV, visible, IR, microwave) may be required. The passivation layer is typically deposited after the above post-treatment. Similar types of post-treatment procedures may be required to harden the passivation layer.

The post-treatment for the grid pattern may also result in an in-situ formation of a passivation layer on the surface. The in-situ formed surface may consist of a phase separated inert material, an oxidize portion, a nitride portion, etc. This will also depend on the atmosphere and temperature conditions under which such post-treatment is carried out. This passivation layer may be sufficiently passivating to be incorporated in these devices. Treatment where a part of the exposed grid pattern becomes passivated could also be done when the grid patterns are deposited by physical and chemical vapor deposition. The surface of these may be passivated using oxidation, nitriding, heat, laser, plasma, or ion bombardment assisted treatments. The passivation layer may consist of organics, inorganics or hybrid materials. Adhesives such as, for example, non-conducting epoxy adhesives, urethanes, acrylates, or polyesters could be deposited for passivation. These may be the same materials that are used for making device seals. The materials may be cured by heat and/or radiation, such as UV, IR or microwave. The viscosity and the application procedure can be adjusted so that the desired thickness is obtained.

The materials can be applied by any convenient method such as, for example, being screened, dispensed, sprayed, or painted. Sol-gel methods could also be used to deposit oxides and polyceramics as passivation layers. Examples of such materials are alcoholic or non-alcoholic based solutions of metal alkoxides, nitrides, halides, or mixtures thereof, or solutions of reactive metallic precursors with organic complexing agents. Further, these oxides may be inert such as silica or could be conducting such as indium tin oxide and doped tin oxide. Preferably the passivating materials should be non-conductive, both ionically and electronically. Electronically conducting materials which may be used as passivating materials are those which are used in making transparent ECE's such as doped tin oxide and indium tin oxide. They should not also be attacked, swelled, or interact with the layers that come in contact with such as electrochromic layers, ion storage layers, electrolytes, etc. Examples of some commercial encapsulants/passivation layers that could be silk-screened include #A3840, #A3560, and #A3563, made by Engelhard. An example of a photoprintable passivation layer is Fodel DG211 from DuPont Electronic Materials.

Electrochromic devices use several transparent conduct or s that are not reactive while the other components such as electrochromic layers, counterelectrodes, and redox materials in the electrolyte necessarily participate in the electrochemical activity required for electrochromic operation. Thus, non-reactive materials are defined as those that lie outside the electrochemical potential range that is utilized for operating the EC device. Also materials that are insulators and/or do not transmit or get intercalated with ions under the above operating conditions and will not change their physical properties in the cell (such as dissolution in the liquid electrolyte if used) can also be considered as non-active. Materials such as many polymers such as epoxies, polyimides, acrylics, urethanes, and inorganics such as dense silica, alumina, several other oxides, silicates, and organo-silicates can be also considered non-reactive. For some devices, metals such as gold and platinum may also be considered non-reactive. Thus these metals may be used for busbars without additional passivation layers. There may even be thick layers of transparent conductors such as ITO, in a thickness that is conductive enough for the busbar, but not transmissive enough to be called TC (transparent conductor).

For designs where the internal busbars extend to the perimeter edge of the substrate, the passivation layer may extend to the edge of the substrate, or stop short of the edge so as to only be in the interior of the device. In the latter case, the internal busbars can be electrically contacted with the edge busbars (for example by using wires, tapes, conductive adhesives, solders, or wire clips). The novel edge busbars of the present invention may also be used in conjunction with the novel internal busbars of the present invention.

The conductivity of the substrate can also be enhanced through the use of a wire pattern embedded in a substrate (the substrate may be constructed from glass, plastic, or some other material). This wire pattern substitutes for the grid pattern described above. If the substrate is essentially electrically insulating, and if the conductive pattern is entirely embedded in the insulating substrate, then it is generally necessary to connect electrically the conductive pattern and the transparent conductor. This may be done, for example, by drilling holes though the substrate up to the metal grid and then filling the holes with a conductive material. FIGS. 27A, 27B, 28, and 29 illustrate this concept, including different methods of ensuring transparent conductor/plug contact.

Figure 27A:
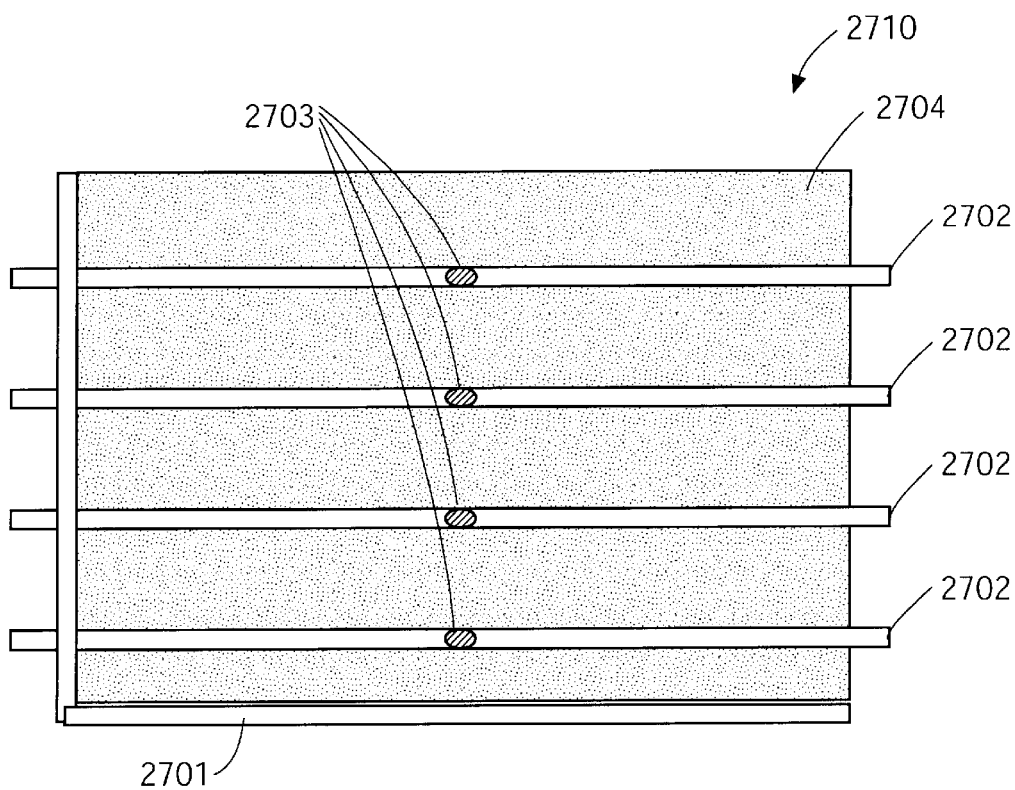
FIG. 27A is a schematic plan view of a group of internal busbars connected to the conductive layer by conductive posts according to an embodiment of the present invention.
Figure 27B:
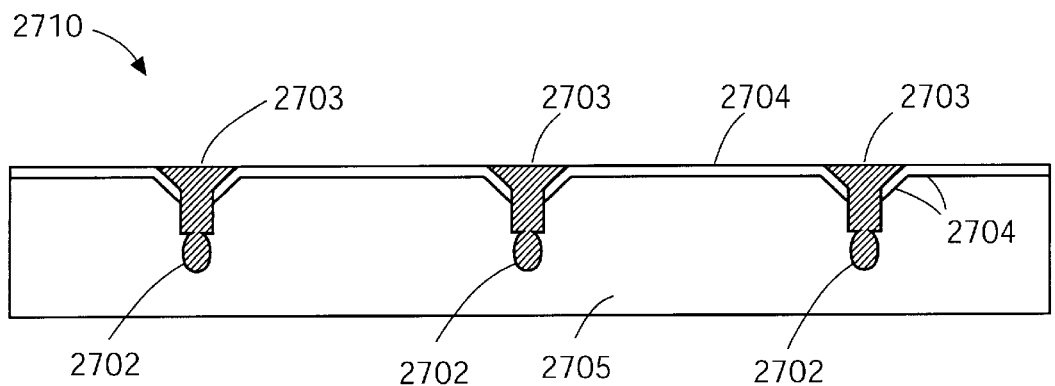
FIG. 27B is a schematic side sectional view of a group of internal busbars connected to the conductive layer by conductive posts according to an embodiment of the present invention.

FIGS. 27A and 27B show a device 2710 with a substrate 2705 covered with a transparent conductor layer 2704. Internal busbar conductors 2702 are embedded in substrate 2705. Conductive plugs 2703 lead from the. surface of device 2710 to electrically contact internal busbar conductors 2702. In this example, transparent conductor layer 2704 was applied after the holes for plugs 2703 were made but before plugs 2703 were formed.

Figure 28:
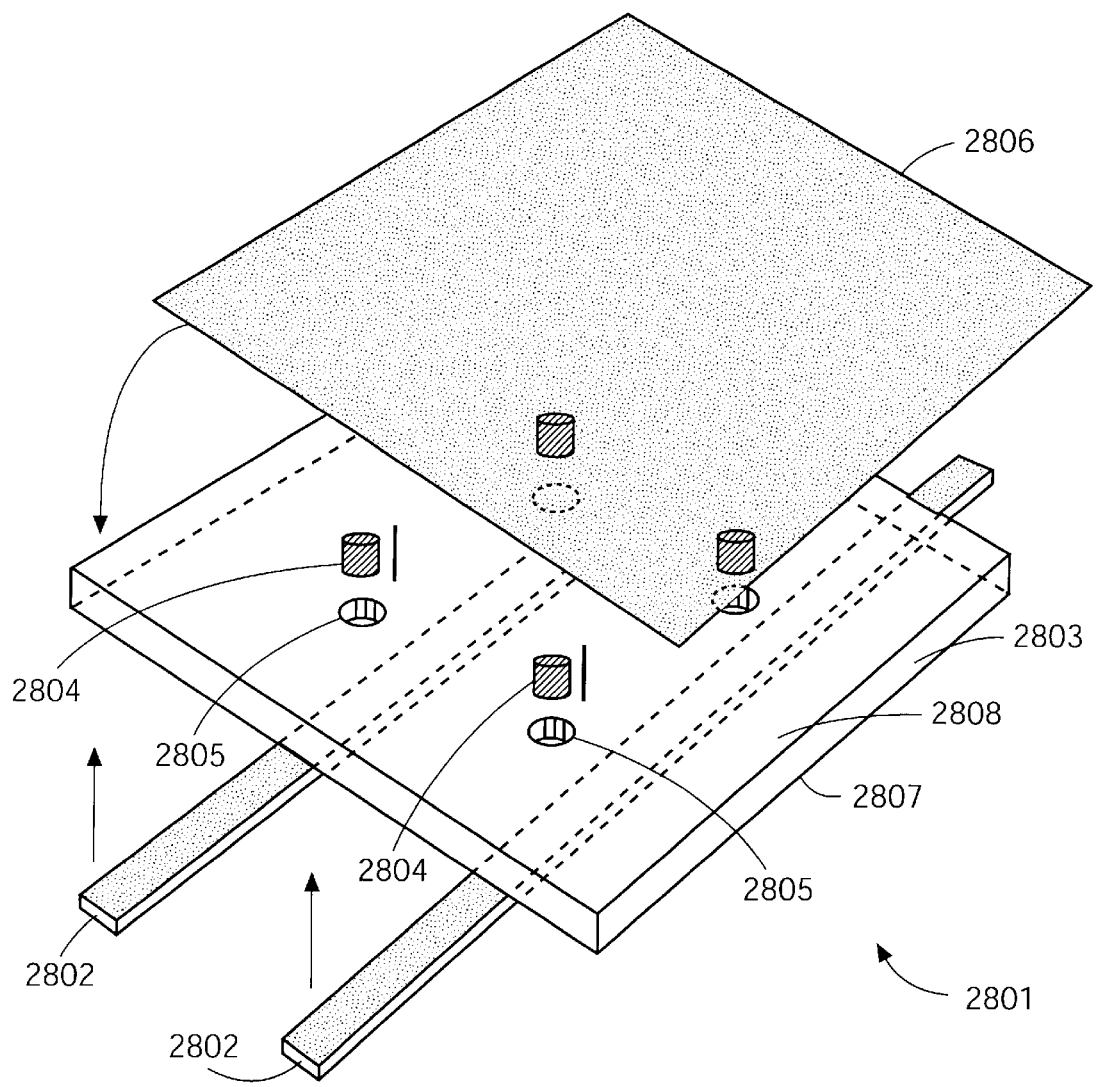
FIG. 28 is a schematic perspective exploded view of a group of internal busbars connected to the conductive layer by conductive posts according to an embodiment of the present invention.

FIG. 28 shows a device 2801 formed by attaching internal busbars 2802 to a surface 2807 of a substrate 2803. Holes 2805 are formed effective to extend from an opposite surface 2808 of substrate 2803 to internal busbars 2802. Conductive plugs 2804 are formed effective to extend from internal busbars 2802 to opposite surface 2808. Transparent conductive layer 2806 is then formed on opposite surface 2808, contacting conductive plugs 2804, thereby being in electrical contact with internal busbars 2802.

Figure 29:
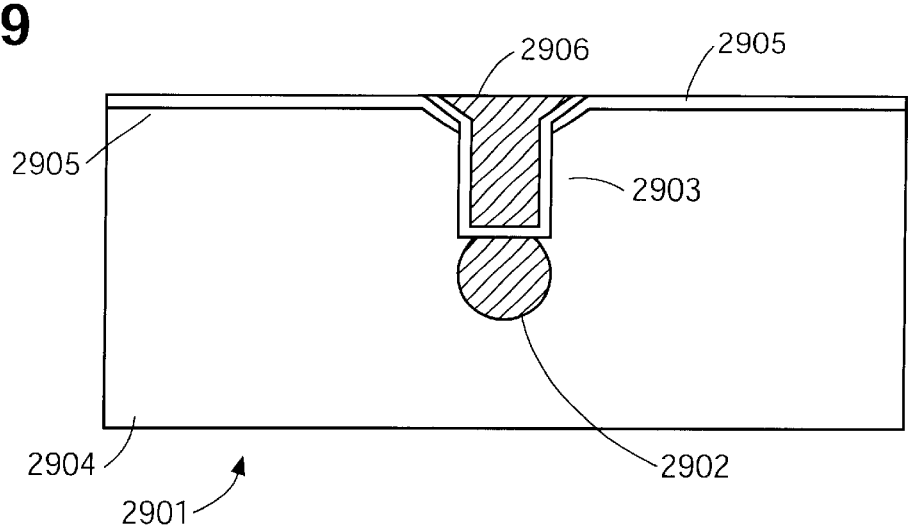
FIG. 29 is a schematic side sectional close up view of an internal busbar connected to the conductive layer by a conductive post according to an embodiment of the present invention.
Figure 30:
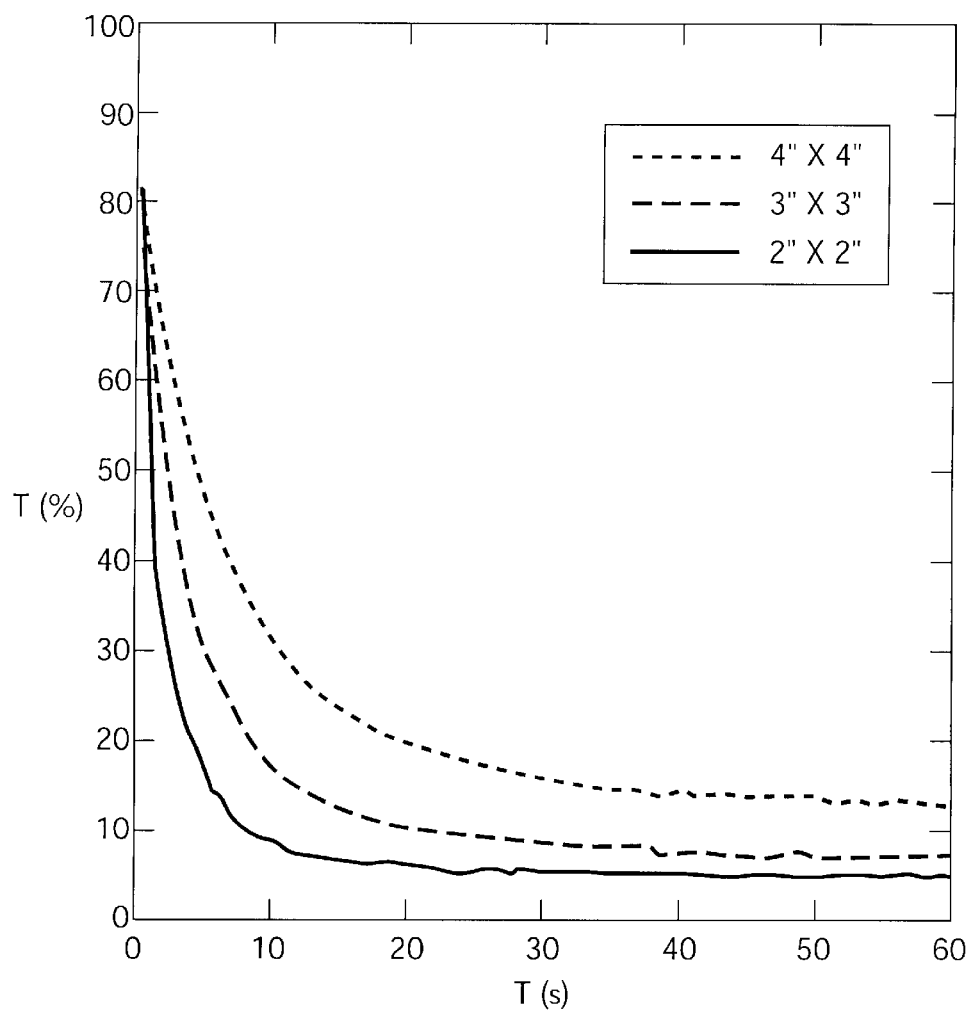
FIG. 30 is a graph of the transmissivity v. elapsed time for EC cells of different sizes without internal busbars or edge busbars.

FIG. 29 shows a device 2901 where direct addressing of the internal busbar conductor was not necessary. Device 2901 has an internal busbar conductor 2902 embedded in substrate 2904. A conductive layer 2903 provides electrical contact between transparent layer 2905 and internal busbar conductor 2902. Inert filler plug 2906 fills the hole. Transparent conductor 2905 is applied after the hole that provide access to internal busbar conductor 2902 is made. Then conductive layer 2903 is formed in the hole. Finally, inert filler plug 2906 is formed.

If the conductive pattern is not entirely embedded in the substrate (i.e., if it contacts the transparent conductor) or if the substrate is sufficiently conductive, a separate conductor is generally not necessary.

Internal busbars can also be used to make devices with those substrates on which only low conductivity transparent ECE's can be deposited. Typically, transparent ECE's such as indium tin oxide and doped tin oxide are deposited at high temperatures (in excess of 200° C.) to get good conductivity. Most of those materials, when deposited on plastics, at lower temperatures, are less conductive. Thus, the use of EB's as described above in conjunction with lower conductivity transparent ECE's would result in high conductivity substrates which will be attractive for electrochromic devices.

The Examples which follow are intended as an illustration of certain preferred embodiments of the invention, and no limitation of the invention is implied.

Example 3

Strips of silver frit paste (DuPont # 7713) were deposited by silk-screening onto a 3 inch×3 inch (7.5 cm×7.5 cm) TEC 15 substrate. The substrate was then heated under ambient atmosphere according to the following four step procedure;

Step 1: Temperature raised from 25° C. to 100° C. at 10° C./min and held at 100° C. for 15 minutes.

Step 2: Temperature raised from 100° C. to 325° C. at 10° C./min and held at 325° C. for 10 minutes.

Step 3: Temperature raised from 325° C. to 600° C. at 10° C./min and held at 600° C. for 10 minutes.

Step 4: Temperature lowered from 600° C. to 25° C. at 10° C./min.

After firing the width and depth of the silver lines were measured using surface profilometry and found to be 0.2" (5.1 mm) wide and 15 $\mu$m deep. The spacing between the lines was 1.0" (25.4 mm).

Examples 4, 5, 6, 7, and Comparative Example 3

The "TEC-Glass" products, commercially available from Libby-owens-Ford Co. (Toledo, Ohio), are manufactured by an on-line chemical vapor deposition process. This process pyrolytically deposits onto clear float glass a multi-layer thin film structure, which includes a microscopically thin coating of fluorine-doped tin oxide (having a fine grain uniform structure) with additional undercoating thin film layers disposed between the fluorine-doped tin oxide layer and the underlying glass substrate. This structure inhibits reflected color and increases light transmittance. The resulting "TEC-Glass" product is a non-iridescent glass structure having a haze within the range of from about 0.1% to about 5%; a sheet resistance within the range of from about 7 to about 1000 ohms per square or greater; a daylight transmission within the range of from about 77% to about 87%; a solar transmission within the range of from about 64% to about 80%; and an infrared reflectance at a wavelength of about 10 $\mu$m within the range of from about 30% to about 87%.

A TEC 15 substrate (3 inch×3 inch; 7.5 cm×7.5 cm) was silk-screened with silver paste as described in Example 1, where the length of the silver strip was incrementally varied in such a manner as to leave an equal distance between edges, at right angles to the strips, of the glass substrate as shown in FIG. 26B. The distances of the silver strip from the edge for Examples 4, 5, 6, and 7 are 0.0 mm, 1.0 mm, 3.0 mm, and 7.0 mm respectively. The resistance of the substrate was measured by soldering a metal strip 2 mm wide at both edges of the substrate which were at right angles to the internal silver strips to serve as a representative portion of a perimeter busbar. By applying a voltage across the soldered strips the resistance was measured for different increments of distance of the silver strip from the perimeter busbar. The results are listed in the following Table 3.

TABLE 3

| Example | Distance of Silver Strip From Edge (mm) | Resistance to Substrate (Ω) |
|---|---|---|
| 4 | 0.0 | 0.1 |
| 5 | 1.0 | 1.2 |
| 6 | 3.0 | 1.9 |
| 7 | 7.0 | 3.2 |

The Comparative Example 3C, a TEC 15 substrate with no internal silver busbars had a resistance of 15 Ω. By comparison, as shown in the table, Example 4, the substrate with internal silver strips extended fully to the perimeter busbars had a resistance of 0.1 Ω. Even in Example 7, with the silver busbars as far as 7 mm from the perimeter busbar, the resistance is decreased to 3.2 Ω from the Comparative Example's 15 Ω.

Example 8

Internal silver busbars were prepared as described in example 3, except that after the four step firing procedure the metal strips were over-coated with an epoxy based polymer for passivation and cured at 120° C. for one hour.

Comparative Example 4C

A 3"×3" (7.5 cm×7.5 cm) TEC 15 substrate coated with 380 nanometers of $WO_3$ according to the method set forth in U.S. Pat. Nos. 5,252,354, 5,457,218 and 5,277,986 and a counter electrode of TEC 15 of similar size was made into a cell using an epoxy seal containing 210 $\mu$m spacers. The two electrodes were positioned so that they were slightly off-center exposing a region at either end for application of a metallic busbar. Prior to assembly the counter electrode had two holes drilled in it for application of the electrolyte. The cell was filled with electrolyte containing 0.01M $LiClO_4$ and 0.05M ferrocene in a 60:40 volume % mixture of propylene carbonate and tetramethylene sulfone and the fill holes plugged with epoxy. The conductive surfaces which protruded from either side of the cell were ultrasonically soldered with lead-tin-cadmium-based solder. Wires were then attached to these contacts. The electrochromic performance of the device was determined by placing the cell in a spectrometer and following the color kinetics at 550 nm while applying a coloring potential of 1.3 volts followed by a bleaching potential of –0.3 volts. In the transmissive (bleached) state the cell had a transmission of 77% and in the fully colored state a transmission of 10% T. At a coloring potential of 1.3 volts the cell took 46 seconds to color from 70% T to 10% T and 47 seconds to bleach back to 70% T.

Examples 9, 10, 11 and Comparative Example 4C

Four electrochromic cells were prepared as described in comparative Example 4C where the composition of the electrodes were varied as follows;

Cell A, Comparative Example 4C, had conductive electrodes with no internal busbars.

Cell B, Example 9, had internal busbars on the working electrode ($WO_3$) only.

Cell C, Example 10, had internal busbars on the counter electrode only.

Cell D, Example 11, had internal busbars on the both electrodes.

In all cases, Examples 9, 10, and 11, the internal busbars were deposited as described in Example 8. The cells were colored at 1.3 volts for 90 seconds and bleached at –0.3 volts for 90 seconds. The color kinetic data for the cells is shown in the following Table 4:

TABLE 4

| Cell | Time to color from 70% T to 10% T Seconds | Time to bleach from 10% T to 70% T Seconds |
|---|---|---|
| Cell A | 89 | 89 |
| Cell B | 74 | 65 |
| Cell C | 89 | 89 |
| Cell D | 56 | 58 |

Comparative Example 5C

An electrochromic cell was prepared as described in Example 8 with conductive electrodes which contained internal busbars without a passivation layer. The cell was cycled at 70° C. at a color potential of 1.3 volts for 15 seconds, long enough to colorize, followed by being bleached for 45 seconds at –0.3 volts. After 5,000 such cycles the cell showed visible reaction of the silver strips within the cell. This resulted in a degradation in the cell's optical properties.

Example 12

An electrochromic cell was prepared as described in Example 8, containing internal silver busbars, on both electrodes, with a protective epoxy overcoat. At a coloring potential of 1.3 volts the cell colored from 70% T to 10% T in 8 seconds. The cell was cycled at 70° C. under a coloring potential of 1.3 volts for 15 seconds and a bleach potential of –0.3 volts for 45 seconds. After 5,000 cycles the cell showed no visible reaction of the internal busbars in the cell nor degradation of the cell's electrochromic performance.

Example 13

Silver strips were deposited onto TEC 15 as described in example 3, and overcoated with a layer of indium tin oxide (ITO). The ITO was deposited by electron beam (E-beam) evaporation and deposited directly on top of the TEC 15 and the silver strip lines through the use of a mask. The E-beam target was an indium tin oxide composite and the thickness of the ITO layer thus formed was 500 nm. Two of these TEC 15 substrates having the described electrodes were used to make an electrochromic cell as described in example 9. Under a coloring potential of 1.3 volts the transmission at 550 nm changed from 76% T to 8% T. It took 14 seconds to modulate from 70% T to 10% T at 1.3 volts, while it took 23 seconds to bleach back to 70% T at –0.3 volts.

Example 13B

Silver strips were deposited onto TEC 15 as described in example 3, and overcoated with a layer of Sol-Gel derived antimony doped tin oxide (ADT). The ADT precursor was prepared as described in U.S. Pat. Nos. 5,525,624 and 5,457,218. The electrodes were made into an electrochromic cell as described in example 9. At a coloring potential of 1.3 volts the cell colored from 70% T to 10% T in 19 seconds. At a potential of −0.3 volts it bleached back to 70% T in 20 seconds.

Example 14

Fodel materials and processes (from DuPont) and the like can be used to deposit busbars which are less than 100 $\mu$m in width. These lines are practically invisible to the eye, depending on the distance between the eye and the substrate on which the lines are deposited. For example, a normal eye subtends a small enough angle with lines of widths of 100 $\mu$m from a distance of 19 inches that the line is not discernible (about 0.01 degrees). Thus, any angle equal to or smaller than 0.01 degrees can be considered as invisible. Such busbar widths that form these angles, depending upon the distance of the substrate from the observer, can be utilized with little or no interference with vision. For example, 50 $\mu$m wide lines (6 $\mu$m thick) spaced at a distance of 0.75 cm are expected to give the same overall conductivity to the substrates as lines which are 100 $\mu$m wide (6 $\mu$m thick) and spaced 1.5 cm. Both of these widths and line spacings are expected to give photopic transmissions in excess of 70% when deposited on conductive glass (such as TEC glass from LOF) with a resistance of 8 or more ohms/square.

Although the above description is for chromogenic windows, these principles can also be utilized to develop non-chromogenic windows which can be defrosted by applying an electrical voltage at the edges but without any visible obstruction from conductors in the center of the window. These windows can be used in various applications where frost-free characteristics are desired. Examples of such application are in aircraft and automotive windows and mirrors. For an automotive windshield, these can be deposited on glass before lamination. After lamination, preferably these lines reside inside of the laminated area so that they are not scratched. They can also be used for other windows and mirrors which are not laminated, and to further enhance their scratch resistance they may be coated with hard transparent materials (for example, see U.S. patent application Ser. No. 09/099,035, filed Jun. 18, 1998, which is incorporated herein by reference). Since high temperatures (typically 500 to 800° C.) are required to fire these lines, this could be accomplished simultaneously while the glass is being bent and/or strengthened (or tempered) which may be necessary for these products. As described above, based on the angular calculations, widths of these lines can be wider for rear automotive windows as compared to the windshields, since the latter are closer to the observer. Further, the material in these widths can also be used to deposit antennas on glass (such as automotive windows) which are invisible, i.e., the window appears transparent although a patterned antenna is printed using these conductors and processes.

Example 15 and Comparative Example 6C

Two 6"×3" (15 cm×7.5 cm) sized electrochromic cells were prepared. TEC 15 was used as the transparent conductor in each cell. Example 15 had an internal busbar while Comparative Example 6C did not. The cell without the busbar, Comparative Example 6C, was assembled similarly to the assembly described in Comparative Example 4C. The spacing between the substrates, however, was 88 micrometers. The two electrodes were positioned with an offset so that about 0.25 inch (0.63 cm) of each electrode strip, at either of the 3" (7.5 cm) ends of the substrates, was exposed. To these exposed edges, a solder was applied by a heated ultrasonic soldering system (Sunbonder from Sanwa Components USA, San Diego, Calif.). The solder used was Cerasolzer 186 (obtained from Sanwa Components US), and had an average thickness of about 20 micrometers.

The second cell, Example 15, also had a gap 88 micrometers thick and was made with both internal busbars and edge busbars as taught in this invention. In Example 15, edge busbars and an internal silver frit busbar were applied to three contiguous edges, via an x-y dispensing technique, similar to that shown in FIG. 33A.

The frit layers were fired with the four-step procedure as in Example 3 and then passivated as in Example 8 using a black colored bisphenol A based epoxy adhesive. This frit/passivation pattern was applied to both the substrates. The width of the frit line was about 0.7 mm and thickness of the frit line was between 10 and 15 micrometers. The thickness of the passivation layer was about 30 to 40 micrometers with a width of about 1.5 mm so as to completely cover the frit to form an encapsulation around the frit. One of the substrates was then coated with tungsten oxide, assembled, and filled as described in the Comparative Example 4C. The frit pattern was identical on both the substrates except that the frit line pattern was lightly offset so that the frit lines on the two substrates were next to each other rather than opposed or on top of each other. This was done to ensure that any local bumps would not lead to any electrical shorting and that the cell gap is maintained at 88 micrometers.

Similar to that geometry shown in FIG. 33B, the internal busbar was formed by one of the frit lines, while the other three frits formed an edge busbar since they were outside the cell seal area. Further, the soldered busbar which was applied in addition to the frit busbar on the edge, reinforced the conductivity on that edge, while providing a means to attach a soldered electrical lead. The silver frit and the soldered busbar were touching each other in this Example.

Figure 34A:
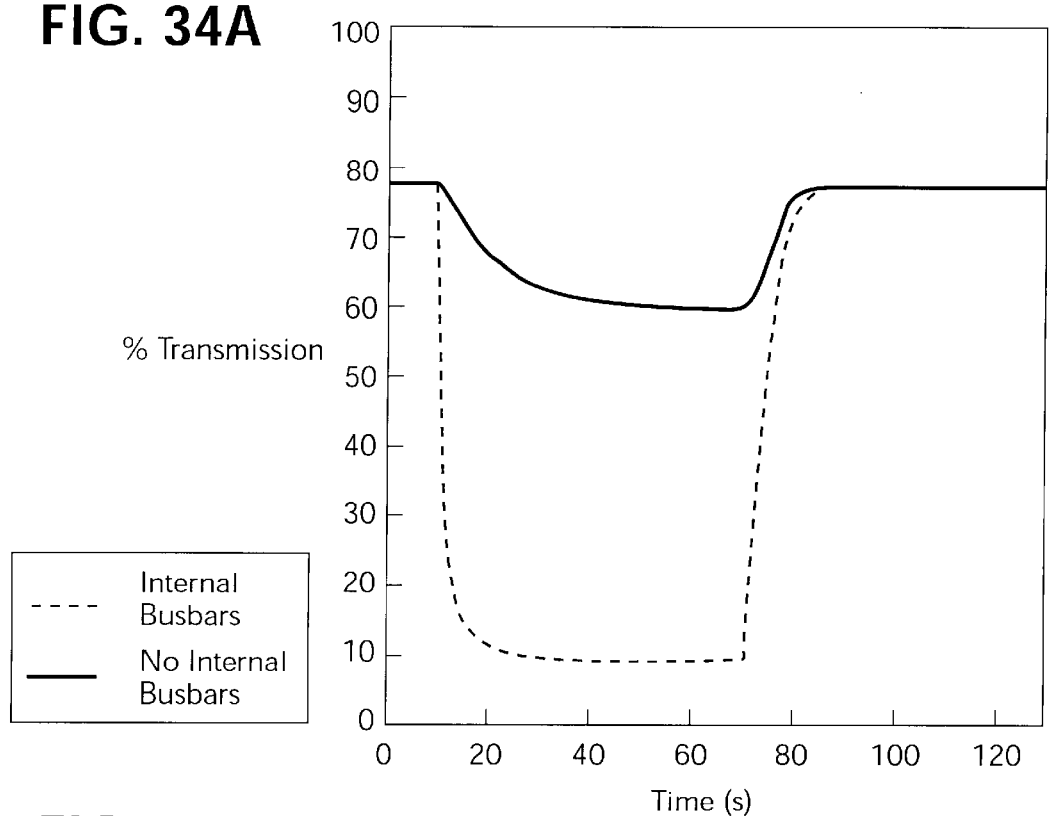
FIG. 34A is a graph of the coloration kinetics of a 6" by 3" (15 cm×7.5 cm) electrochromic window with internal busbars according to an embodiment of the present invention, and of a comparison electrochromic window without internal busbars.
Figure 34B:
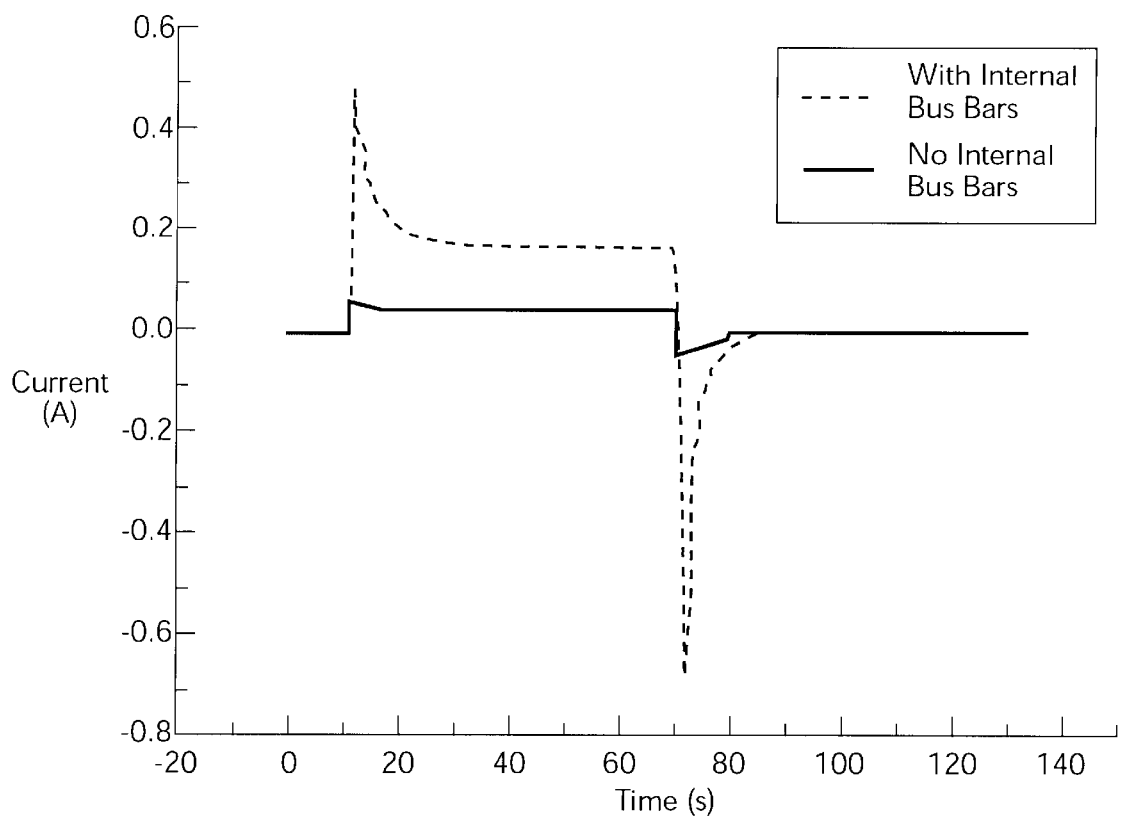
FIG. 34B is a graph of the current/time behavior of a 6" by 3" (15 cm×7.5 cm) electrochromic window with internal busbars according to an embodiment of the present invention, and of a comparison electrochromic window without internal busbars.

Example 15 and Comparative Example 6C were colored at 1.3 volts for 60 seconds and bleached at −0.3 volts for 60 seconds. The plots of transmission versus time are shown in FIG. 34A, and the concomitant current flow through the devices is shown in FIG. 34B. In FIG. 33B, DuPont Frit type 7713 was used to form the frit layers.

It can be seen that in Comparative Example 6C, the cell without the internal busbar, the coloring reaction is slow and the depth of color is small. By contrast, in the cell with the internal busbar, Example 15, the coloring and bleaching reactions are faster and the depth of coloration is much higher because the internal busbars are able to supply much higher levels of current when needed during coloration and bleaching. Thus, devices that demand high currents any time during coloration or bleaching will particularly benefit from this invention. Typically, EC devices requiring currents in excess of 0.1 mA during coloration or bleaching will benefit most.

Intermittent Potential Circuitry

As described previously, the coloring voltage only needs to be applied intermittently, depending on the length of the color state memory, after sufficient coloration has been achieved. For example, if the memory of the device was longer than the color duration required for the particular application to be colored, then the coloring potential effectively could be applied just once and then turned off (i.e., the device is left in non-powered open circuit mode). The potential can then be applied again when the device's light transmission needs to change, e.g., while bleaching or changing its transmission to a different desired level. However, under certain circumstances, it might be necessary to keep the device in a desired state of transmission for periods that are longer than their color state memory.

In the present invention, consider for example the case where a coloring potential is initially applied which is removed after the device attains the desired color, i.e., the device is kept in an open circuit. The device is thus allowed to gradually bleach with time, for a period $t_1$, as a result of its limited color state memory. Before the device completely bleaches, the coloration potential is reapplied for a duration of time $t_2$. This process can be continued indefinitely for as long as the device needs to be kept in the particular colored state before a different voltage is required to be applied to change the device's light transmission (e.g. bleach potential).

The period $t_1$, after which the coloration voltage is re-applied, depends in part on the extent of color change that is allowed before it might become obvious to the user that the device light transmission is changing. This allowable change in photopic transmission, all measured at 550 nm, for a window in a building or a car (e.g., a sunroof) is preferably in the range of from about (the difference ($T_{c1}\%-T_{c2}\%$) as in FIG. 35) 0.1% to about 20%, more preferably from about 1% to about 15%, and most preferably from about 5% to about 10% from the desired colored state. The above transmission criteria can also be used where the devices only color in the near infrared region, about 0.7 $\mu$m to about 2.5 $\mu$m. The change in light transmission can be solar transmission instead of photopic transmission. Furthermore, the light transmission wavelength can be selected in any conveniently selected range.

Figure 35:
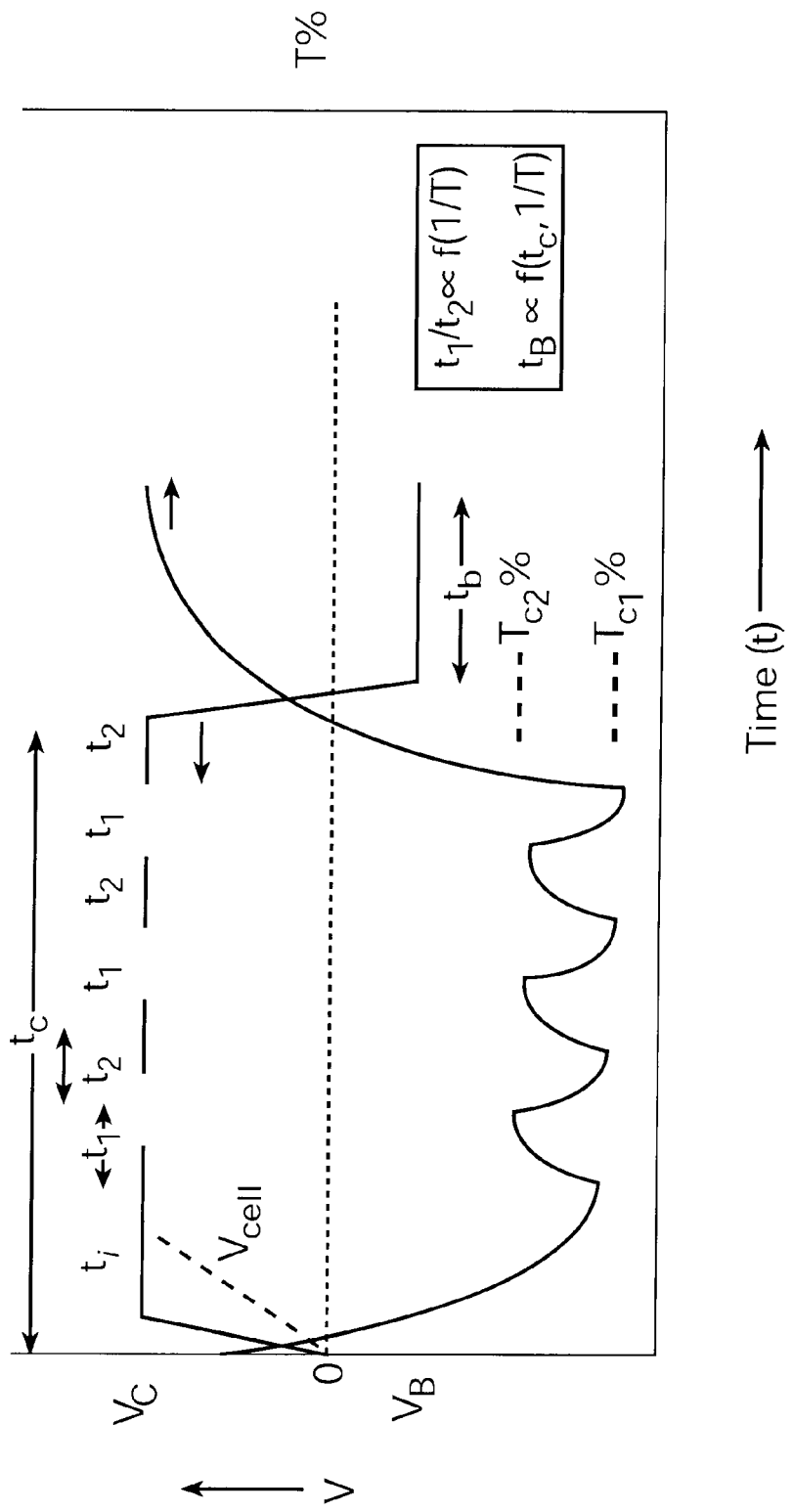
FIG. 35 is a graph of light transmission (T) and applied voltage (V) as a function of time (t) according to an embodiment of the present invention.

The process of this invention is explained referring to FIG. 35, where transmission vs. time and applied voltage vs. time is plotted for a typical EC device controlled by the present invention. A voltage $V_C$ is first applied to colored the window (as shown by the transmission T % falling, indicating that the light transmission is low). The voltage is then removed, as shown by a break in the voltage line, for a period of $t_1$. During this time $t_1$, the cell starts to bleach, as shown by the transmission T % rising. The time $t_1$ is related to the length of the color state memory for a particular EC device. To keep a window colored (after initial coloration), the coloring potential is reapplied for a period of $t_2$ followed by the removal of power (holding period) for a period of $t_1$. This alternating sequence is continued indefinitely, for as long as it is desired to keep the device in that desired state of transmission. The desired state is a range of transmission defined by $T_{c1}\%$ and $T_{c2}\%$. In this case, the total time $t_c$ is the overall time of coloration.

FIG. 35 also shows that the initial coloring voltage can be applied as an increasing linear ramp to a maximum potential $V_C$. Alternatively, a step potential $V_C$ can be applied. Another way to apply the potential is by imposing a maximum current limitation. Either of these two modes, or a non-linear ramp, could be conveniently used. With increasing device area, it may be preferred to ramp the coloring and bleach potential so that the current densities at the edges can be lower. This also promotes a spatial uniformity in color change during coloration and bleaching. This is particularly noticeable as the device area increases. Also during the interval $t_2$, the coloration potential ($V_C$) could be applied as a step potential (as shown), or it may be ramped from the open circuit potential of the device to $V_C$. It must be noted that $V_C$ or $V_b$ referes to the potential which the power supply attempts to apply to the EC cell and is also the limiting potential on the EC cell. Hence the EC cell has charateristics of an (RC) circuit, the potential of the cell ($V_{cell}$) only changes slowly as shown by the dashed line in FIG. 35.

One of the more important variables that affects $t_1$ and $t_2$ is the device temperature. As an example, depending on the EC device and the components used, $t_1$ at $-20°$ C. could range from a few hours to several days or even months, while $t_1$ at 70° C. could change to range from about 1 to about 15 minutes. Similarly, $t_2$ at $-20°$ C. could range from about 1 to about 60 minutes, while changing to range at 70° C. from a fraction of a minute to about 10 minutes. Further, the change in these times might not be linear with temperature.

It is understood that for certain situations, $t_1$ and $t_2$ can be fixed as in the prior art; but in this invention these time intervals can be allowed to change as discussed above, unlike the prior art.

FIG. 35 also shows that even the bleach time ($t_B$) could depend on the device temperature or/and on the total time the device was kept in the colored state ($t_C$) prior to initiating the bleach.

Typically both $t_1$ and $t_2$ decrease with increasing temperature. Thus, incorporation of a temperature sensor which provides a feedback into the control circuit could be used for this purpose. The temperature sensor may be any convenient sensor such as, for example, a thermistor, a RTD thermocouple, a transistor, or a diode, the output from which can be used to determine $t_1$ and $t_2$.

Figure 36A:
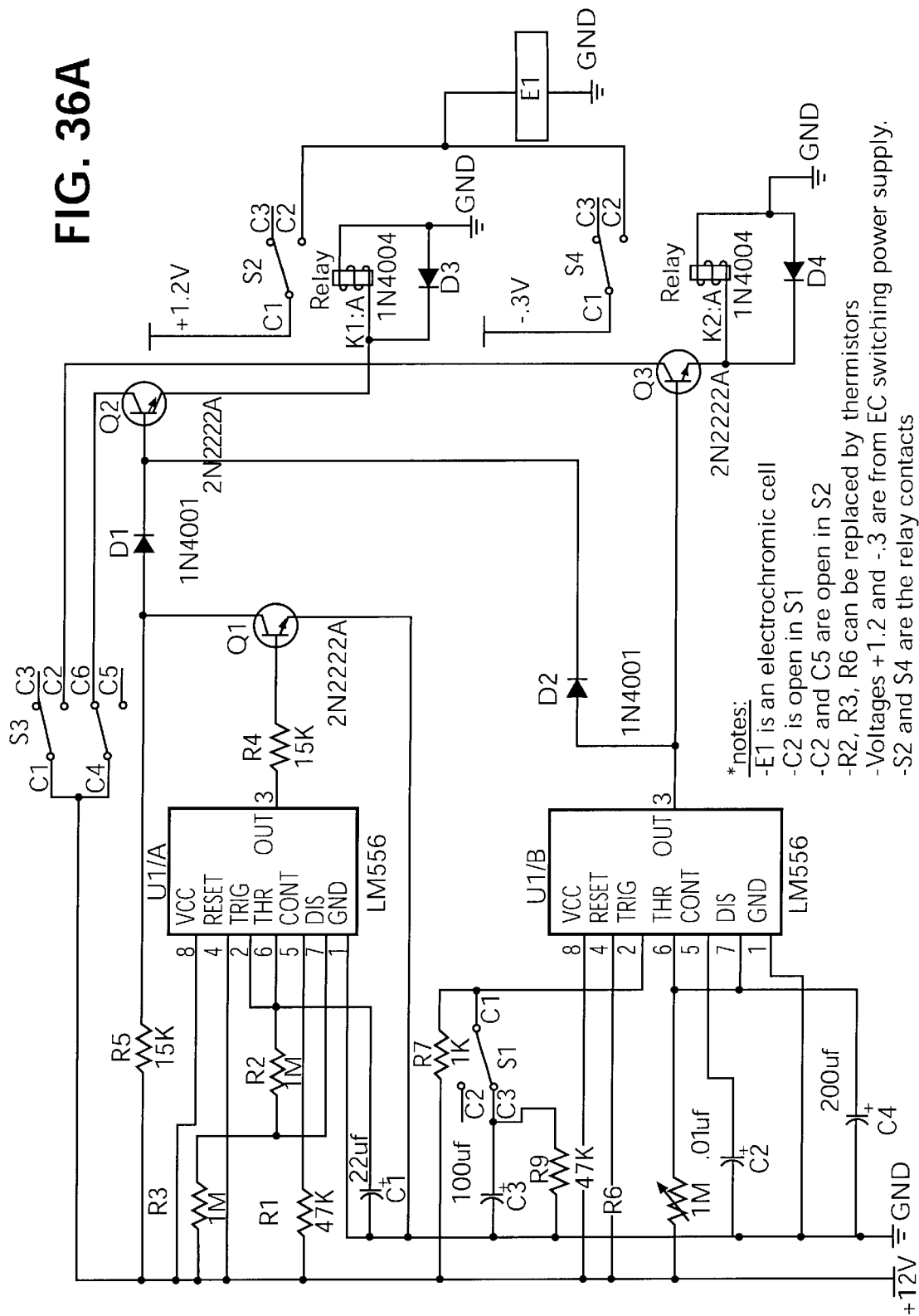
FIG. 36A is a circuit diagram of an embodiment of the present invention that includes a thermistor.

For example, referring to FIG. 36A, in the case where a timer is used to provide the $t_1$ and $t_2$ circuit functions, the thermistor would preferably be a negative thermal coefficient (NTC) thermistor. When the temperature increases, the resistance of the NTC thermistor would decrease and the resulting RC product (R is resistance, and C is capacitance) connected to the LM 556 (National Semiconductor, Santa Barbra, Calif.) timer would also decrease leading to smaller $t_1$ and $t_2$. The drop in resistance in the NTC thermistor with temperature would be correlated with the transmission changes during $t_1$ and $t_2$ periods of the EC device.

Preferably, the temperature coefficient of the thermistor and the capacitor in the circuit should be chosen so that the change in RC would naturally mimic the desired change trends needed for $t_1$ and $t_2$. One may even employ two thermistors in conjunction with two capacitors respectively, where the parameters of one set of resistors/capacitors are tailored to correspond with the changes in $t_1$ and the other set of resistors/capacitors corresponds with the changes in $t_2$.

In a variable coloration device, $t_1$ and $t_2$ will depend on the depth of coloration. For example, in the open circuit mode the transmission change for a deeper colored state may be faster (thus requiring a shorter $t_1$) than for a shallower colored state. Similarly, it may take more time to achieve a darker state (thus requiring a longer $t_2$) Since the depth of coloration is typically related to the potential used for coloration, one could define and store in the control circuit a profile of $t_1$ and $t_2$ values that are calibrated with the applied coloration voltage.

As the device ages, $t_1$ and $t_2$ may also shift. Account could be kept of the number of cycles, time spent in a particular state of transmission or any other convenient method which keeps a track of the age and usage of the cell. An aging profile with varying $t_1$ and $t_2$ could be used to drive the cell and if needed, the potential can also be varied and controlled to keep the initial level of coloration. Such control can be by any convenient method such as, for example, the use of monitoring sensors and feedback processes.

In another aspect of this invention, no prescribed periods are used but rather the actual level of coloration is sensed through the EC cell. In this case where one or more photosensors are used, the degree of color change can be detected by the photosensor and once the coloration has changed to a predetermined level, the necessary voltage can be applied to recolor the EC cell back to its original depth. Use of the photosensor can also eliminate any need to pre-program values of or factors to calculate $t_1$ and $t_2$ with aging, temperature or coloration voltage.

Photosensors, e.g., CdS photoconductors on Si photodiodes, can be used to provide feedback signals for controlling $t_1$ and $t_2$ instead of presetting fixed values for $t_1$ and $t_2$. In this case, the photosensor(s) would monitor the transmission of the EC cell and actively signal the circuitry as to the appropriate times to remove and to apply the voltage. As coloration rates and bleach rates change with temperature, aging, and other factors, $t_1$ and $t_2$ are adjusted accordingly. Preferably a pair of photosensors are used. One photosensor is placed on top of the cell to obtain the baseline for incoming light while another is placed underneath the cell to collect the transmitted light. The electrical signals from these two photosensors are then connected to a differential amplifier, the output of which is proportional to the relative transmission through the cell. Depending on the sensed output, the cell will be subjected to open circuit (holding period $t_1$) or voltage application (period $t_2$).

Further, as the cell ages thereby affecting its coloring and bleaching kinetics, the depth of coloration can still be maintained since $t_1$ and $t_2$ will change due to the feedback provided by the photosensors. For example if the coloration rate of the cell slows down, both $t_1$ and $t_2$ will increase to maintain a pre-determined differential output from the photosensors for identical illumination conditions. Also, if $t_1$ and $t_2$ become longer than pre-determined "acceptable periods", then the circuit may be configured to increase the coloration potential (subject to a maximum safe-potential for the devices) to increase the coloration speed.

Another method monitors the current (I) or the rate of change in current injected with time (t), i.e. dI/dt. Once dI/dt reaches a prescribed low value, the coloring potential is removed.

The transmission change during the holding period ($t_1$) can also be correlated to the open circuit potential change between the two cell electrodes. During the holding period ($t_1$), the potential between the two opposing electrodes of the EC cell ($V_{cell}$) will also decrease. Once a predetermined change in this voltage ($\Delta V$) is reached, a coloring voltage can be then applied to recolor the EC device. The time period $t_2$ can be determined by checking the current being injected into the cell. For example, as shown in FIG. 34B, for a constant voltage the rate of change of the current decreases with time and reaches a limiting value. Thus, when the change in the current with time becomes smaller than a predetermined level, the coloring voltage can be removed.

Alternatively instead of monitoring dI/dt, just the current (I) could be measured. Once the absolute value of the current is below a predetermined limit the coloring voltage is removed. As described earlier, this method also self compensates for any changes in cell kinetics, caused by aging, by increasing time periods $t_1$ and $t_2$ during the coloration period. When these time periods become longer than pre-determined "acceptable periods", the circuit if desired may be configured to increase the coloration potential (subject to a maximum safe potential for the devices) in order to increase the coloration speed.

Figure 45:
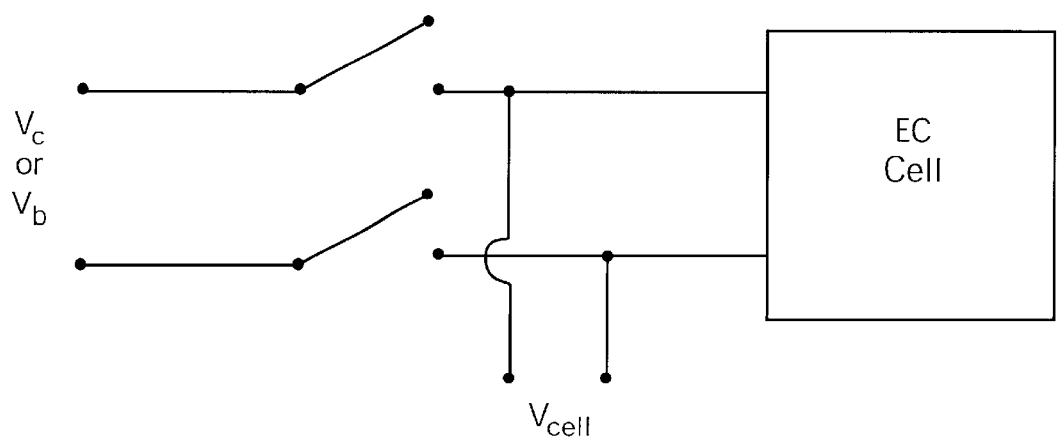
FIG. 45 illustrates an electric circuit attached to an EC cell having switches that may be used to determine $t_1$ or $t_1$ by measuring the voltage at the EC cell $V_{cell}$ and comparing the value with $V_C$ or $V_B$.

Alternatively, the charge injected during coloration can be monitored by a charge integration circuit. Once a predetermined charge has been injected, the coloration voltage can be removed. For many EC devices, the charge passed into the device for a desired level of coloration may depend on temperature. One method to take into account where this charge will increase with temperature is to have a comparator with a thermistor-containing reference. All of the control parameters which determine $t_1$ and $t_2$ such as $T_{c1}\%$, $(T_{c1}\%-T_{c2}\%)$, $\Delta V$, I, and dI/dt may be fixed and/or varied with temperature and/or aging of the device. One may also determined ti or $t_1$ by measuring the voltage at the EC cell $V_{cell}$ and comparing this with the $V_C$ or $V_B$. During coloration $V_{cell}$ asymptotically approaches $V_C$. When $V_{cell}$ is within 5% (preferable 1%) of $V_C$, the coloring potential $V_C$ is removed to let the cell rest in open circuit conditions. Alternatively, $V_C$ could be continued to be applied for an additional fixed time after the above condition is met to allow the cell to reach equilibrium. The total coloration time ($t_1$ or $t_2$) are obtained by adding the time for coloration during which $V_{cell}$ approaches $V_C$ and the fixed duration described above. During the open circuit mode (e.g., in coloration) the potential of the cell ($V_{cell}$) is measured and when it drops to about 3 to 30% of $V_C$ (preferably 10 to 15% of $V_C$) the coloring voltage $V_C$ is re-applied. Schematically an electric circuit showing $V_{cell}$ and $V_C$ (or $V_B$) is shown in FIG. 45.

In addition to varying $t_1$ and $t_2$ with temperature, the coloring and bleaching voltages may also be varied with temperature if desired. For example, depending on the devices, higher voltages may be used at lower temperature or vice-versa. Additionally, with temperature feedback to the control circuitries, both the duration (i.e., $t_1$ and $t_2$) and the voltage can be varied simultaneously to further mitigate electrical or electrochemical stress on the EC cell.

The voltage can be made temperature dependent by having a thermistor-containing voltage reference in the power supply. This thermistor can be a NTC (negative thermal coefficient) or a PTC (positive thermal coefficient) type. As the temperature rises the resistance will be lower in NTC thermistors. Consequently, when incorporated with suitably-biased series resistors and an operational amplifier (op amp), the reference voltage to the error-sensing op amp will be lower as temperature increases, resulting in a lower voltage applied to the EC cell at higher temperatures.

Figure 39:
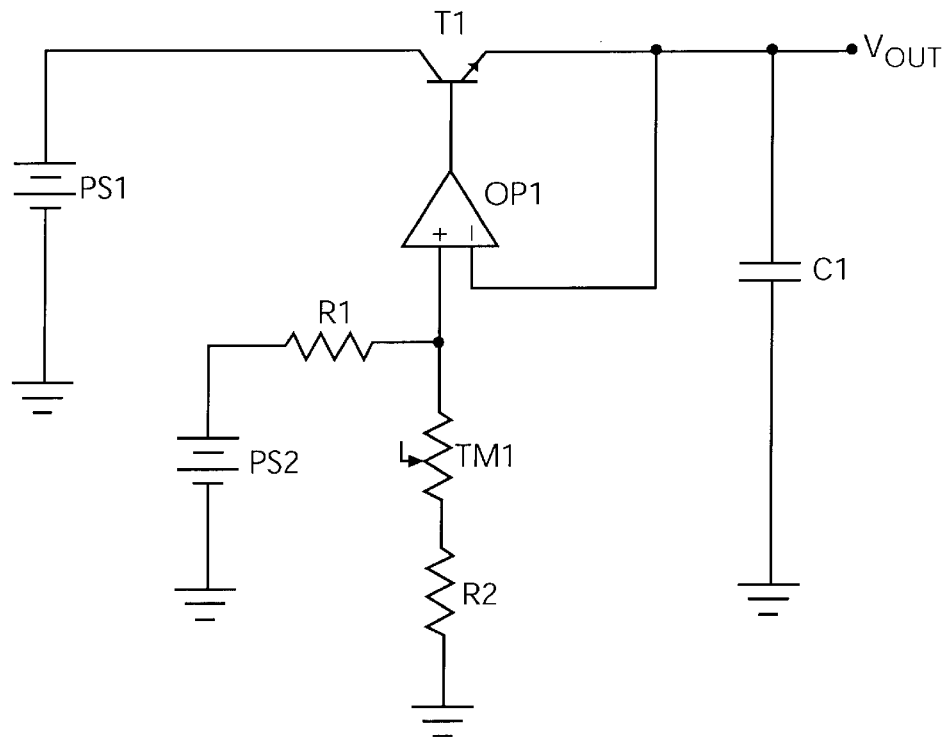
FIG. 39 is a circuit diagram illustrating the incorporation of an op amp and thermistor in a circuit for regulating the voltage supplied to an EC cell.

An example of a circuit incorporating an NTC thermistor TM1 and an op amp OP1 is shown in FIG. 39. As the temperature increases, the resistance of the TM1 will be lower, resulting in a reference voltage from PS2 to OP1 to be lower. Thus, output voltage $V_{out}$ will be lower. Accordingly, a properly designed resistor stack with a combination of series and/or parallel resistors incorporating such thermistors would cause the voltage needed ($V_{out}$) to track with operating temperature. In a particular example, the values of each component were: PS1 was 12 VDC, R1 and R2 were 10 KΩ each, C1 was 10 μF, PS2 was 2.5 VDC, OP1 was a LM324 op amp available from National Semiconductor, Santa Clara, Calif., TM1 was an NTC Thermistor having a resistance of 1.76 kΩ at 50° C., and the output voltage was 1.35V.

Figure 40:
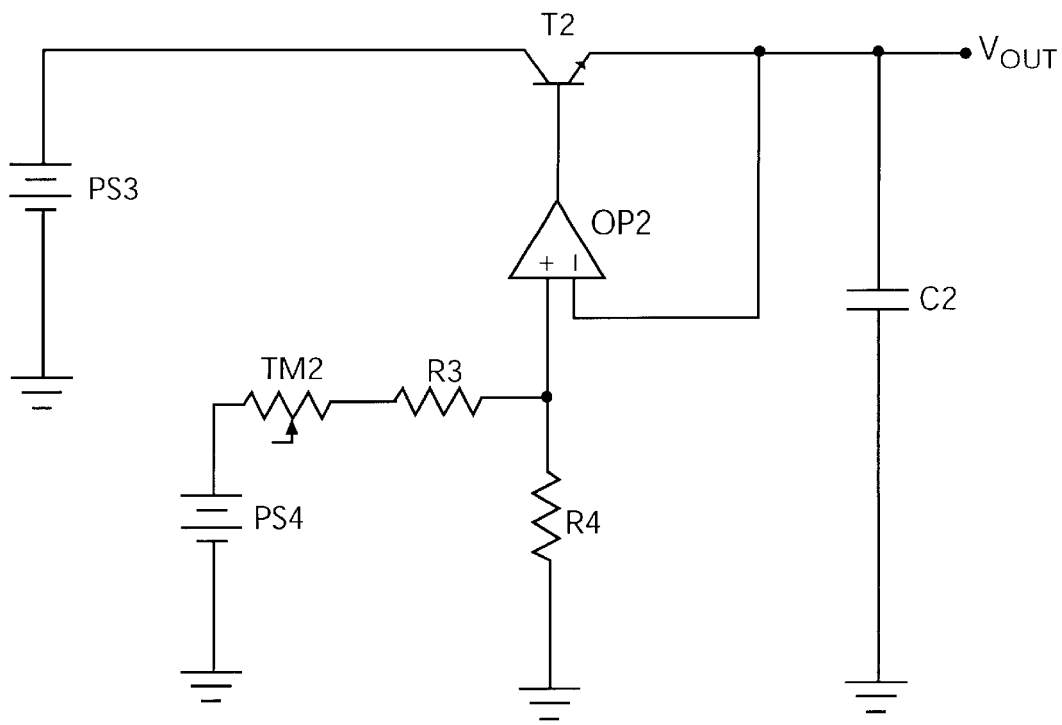
FIG. 40 is a circuit diagram illustrating the use of a thermistor in a circuit to vary the output voltage with temperature.

A PTC thermistor TM2 can also be used in a circuit to change the output voltage with temperature, an example of which is shown in FIG. 40. In a particular example, the values of each component were similar to that example above, PS3 was 12 VDC, R3 and R4 were 10 KΩ each, C2 was 10 μF, PS4 was 2.5 VDC, OP2 was a LM324 op amp, TM1 was an PTC Thermistor having a resistance of 1.76 KΩ at 50° C., and the output voltage was 1.15 volts.

Figure 41:
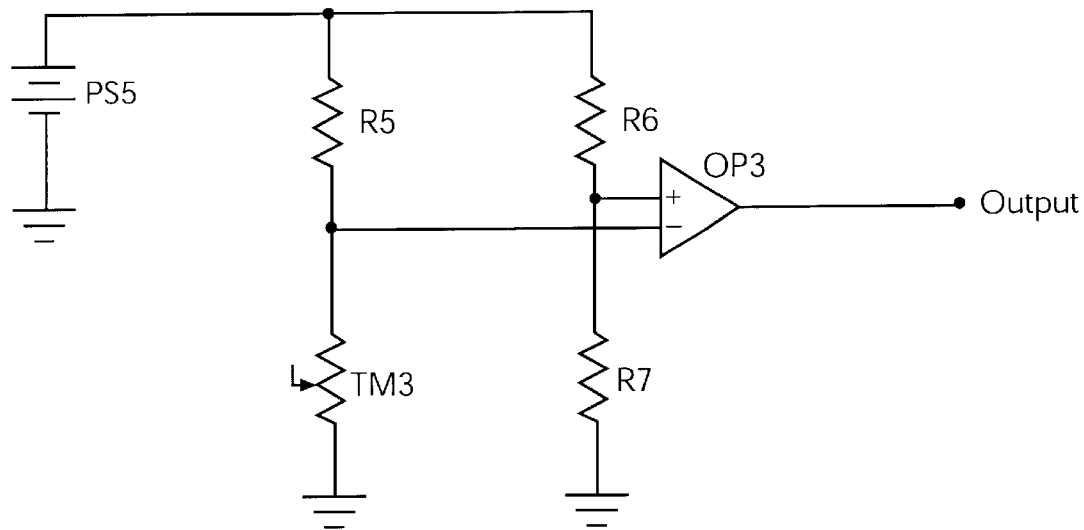
FIG. 41 is a circuit diagram illustrating the use of a thermistor in a comparator circuit.

Additionally, the thermistor can also be used in a comparator circuit to trigger the microprocessor to use different $t_1$, and $t_2$ periods, for example, as shown in FIG. 41. In the example, the thermistor TM3 used was a NTC Digikey part # PNT 117-ND available from Panasonic, Cupertino, Calif., with a resistance of 1.76 KΩ at 50° C. The potentiometer resistor R5 in series with the thermistor was adjusted to match the thermistor's set value, i.e. 1.76 KΩ. PS5 was 12 VDC, R6 and R7 were each 15 KΩ, and the op amp was an LM324 op amp available from National Semiconductor. As a result, the voltage drop across R6 and R7 (Vcc) is 5.0V. The positive input of the op amp is fixed at 2.5V by the two 15 KΩ series resistors R6 and R7. At temperatures lower than 50° C., the TM3 resistance is higher than 1.76 KΩ resulting in a voltage of higher than ½ of Vcc (that is, 2.5V) to the negative input of the LM324 op amp. Since the negative input is higher than the positive input there is no output from the op amp at such lower temperatures. When the temperature climbs to 50° C. and above, the resistance in the thermistor drops below 1.76 KΩ, thereby lowering the voltage below 2.5V and resulting in a positive output signal from the op amp that can be routed to a microprocessor input port. The microprocessor can then change the $t_1$, and $t_2$ periods in response to the positive output signal.

Figure 42:
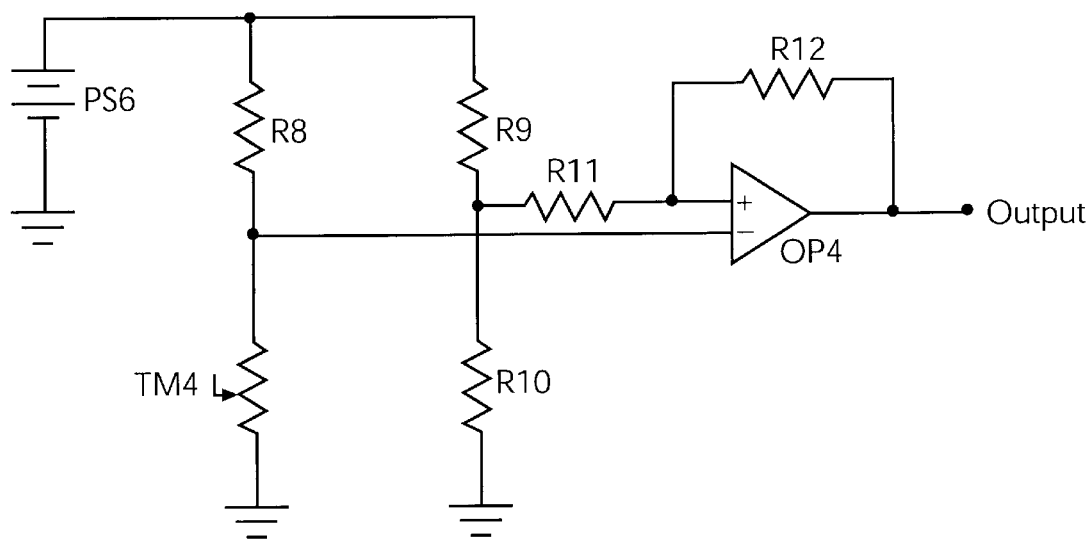
FIG. 42 is a circuit diagram illustrating the use of a thermistor in a comparator circuit.

Based on this circuit, the output of the op amp will be turned on at the threshold temperature; however near the region of this threshold there may be thermal fluctuations which may cause the output to erratically turn on and off. In order to eliminate such erratic behavior, a positive hysteresis can be added to the op amp comparator using positive feedback. As shown in FIG. 42, a feedback loop can be formed by resistor R12, resulting in a Schmitt trigger. In the example, the values of the components were those of the corresponding components in FIG. 41, with the added resistors R11 being 10 KΩ and R12 being 1 KΩ.

With such a Schmitt trigger in the circuit, the low trigger threshold is different from the high trigger threshold (the difference being the hysteresis intentionally induced in the comparator, rather than a single threshold value as in a conventional comparator). Such Schmitt triggers can also be used in photosensors to detect daylight—it is well known that around the region of daylight threshold, e.g., during dusk and dawn, photocells can behave erratically. Having positive hysteresis in the op amp comparator will aid in obtaining a smooth output. Furthermore, Schmitt triggers can be used in EC skylight circuits where both photosensors and temperature sensors are employed.

Figure 43:
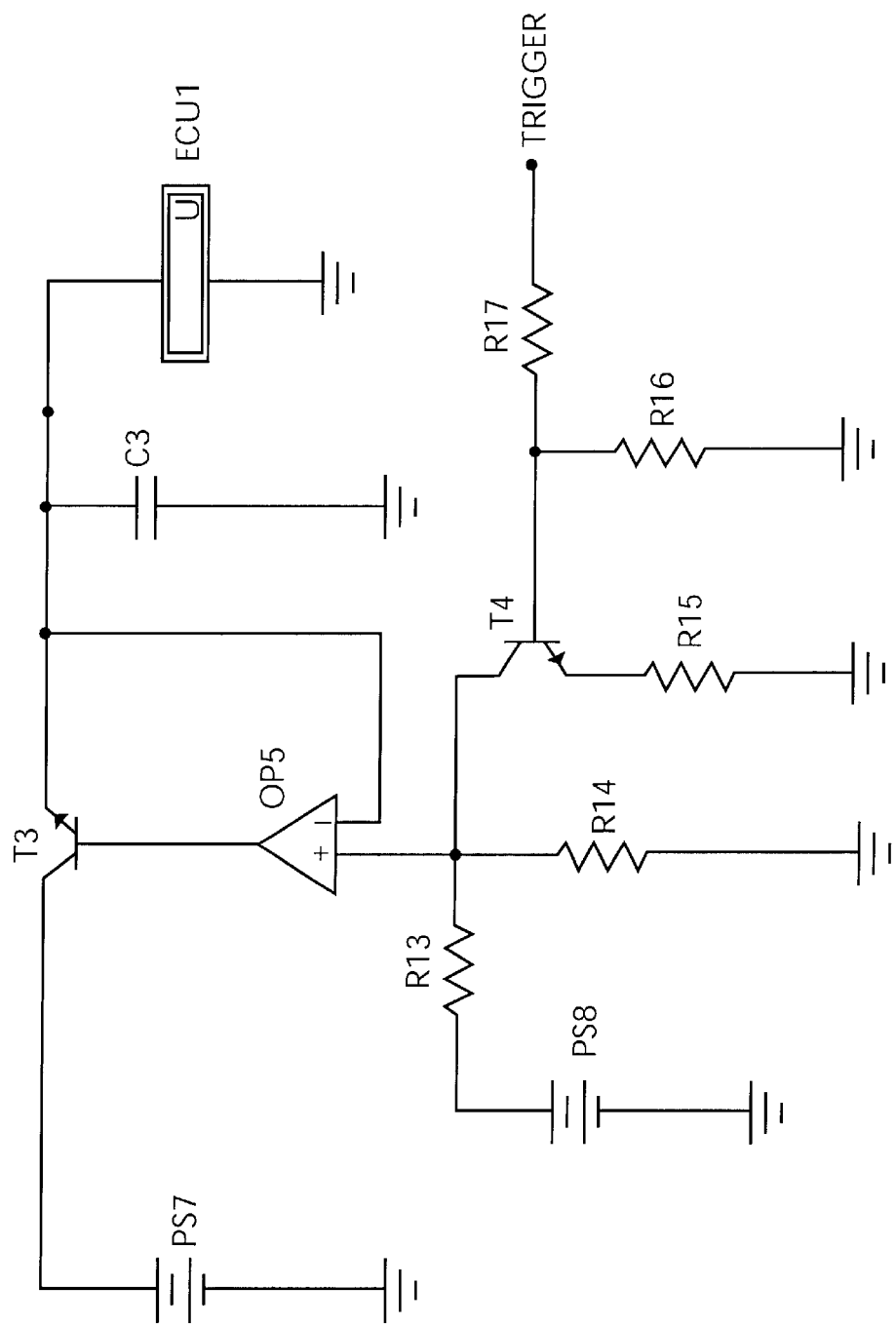
FIG. 43 is a circuit diagram illustrating the use of an adjustable voltage power supply with an EC device.

FIG. 43 shows an example of an implementation of an adjustable voltage power supply where the output voltage supplied to the electrochromic panel ECU1 can be tuned to give two different output voltages depending on the transistor switch T4 which will be activated when there is a predefined temperature change. In a particular example, PS7 was 12 VDC, PS8 was 2.5 VDC, R14 and R13 were each 10 KΩ, R15 and R16 were each 1 KΩ, R17 was 4 KΩ, and C3 was 10 μF. The transistors T3 and T4, and the op amp were those described above. The trigger to the base of T4 can come from either a microprocessor port as shown in FIG. 43, or the comparator output from a circuit as shown in FIG. 41 or 42. Upon turning on of transistor T4, the resistor R15 will be in parallel with the reference resistor R14 resulting in a lower overall resistance and hence lower reference voltage to the error-sensing op amp. The output voltage will also be lower. Alternatively, such output voltage can change to vary the EC color voltage below full coloration, e.g., during half color.

Figure 44:
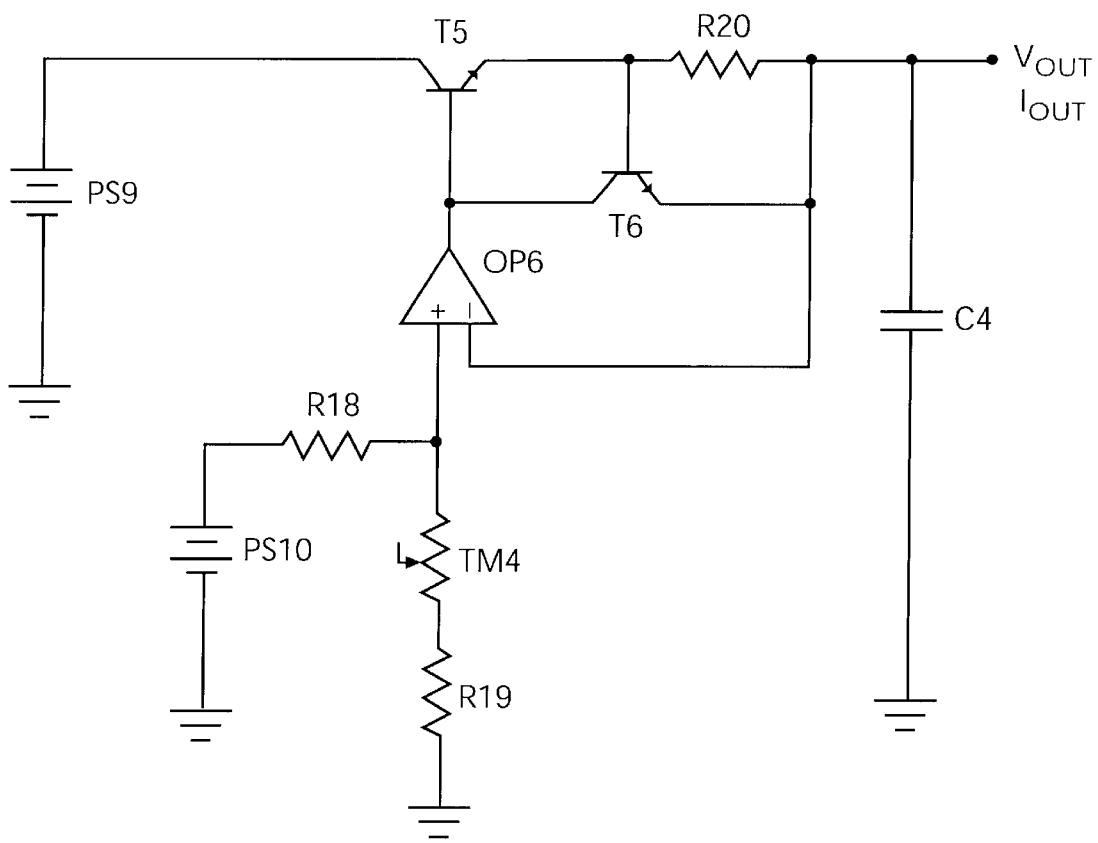
FIG. 44 is a circuit diagram illustrating the use of a sensing resistor in series with the power output to limit the maximum current flowing in the circuit.

The EC power supply can also incorporate current limitation, e.g., using simple transistor switching or current holdback techniques. The addition of a sensing resistor in series with the power output, together with another transistor as shown in FIG. 44, can limit the maximum current flowing in the circuit by the judicious choice of the sensing resistor R20 value. This sensing resistor can be fixed for constant maximum current or made variable for variable current limiting in the circuit. In a particular example, PS9 was 12 VDC, PS10 was 2.5 VDC, R18 and R19 were 10 KΩ, TM4 was an NTC thermistor having a resistance of 1.76 KΩ at 50° C., Op Amp OP6 was an LM324, T5 and T6 were 2N3904 transistors described above, and C4 was 10 μF. With sensing resistor R20 having a resistance of 1 KΩ ($V_{BE}$ of T6 is 0.7 volts), the voltage output $V_{OUT}$ was 1.35 volts, and was limited to a current $I_{OUT}$ of 0.7 mA.

A particular benefit of this current limiting is in the case of an electrical short - the circuit will allow only the maximum limited current to flow through rather than a potentially damaging high current, thus offering protection.

In some devices, the variation in $t_1$ may be much more strongly dependent on temperature than $t_2$ (e.g., see device #1 and 2 in Table 5 below). In such cases the powering circuit could be simplified so that only $t_1$ varies with temperature and $t_2$ is fixed in duration.

In all the examples above it is assumed that the coloration and bleaching are controlled by applying a pre-specified maximum potential and that this potential can be a step, ramp, non-linear, etc. In another method the power supply can be configured so that it applies a pre-specified current for coloring and bleaching, subject to a maximum safe-potential. This means that the applied potential from the power supply will vary with time (to compensate for changes in impedance, for example).

In coloration, as an example, a controlled current source could be used. The current is reduced, or the current source is removed, as the maximum safe-potential is reached. Thus, when a pre-specified potential between the cell electrodes is reached, the power source is removed. A current limit for coloring (or bleaching) for non-internal busbar cells is typically chosen between 50 to 5000 μA/cm² of active area of the EC cell, more preferably between 100 and 1000 μA/cm². For cells with internal busbars current limit (if imposed) can exceed the upper limit of this range to insure that time to color and bleach is rapid.

In all cases where the temperature is being measured, it is important that the temperature measuring or sensing elements such as thermistors, ferroelectric capacitors, thermocouples, or other such temperature measuring means, are mounted in such a way that they sense or measure temperatures that are similar to the temperature of the EC cells. That is, the measured temperature must have a corresponding relation to the temperature of the EC cell. For example, the measuring means could be mounted on a cell surface, on a cell edge, or at a position proximate to the cell so that the temperature of the cell and the temperature of the sensing element are similar. In some cases it may be preferred to mount the thermistor so that it is hidden from the direct view of the user. Adhesives with high thermal conductivity may be used for mounting so that the sensing elements are close in temperatures to the substrates they are mounted on.

In other examples where the EC cell is large, or where the sensing element controls multiple EC cells, it is apparent that the sensing element should measure a temperature that is relevant to the temperature of the large EC cell or of the multiple EC cells. Such relevant temperature would be, for example, an average temperature across the large EC cell or the multiple EC cells. In other cases, the peak or low temperature might be relevant. Accordingly, the sensing element should be positioned so that such a relevant temperature is sensed or measured.

The above descriptions of determining $t_2$ may also be used for determining and/or controlling $t_1$. The time period $t_b$ may be fixed or could be varied.

The Examples which follow are intended as an illustration of certain preferred embodiments of the invention, and no limitation of the invention is implied.

Example 16 with Thermistor and/or Ferroelectric Capacitor

Referring to FIG. 36A, the EC control circuit was designed to incorporate the intermittent powering of the EC cell E1, as described above. In this example, the coloring and bleach potentials were fixed at 1.2 V and −3V respectively, while $t_1$ and $t_2$ were allowed to vary with temperature.

The system can utilize any convenient voltage as would be apparent to one of ordinary skill in the art. In this case, for example, 12V DC is used. The voltage can be supplied from any convenient source such as, for example, from a car battery or from a transformer that steps down 110V AC to 12V DC. The circuit uses a LM 556 dual timer (National Semiconductor, Santa Clara, Calif.), which includes an astable timer U1/A and a monostable single shot timer U1/B, to control the timed cycles for the EC device.

Astable timer U1/A includes an RC circuit comprised of resistors R2, R3, and capacitor C1. This astable timer provides the holding and voltage application periods. The periods for $t_1$ and $t_2$ are obtained by using the formula $t_1=0.693(R3+R2)C1$ and $t_2=0.693(R2)C1$. The output of timer U1/A drives a transistor Q1 which then further drives a transistor Q2. Transistor Q2 activates the relay K1:A which upon closing applies the coloring potential from the 1.2V voltage source.

A pair of diodes D1 and D2 isolate the outputs of U1/A and U1/B from each other. Astable timer U1/A is cycling constantly but its output is only applied to electrochromic cell E1 when switch S3 is in the color position after an initial time period, for example, 200 sec from U1/B.

Resistors R2 and R3 may each be replaced with a NTC thermistors, e.g., model DC95-& 104Z available from Thermometrics, Edison, N.J., to allow for $t_1$ and $t_2$ compensation at electrochromic cell E1. For example, the cycling conditions of a particular EC device at 25° C. are $t_1$=138 sec, $t_2$=69 sec. These times are obtained with thermistor R2 and R3 values of 100 KΩ and C1 of 1 mF. Using the thermistors described, the resistance increases to 1 MΩ at −25° C. and decreases to 23 KΩ at 65° C., resulting in $t_1$=1444 sec and $t_2$=722 sec at −25° C., and $t_1$=32 sec and $t_2$=16 sec at 65° C., respectively.

Monostable single shot timer U1/B provides the initial duration—in this case, for example, 200 sec, of coloring or bleaching potential. The duration for the initial color ($t_i$) or bleach ($t_b$) is calculated according to the formula t=R3*C4. The values are calculated, in this example, to yield the 200 sec duration to initially color or bleach the cell and is triggered by switch S1. The output from switch S1 drives transistors Q2 and Q3. Resistor R6 can be replaced with an NTC thermistor to obtain longer and shorter initial bleaching (or coloring) periods, respectively.

The potential which is applied to electrochromic cell E1 depends on the position of switch S3, which the user selects. If switch S3 is in the coloring position, astable timer U1/A takes over after the initial 200 sec coloring cycle and then electrochromic cell E1 is cycled intermittently by astable timer U1/A to maintain coloration. Astable timer U1/A is never applied while switch S3 is in the bleaching position.

Alternatively, ferroelectric-capacitors having a Curie point, $T_c$, for example, below −45° C., based on $SrTiO_3$-containing compositions, can also be used in the timer circuit to provide temperature sensitive capacitors. In these capacitors, the capacitance declines with increasing temperature. Accordingly, such capacitors can be used to cause the periods of $t_1$ and $t_2$ to be changed along non-linearly with temperature changes, such as to cause even longer periods at lower temperatures and shorter periods at higher temperatures. Furthermore, a combination of thermistors and ferroelectric capacitors can be used simultaneously to obtain the RC product necessary to change $t_1$ and $t_2$ according to temperature.

A microcontroller can also be used to obtain $t_1$ and $t_2$ functionalities in the control circuitries using built-in timer modes thus negating the use of any external timer chips such as LM555 or LM556. Examples of such microcontrollers are PIC16F84 from Microchip (Chandler, Ariz.), MC68HC11E9 from Motorola (Tempe, Ariz.), and Z-80 from Zilog (Campbell, Calif.). Temperature sensors can be connected to the microcontroller to change $t_1$ and $t_2$ accordingly. Flash memory or EEPROM can further be utilized in conjunction with the microcontroller to store information on the temperature dependence, electrical history and aging properties of the EC cell. This information will then be used as feedback to optimize the cell bleaching and coloring characteristics. These may include changes to $V_c$, $V_b$, $T_{c1}\%$, $T_{c2}\%$, $t_i$, $t_1$, $t_2$ and $t_b$.

Figure 36B:
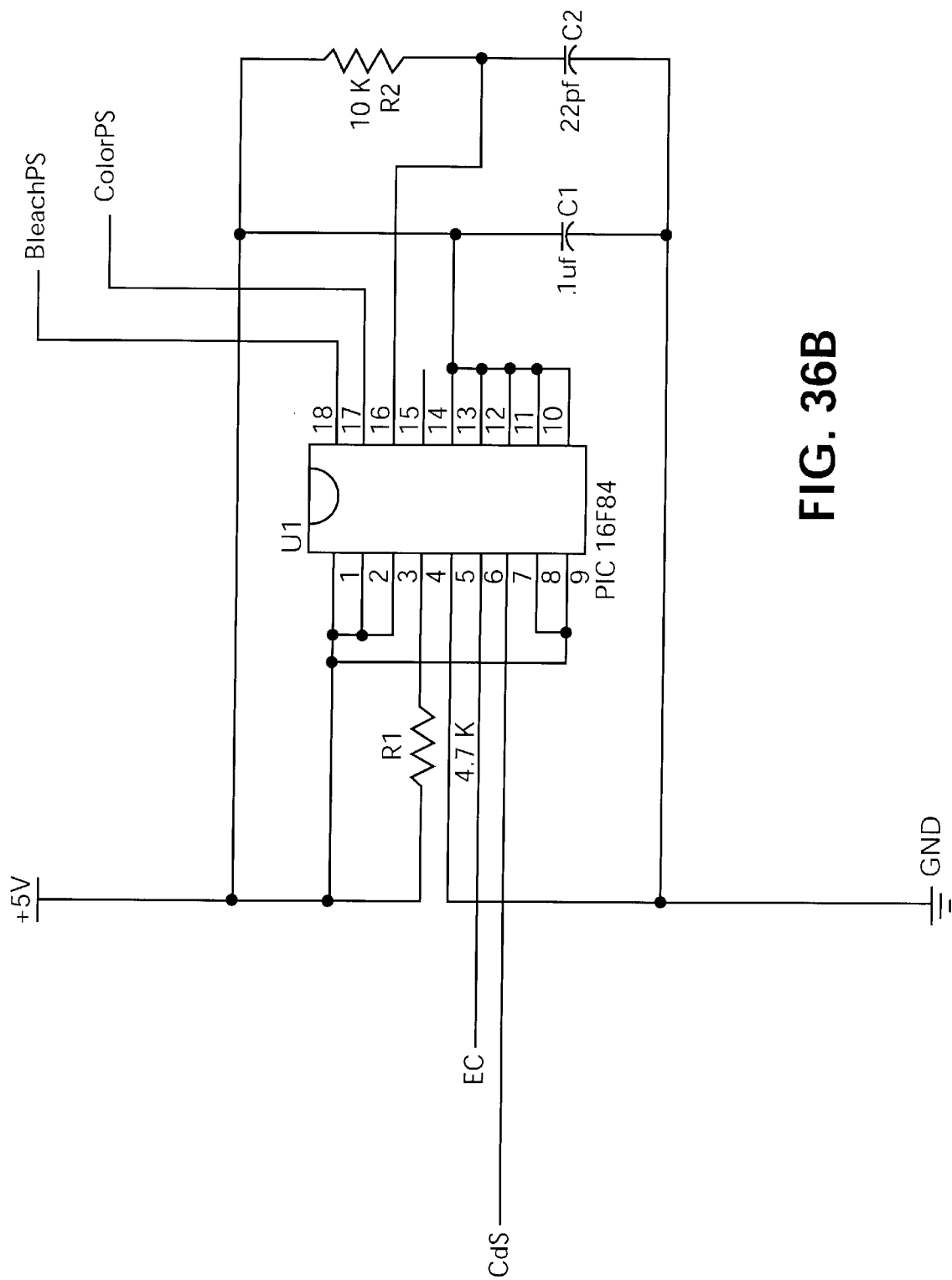
FIG. 36B is a circuit diagram of an embodiment of the present invention that includes a micro-controller.

In a particular example, a Microchip microcontroller PIC16F84 as shown in FIG. 36B was used (in place of the LM 556 dual timers of FIG. 36A) in a circuit similar to that shown in FIG. 36A. The EC cell was configured so that it could only be colored during the day time by using a CdS photocell sensor to determine whether it is daytime or nighttime. At night, the EC coloring function was disabled. Upon coloring, a coloring potential of 1.2V from the power supply would be applied to the cell for 3 minutes. Following this initial coloring potential, the specific $t_1$ and $t_2$ intermittence functionality (for example, 45 sec turn off and 15 sec turn on of the coloring potential) was also written into the program. Upon bleaching, a −0.3 V would be applied to the cell for 3 minutes. During the coloring or bleaching process, the output pin would be enabled turning on the relay or semiconductor switches to power the EC cell directly from the coloring or bleaching power supplies. The firmware was programmed into the microcontroller using a PicStart Plus Programmer. A thermistor suitably mounted on the EC cell can also be connected to one of the I/O ports in the P1C16F84. The change in resistance of the thermistor is then correlated to temperature of the EC cell. Depending on the temperature measured, the coloring and bleaching potentials, $t_1$ and $t_2$ characteristics can then be controlled. Microcontrollers can also be used to control the powering method of the EC cells during coloring and bleaching. This includes specific potential ramps, constant current control, or potential increases and decreases in multiple discrete steps.

Example 17

Change in $t_1$ and $t_2$ with Temperature of Electrochromic Devices

Various electrochromic devices, 3 in×3 in, were fabricated using 12 ohms/square ITO as the conductive substrates. The tungsten oxide coating deposition methods and device fabrication processes used in these EC devices were similar to the methods and processes described in copending U.S. patent application Ser. No. 09/155,601 (incorporated by reference herein) which also describes the use of and methods to fabricate Selective Ion Transport Layers (SITL). The EC devices were made both with SITL layers and without SITL layers. The electrolyte consisted of at least one solvent, one dissociable salt and at least one redox promoter. Polymeric viscosity modifiers and UV stabilizers and water were also added.

Although any of the solvents described in copending U.S. Pat. Application Ser. No. 09/155,601, could be used, although carbonates, sulfolanes, glymes, and their mixtures are preferred. Examples of suitable carbonates are propylene carbonate, ethylene carbonate, ethyl propyl carbonate, isopropyl ethyl carbonate, diethyl carbonate, methyl propyl carbonate, isopropyl methyl carbonate, ethyl methyl carbonate, dimethyl carbonate, butylene carbonate and other alkyl carbonates. Examples of some other suitable solvents are alkyl sulfones, tetraglyme, toluene, xylene, decaline and other aliphatic and aromatic alkyls with or without substituted polar groups.

Dissociable salts were typically based on alkali metal cations, such as lithium, sodium, and potassium. Some examples of suitable anions are perchlorate, tetrafluoroborate, triflate, etc., as described in copending U.S. patent application Ser. No. 09/155,601, which lists other suitable salts.

When tungsten oxide, molybdenum oxide and other cathodic oxides and their mixtures were used as chromogenic layers, the redox promoters used in the devices were typically based on ferrocene and its derivatives. Substituted ferrocenes with electron donating groups attached on the cyclopentadiene rings of the ferrocenes are a preferred sub-class in ferrocenes. These groups can be substituted to any of the cyclopentadiene rings. Further, the substituted groups may be the same or different on each of the rings. Such groups include methyl, propyl, n-butyl, tertiary butyl, etc. Examples of such ferrocenes include decamethyl ferrocene, octamethyl ferrocene, tertiary butyl ferrocene, interannual substituted ferrocenes such as 1-1'-(propane-1,3-diyl) ferrocene, 1,1':3,3'-bis(propane-1,3-diyl) ferrocene, 1,1':2,2':4,4'-tri(propane-1,3-diyl) ferrocene. Another preferred sub-class of ferrocenes are biferrocenes and bridge ferrocenes, where in the latter, the cyclopentadiene rings of different ferrocene molecules are chemically bonded to each other. Examples of these include 2,2-bis(tert-butylferrocenyl)propane, 2,2-bis(ethyl ferrocenyl)propane, etc. Further, the selection of the ferrocene will also influence the extent of the back reaction with other ingredients, components and device construction details remaining the same.

Typically, inclusion of polymers that are soluble in the electrolyte will result in increased viscosity and accordingly such polymers can be used as viscosity modifiers.

The size of such crystals should typically be smaller than about 0.5 $\mu$m, preferably less than 0.2 $\mu$m so that they do not create haziness in optically clear systems. Some preferred polymers are polymethyl methacrylate, polyvinyl chloride, polyvinyl chloride and polyvinyl acetate copolymers, polyvinyl butyral, polyacrylonitrile and its copolymers, polyvinylidene fluoride, copolymers of polyvinylidene fluoride and hexafluoropropylene. The last two are available from Elf Atochem North American (Philadelphia, Pa.) under the trade names of Kynar and Kynar flex respectively.

In one of the samples the electrolyte was processed using a sol-gel technique to form a solid. The solid resulted from the formation of "Si—O—Si" cross-linkages in-situ after filling the EC cell with a electrolyte precursor. This is also described below.

The selection and the concentration of the ingredients described above will influence the extent of the back reaction while other components and device construction details remain the same. The back reaction will change with temperature and this will cause change in $t_1$ and $t_2$.

As shown in Table 5 below, the presence and absence of a SITL layer, the type of SITL layer, and any changes in the electrolyte have considerable influence on $t_1$ and $t_2$. Polyceram SITL layer formation by sol-gel processing is described below. Polystyrene-sodium-sulfonate (PSSNa) SITL layer was processed by dip-coating the tungsten oxide coated substrates with a 540,000 mol. wt. PSSNa solution (5% by weight/vol) in a 50/50 mixture (by volume) of distilled water and reagent grade ethanol and 0.01% of a surfactant, Triton X-100 available from Aldrich Chemical Co. (Milwaukee, Wis.).

The devices were colored by applying 1.2V. The values of $T_{c1}\%$ and $T_{c2}\%$ (FIG. 35) were 10% and 15% respectively. The leakage current was measured as the current consumed after applying the coloring potential for 15 minutes. The table also shows that when ferrocene has bulky constituents, such as in the compound 2,2-bis(ethyl ferrocyl)propane, a lower leakage current is obtained. For example, compare the leakage current of device 1 to that of device 2, and the leakage current of device 5 to that of device 6.

The various elecctrolyte compositions were:

Electrolyte A: 85% Propylene carbonate, 0.8% 2,2-bis (ethyl ferrocenyl) propane, 0.4% LiClO$_4$, 9.4% PMMA, 3.6% UV400, and 0.1% water (all percentages by weight).

Electrolyte B: 85.2% Propylene carbonate, 0.7% ferrocene, 0.4% LiClO$_4$, 9.5% PMMA, 3.6% UV400 and 0.7% water (all) percentages by weight).

Electrolyte C: 53.6% Propylene Carbonate, 35.7% Sulfolane, 8.4% Poly(methyl methacrylate), 1.0% Dionized water, 0.8% Ferrocene, 0.5% Lithium perchlorate (all percentages by weight).

TABLE 5

| Device # | Electrolyte composition | SITL Layer | Type of SITL layer | Temp. ° C. | $t_1$ (s) | $t_2$ (s) | Leakage current ($\mu$A/cm$^2$) |
| --- | --- | --- | --- | --- | --- | --- | --- |
| 1 | Electrolyte C | No | | 25 | 30 | 20 | 210 |
| | | | | 50 | 20 | 20 | 370 |
| | | | | 70 | 15 | 20 | 530 |

TABLE 5-continued

| Device # | Electrolyte composition | SITL Layer | Type of SITL layer | Temp. °C. | $t_1$ (s) | $t_2$ (s) | Leakage current ($\mu A/cm^2$) |
|---|---|---|---|---|---|---|---|
| 2 | Electrolyte A | No | | 25 | 61 | 6 | 126 |
| | | | | 50 | 31 | 4 | 268 |
| | | | | 70 | 24 | 4 | 392 |
| 3 | See formation of sol-gel electrolyte below this table | No | | 25[a] | 7 | 31 | 29 |
| | | | | 50[b] | 5 | 15 | 87 |
| | | | | 70[c] | 2 | 12 | 151 |
| 4 | Electrolyte B | Yes | Polyceram-2 | 25 | 1079 | 14.4 | 6.4 |
| | | | | 50 | 431 | 7.2 | 31.5 |
| | | | | 70 | 184 | 5.8 | 90.0 |
| 5 | Electrolyte B | Yes | Polyceram-1 | 25 | 590 | 24 | 10 |
| | | | | 50 | 145 | 8 | 47 |
| | | | | 70 | 64 | 6 | 136 |
| 6 | Electrolyte A | Yes | Polyceram-1 | 25 | 2749 | 10.2 | 4.8 |
| | | | | 50 | 1272 | 6 | 13 |
| | | | | 70 | 785 | 4 | 26.7 |
| 7 | Electrolyte C | Yes | PSSNa | 25 | 3600 | 25 | 3.3 |
| | | | | 70 | 900 | 7 | 14.5 |

[a]$T_{c1}$ % and $T_{c2}$ % were 18.8% and 23.8% respectively
[b]$T_{c1}$ % and $T_{c2}$ % were 23.3% and 28.3% respectively
[c]$T_{c1}$ % and $T_{c2}$ % were 30% and 35% respectively Example Formation and Processing of Polyceram-1 SITL Layer ($CH_3(OCH_2CH_2)_nOCONH(CH_2)_3Si(OC_2H_5)_3/Si(OCH_3)_4$, Overcoated on $WO_3$ electrode)

Polyceram layer was processed as described in the examples given below. Polyceram layer was made in the same way but the ratio of ingredients was modified. The weight ratio of $(CH_3(OCH_2CH_2)_nOCONH(CH_2)_3Si(OC_2H_5)_3$ to $Si(OCH_3)_4$ was 1:0.51 in the case of Polyceram-1 but 1:1.02 in the case of Polyceram-2.

75.00 g of poly(ethylene glycol) methyl ether, $CH_3(OCH_2CH_2)_nOH$ (number average MW=ca. 350, obtained from Aldrich Chemical Co., Milwaukee, Wis.), 58.31 g of 3-(triethoxysilyl) propylisocyanate, $(C_2H_5O)_3Si(CH_2)_3NCO$, and 0.15 ml of dibutyltin dilaurate were heated at approximately 50° C. under nitrogen, with stirring, for 2 hrs to give a silylated derivative with the nominal formula: $CH_3(OCH_2CH_2)_nOCONH(CH_2)_3Si(OC_2H_5)_3$.

24.30 g of $CH_3(OCH_2CH_2)_nOCONH(CH_2)_3Si(OC_2H_5)_3$, 49.59 g of $C_2H_5OH$ and 2.20 g of $H_2O$ (acidified to 0.15M HCl) were combined and refluxed for 30 mins. The solution was then cooled and 12.38 g of Si $(OCH_3)_4$ added and the resulting solution refluxed for 60 mins. The solution was then cooled and 5.86 g of $H_2O$ (acidified to 0.15M HCl) was added and the resulting solution refluxed for 60 mins. The solution was then cooled and 3.00 g of Amberlyst® A-21 ion-exchange resin (Rohm & Haas Co.) added, followed by gentle stirring. After 30 mins the solution was filtered through a fritted glass disc Buchner funnel. 45.00 g of the filtrate was taken and 0.21 g of 3-aminopropyltriethoxysilane was added. The resulting solution was diluted 1:1 (by weight) with ethanol and filtered through a 1 μm syringe filter. It was then spin-coated on a transparent $WO_3$ ITO coated glass substrate. The coating was cured at 135° C. for 1 hr under humid atmosphere, after this treatment it has a thickness of about 0.6 μm. A device was then assembled as described in Comparative Example 1.

Example

Formation and Processing of Polyceram-2 SITL Layer ($CH_3(OCH_2CH_2)_nOCONH(CH_2)_3Si(OC_2H_5)_3/Si(OCH_3)_4$ overcoated on $WO_3$ electrode)

6.08 g of $(CH_3(OCH_2CH_2)_nOCONH(CH_2)_3Si(OC_2H_5)_3$, 12.40 g of $C_2H_5OH$ and 0.55 g of $H_2O$ (acidified to 0.15M HCl) were combined and refluxed for 30 mins. The solution was then cooled and 6.19 g of Si $(OCH_3)_4$ added and the resulting solution refluxed for 60 mins. The solution was then cooled and 2.93 g of $H_2O$ (acidified to 0.15M HCl) was added and the resulting solution refluxed for 60 mins. the solution was then cooled and 1.30 g of Amberlyst® A-21 ion-exchange resin (Rohm & Haas Co.) added, followed by gentle stirring. After 30 mins the solution was filtered through a fritted glass disc Buchner funnel. The filtrate was diluted 1:2 (by weight) with ethanol and filtered through a 1 μm syringe filter. It was then spin-coated on a transparent $WO_3$ ITO coated glass substrate. The coating was cured at 135° C. for 1 hr under a humid atmosphere, after this treatment it had a thickness of 0.3 μm. A device was then assembled as described in Comparative Example 1.

Example

Formation of Sol-gel Electrolyte

This describes a crosslinkable electrolyte which can be substituted for the electrolyte in cells such as those given in Comparative Example 1a or in other examples with SITL overlayers described earlier. The electrolyte was prepared in the following way: 12.00 g of poly(ethylene glycol). $HO(CH_2CH_2O)_nOH$ (number average molecular weight=ca. 400, obtained from Aldrich Chemical Company), 15.58 g of 3-(triethoxysilyl) propyl isocyanate, $(C_2H_5O)_3Si(CH_2)_3NCO$ (obtained from Aldrich Chemical Company), and 0.03 g dibutyltin dilaurate, $(CH_3(CH_2)_3)_2Sn(O_2C(CH_2)_{10}CH_3)_2$, were heated to approximately 70° C. under nitrogen, with stirring, for 15 minutes to yield a silylated derivative with the nominal formula: $(H_5C_2O)_3Si(CH_2)_3HNOC(OCH_2CH_2)_nOCONH(CH_2)_3Si(OC_2H_5)_3$.

2 g of $CH_3(OCH_2CH_2)_nOCONH(CH_2)_3Si(OC_2H_5)_3$, 1.50 g $(H_5C_2O)_3Si(CH_2)_3HNOC(OCH_2CH_2)_nOCONH(CH_2)_3Si(OC_2H_5)_3$ (prepared as above), 1.75 g γ-butyrolactone, 0.0326 g ferrocene, and 0.4107 g $LiClO_4$ are stirred until a clear solution is formed. Then 0.3636 g $H_2O$ (acidified to 0.15 M HCl) is added. The solution is stirred until homogeneous. A cell fabricated as in comparative Example 1 utilizing an ITO electrode and a transparent $WO_3$ ITO coated glass substrate is then filled with the solution obtained above. The cell thickness in this example was 53

μm rather than 210 μm as given in the earlier example. After filling the cell, the solution forms a rigid gel (net work) within 10 hours. The gel time can be controlled, e.g., by changing the type and amount of catalyst (e.g., HCl is used above) as known in the art, temperature of cell after filling and using appropriate functionality of the ingredients. Functionalised ferrocenes also could be used which will attached chemically to the electrolyte network. Some exemplary ferrocenes are:

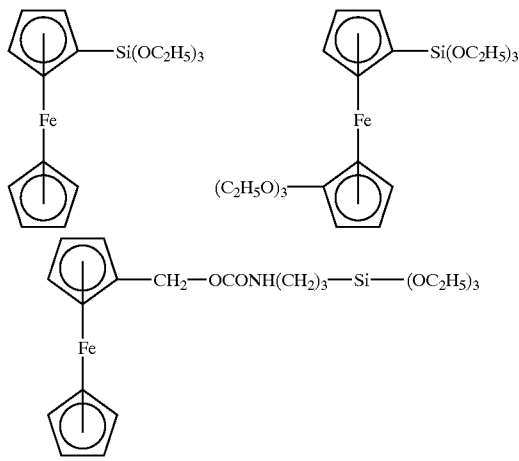

These ferrocenes could be used by themselves or in conjunction with non-functionalized ferrocenes (the ones which will not chemically attach to the network). Depending on the cell characteristics if non-ferrocene redox materials are used, the same can be implemented for non-ferrocene redox materials. The cell may also consist of ferrocene and non-ferrocene based redox materials.

Power Consumption Reduction in EC Devices by Using Switching Power Supplies

The power consumption of these devices can be further reduced by incorporating such elements in the circuit that would efficiently step down the voltages from the incoming power supply to the desired coloration or bleaching voltages. For example, a typical car battery has an output of about 12V, while an EC device might only need 1 to 2 volts for coloration, for example 1.2V. Thus, if the EC device needs a current of 10 mA in the colored state at a voltage of 1.2V, then a power conserving circuit would allow only a 1 mA drainage from the battery at 12V assuming that the power is converted at 100% efficiency.

Typical power supplies for powering EC devices in automotive mirrors use linear regulators or linear regulation for the voltage conversion process. Although widely used for such applications, the power conversion efficiencies of linear regulators are usually very low, typically 10–30%. The conversion efficiency, however, is typically not a major concern. Since the EC mirror is normally operated when the car in turned on, the current or power draw is not a significant drain on the car's alternator and linear regulation can be utilized. Examples of such circuits are described in U.S. Pat. Nos. 5,148,014, 5,193,029, and 5,220,317, each incorporated herein by reference.

However, the switching regulator can be used for EC devices as taught in the present invention and can offer up to 95% efficiency. In the prior art power supplies, the current draw is usually maintained when the voltage is switched from high to low potential. For example, for linear regulators, in going from 12 V at 1 mA, to 1.2 volts, the output current will still be 1 mA, which reflects a power conversion efficiency of only 10%. In this invention, use of circuits that regulates the power supply voltage by a switching function to control the electrochromic products increases the power conversion efficiency by at least two fold over linearly regulated power supplies.

In aircraft, boats, eyewear and automotive EC windows, such as automotive EC sunroofs, where the coloration needs to be maintained even when the vehicle is in a mode such as when parked, where the engine is off, the current drain from the battery becomes a critical issue. In cars, the current draw is usually preferably 2 mA or less at 12V in order not to drain the battery excessively. During this coloration state, the present invention subjects the cell to an intermittent voltage rather than a continuous voltage, thereby enhancing device durability. During initial coloration and intermittent coloration periods ($t_2$) the switching power supply of the present invention is used to convert the power efficiently to reduce the battery drain. During the holding period when no current is flowing, the regulator should preferably have a low or no quiescent current.

Figure 37A:
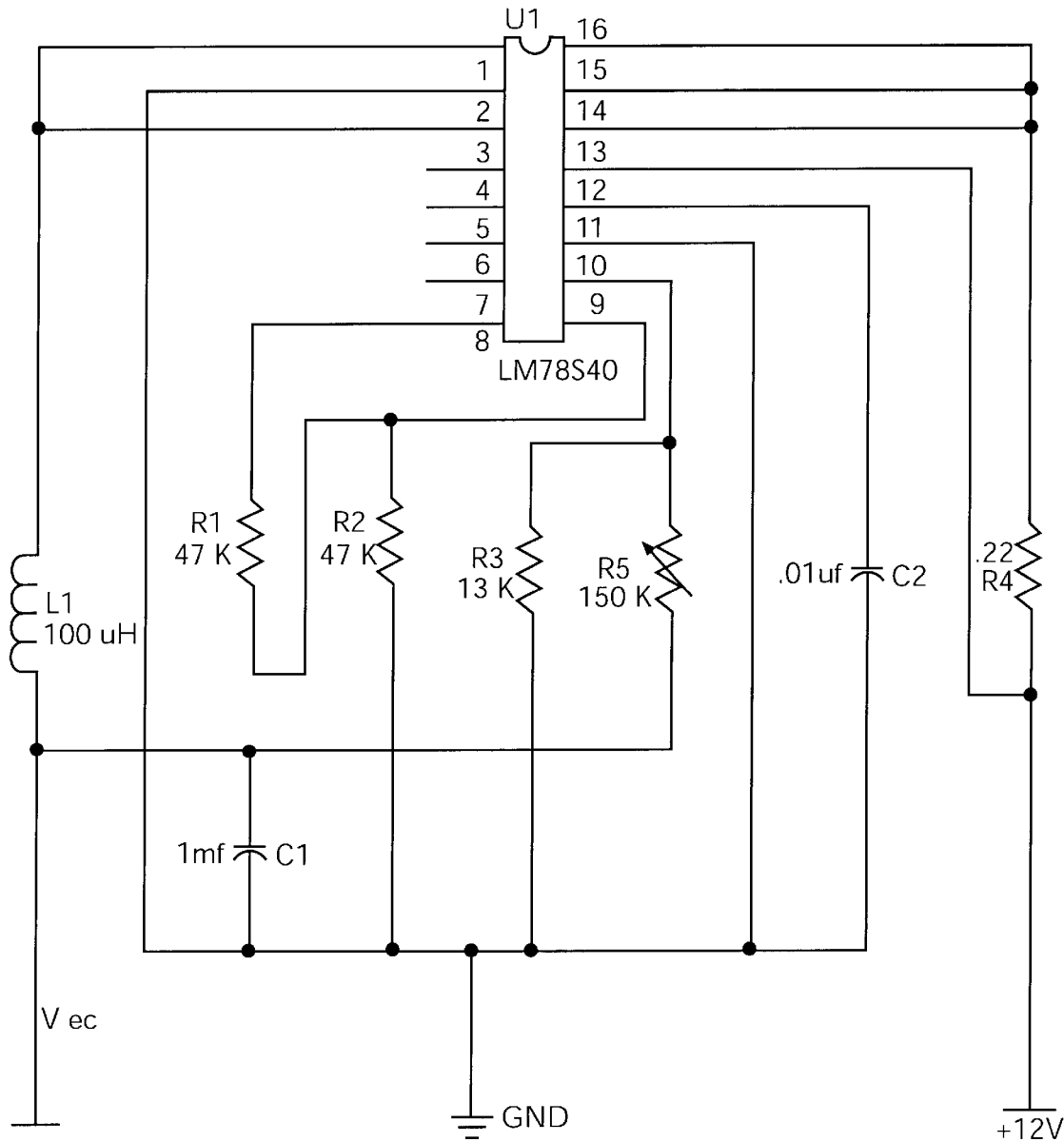
FIG. 37A is a circuit diagram of a switching regulator circuit according to an embodiment of the present invention.

An example of a switching regulator circuit used in this invention is shown in FIG. 37A. The circuit is able to regulate even low voltages below about 1.2V. As described earlier, the switching regulator circuit of this invention has a low or no quiescent current in order not to drain the battery excessively. Switching regulators, as used here, have lower current drains than linear regulators. The switching regulator of the present invention preferably should have a quiescent current drain of lower than 100 mA. It is more preferred that the switching regulator of the present invention have a quiescent current drain of lower than 25 mA and most preferably lower than 5 mA. Such low current drains minimize drawdown of the battery in situations where the battery is not being charged such as while the vehicle is parked with ignition off.

Comparative Example

Linear Regulator

During operation of a prior art well known linear regulator such as, for example, National LM317 (National Semiconductor, Santa Clara, Calif.) series pass transistor is turned on continuously and the output voltage is determined through a voltage divider and a feedback circuit. There is a significant heat dissipation load for the transistor. Furthermore, as a result of the continuous "on" state of the transistor, there is a constant background current draw regardless of the load. When a load is connected, the conversion efficiency is typically not more than 30% for a ten fold change in voltage down conversion.

Example of Switching Regulator

In a switching regulator (e.g. National LM78S40), pulse width modulation (PWM) is used to switch the input voltage through a high speed transistor at an adjustable duty cycle. In contrast to a linear regulator where the series pass transistor is always on, in a switching regulator the series pass transistor is turned on and off at a convenient predetermined frequency (usually in the range of about 25–250 kHz). The output voltage is the average of the rectangular pulses resulting from such switching. Switching regulation results in higher efficiency, such as over 30% and can be as high as about 95%. In addition, the quiescent current draw is also very low, typically less than 1 mA thus keeping overall heat dissipation low. Additionally in some switching regulators, e.g., Maxim MAX 1627 (Maxim Company, Sunnyvale, Calif.), the quiescent current draw can be further lowered to 1 μA.

As shown in FIG. 37A, a switching regulator circuit used in this invention can be based on a National LM78S40 switching regulator chip U1. It accepts a 12V pre-regulated input voltage. A peak current of 1.5A is assumed for this regulator. A sense resistor calculated as 0.33/peak current according to the manufacturer, R4 detects the peak incoming current. Based on the value of input and output voltage expected, a duty cycle of 23% is obtained. Assuming a switching frequency of 25 kHz, a turn-on time of 33 μs is calculated. Based on the turn off time, the timing capacitor C2 of 0.15 μF is then used to set the switching frequency to 25 kHz. An inductor, L1 was used to couple the switching pulses while the capacitor C1 reduces the ripples in the pulses to an average voltage output. The combination of peak current and turn-on time results in an inductance of 50 μH. Voltage ripple of 1% is tolerated resulting in the capacitor C1 of about 1 mF. The chip contains a built-in PWM module, Darlington series pass transistor and reference voltage. Trimmer resistor, R5, in conjunction with series resistor R3, then sets the output voltage. The built-in reference voltage is set at 1.3V which is the lower limit for the regulated voltage. In the circuit the reference voltage is reduced by using a voltage divider via series resistors, R1 and R2 of 1 MΩ each to further lower the minimum voltage regulated to 0.65V.

To change the applied potential to an EC device with temperature, an NTC thermistor can also be used in place of trimmer resistor R5. At higher temperatures, the resistance decreases, leading to lower coloring and bleaching voltages while at lower temperatures, the resistance is higher resulting in higher voltages.

Switching regulator radiates EMI due to the switching transistor. Adequate shielding, e.g. Faradaic shield, must be provided to mitigate such EMI to reduce electromagnetic interference with other subsystems including communications such as a cellular phone. For example the shielding aspect could be useful for powering of EC components in a car or any other transportation vehicle. It is also novel to use switching and linear regulator with the former working when the car is in a parked state while the latter being used while the car is parked (ignition off), the degree of interference to other electronic systems is lower.

Example of a Switching Regulator with Ultra Low Quiescent Switching Current

Figure 37B:
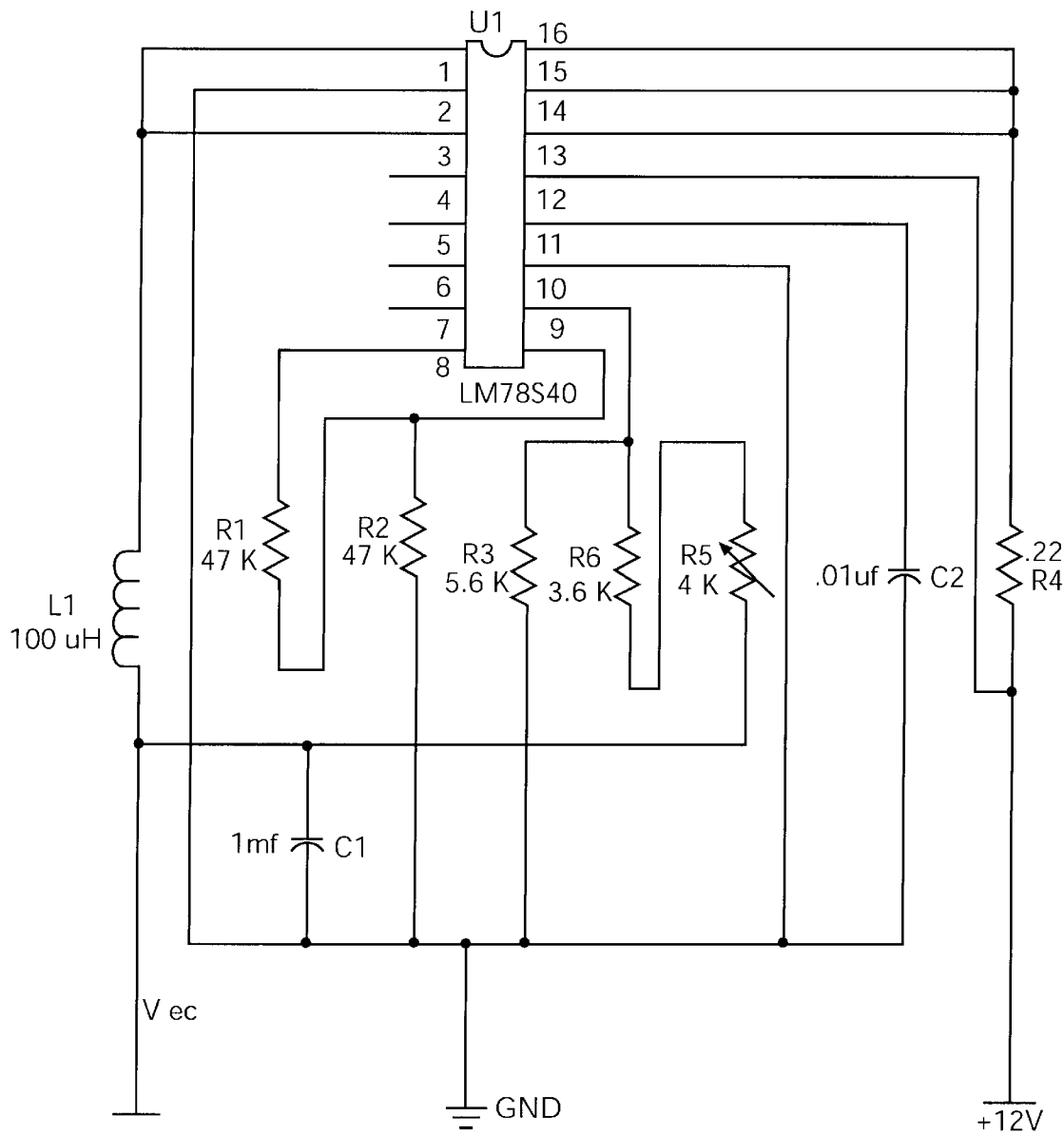
FIG. 37B is a circuit diagram of a switching regulator circuit according to an embodiment of the present invention.
Figure 37C:
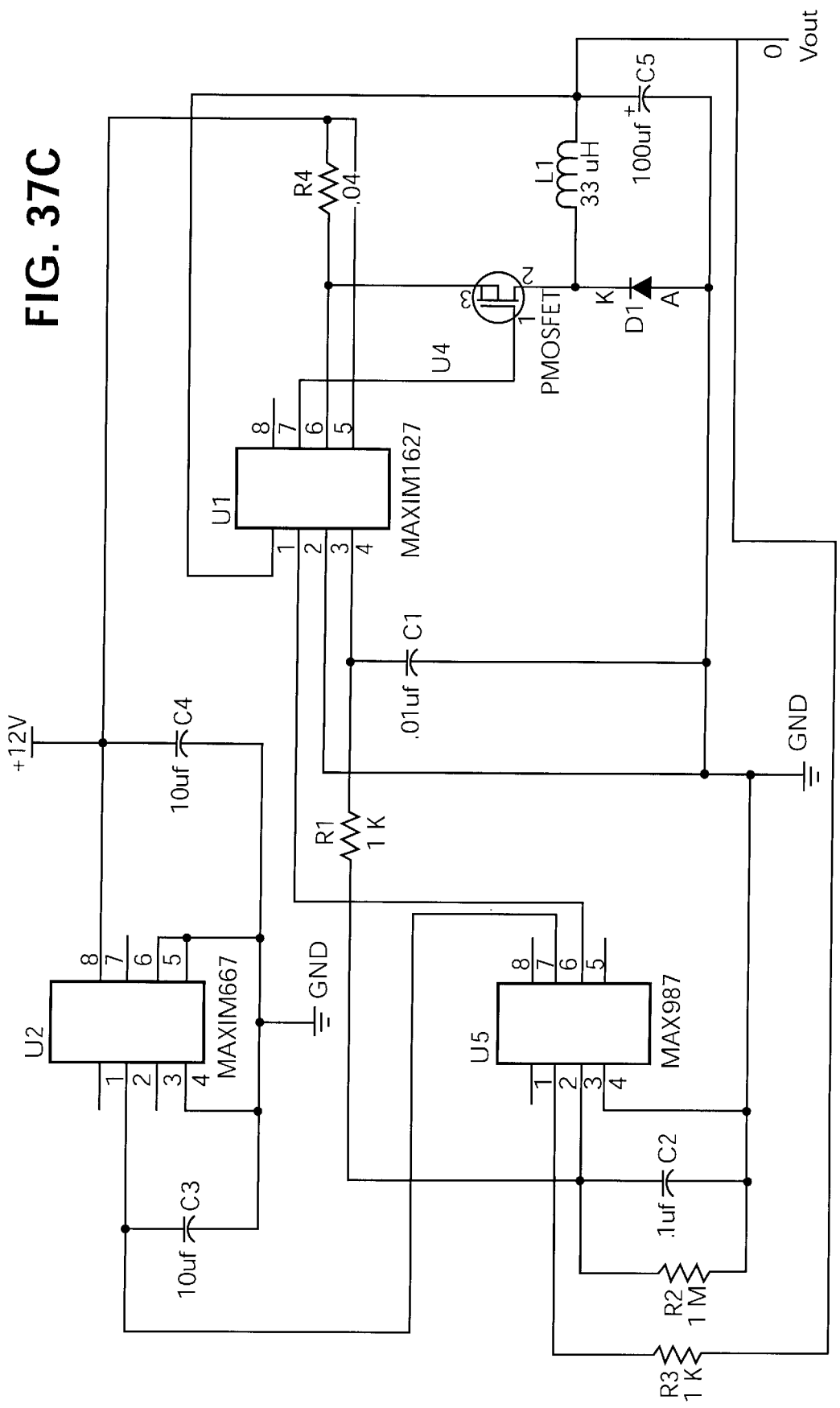
FIG. 37C is a circuit diagram of a switching regulator circuit according to an embodiment of the present invention yielding a very low quiescent current.

A switching regulator used in this invention employing a MAXIM Max 1627 yielding very low quiescent current of 0.001 mA is shown in FIG. 37C. The switching efficiency is a high as 85% at 1A current draw. Without modification using the manufacturers' specification, this chip outputs voltage at a lower limit of 1.27V. In this particular example, the circuit is modified, to allow output voltages lower than 1.27V, by having feedback resistors R2 and R1 connected through a high speed comparator MAXIM Max 987. The p-MOSFET used in the circuit was International Rectifier (El Segundo, Calif.) IRF7416.

Example of Ramped Voltage Application

Figure 38A:
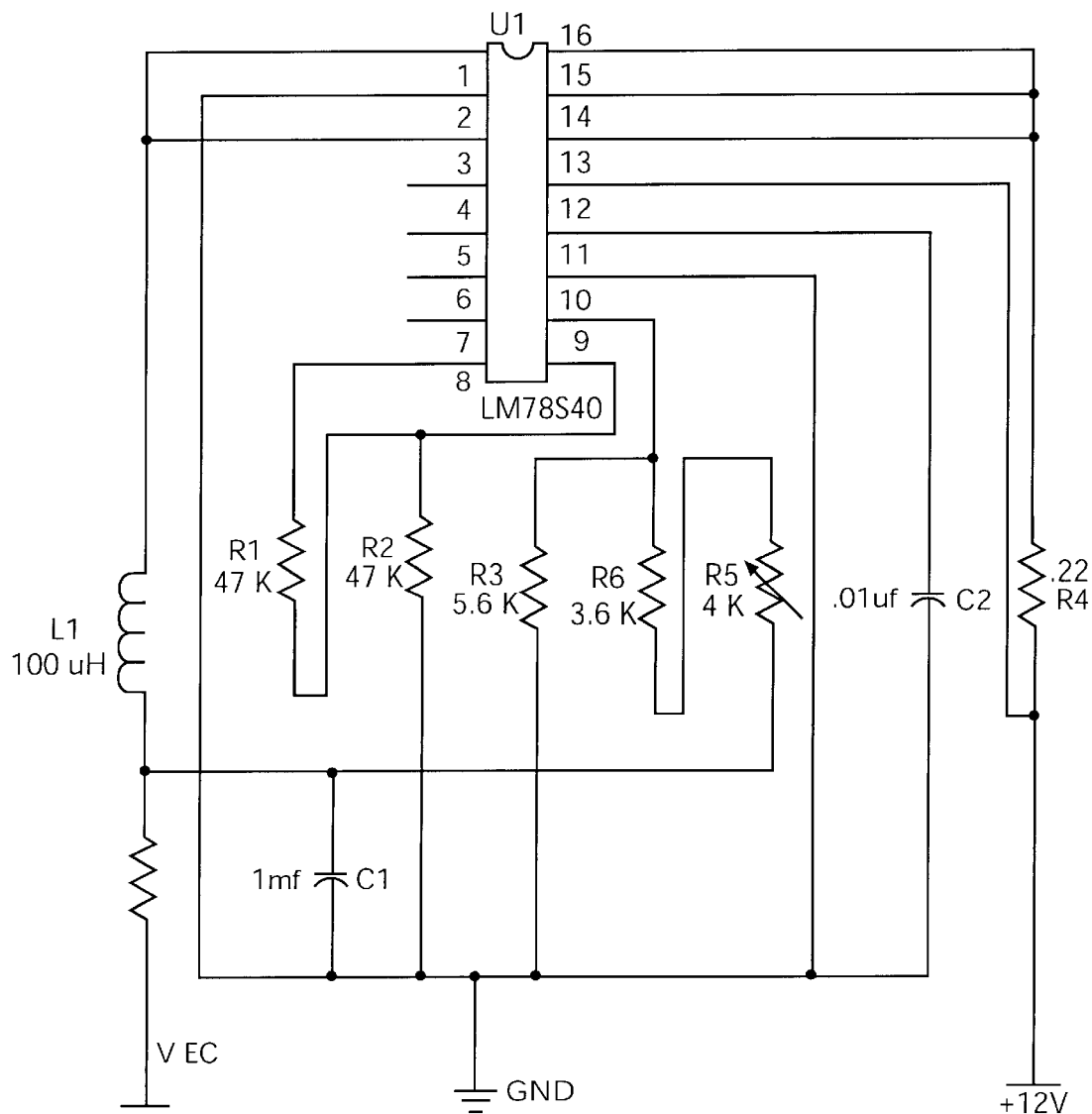
FIG. 38A is a circuit diagram of a switching regulator circuit according to an embodiment of the present invention having a resistor placed in series with the power supply output and EC cell.
Figure 38B:
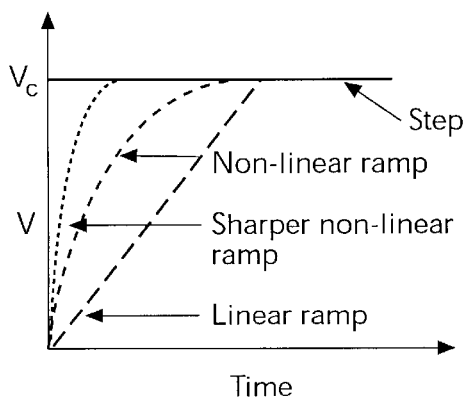
FIG. 38B describes the various shapes that the voltage vs. time curve can follow depending on the parameters of the control circuit of the present invention that controls an EC cell and compared to the prior art continuous step shape and the prior art linear ramp shape.
Figure 38C:
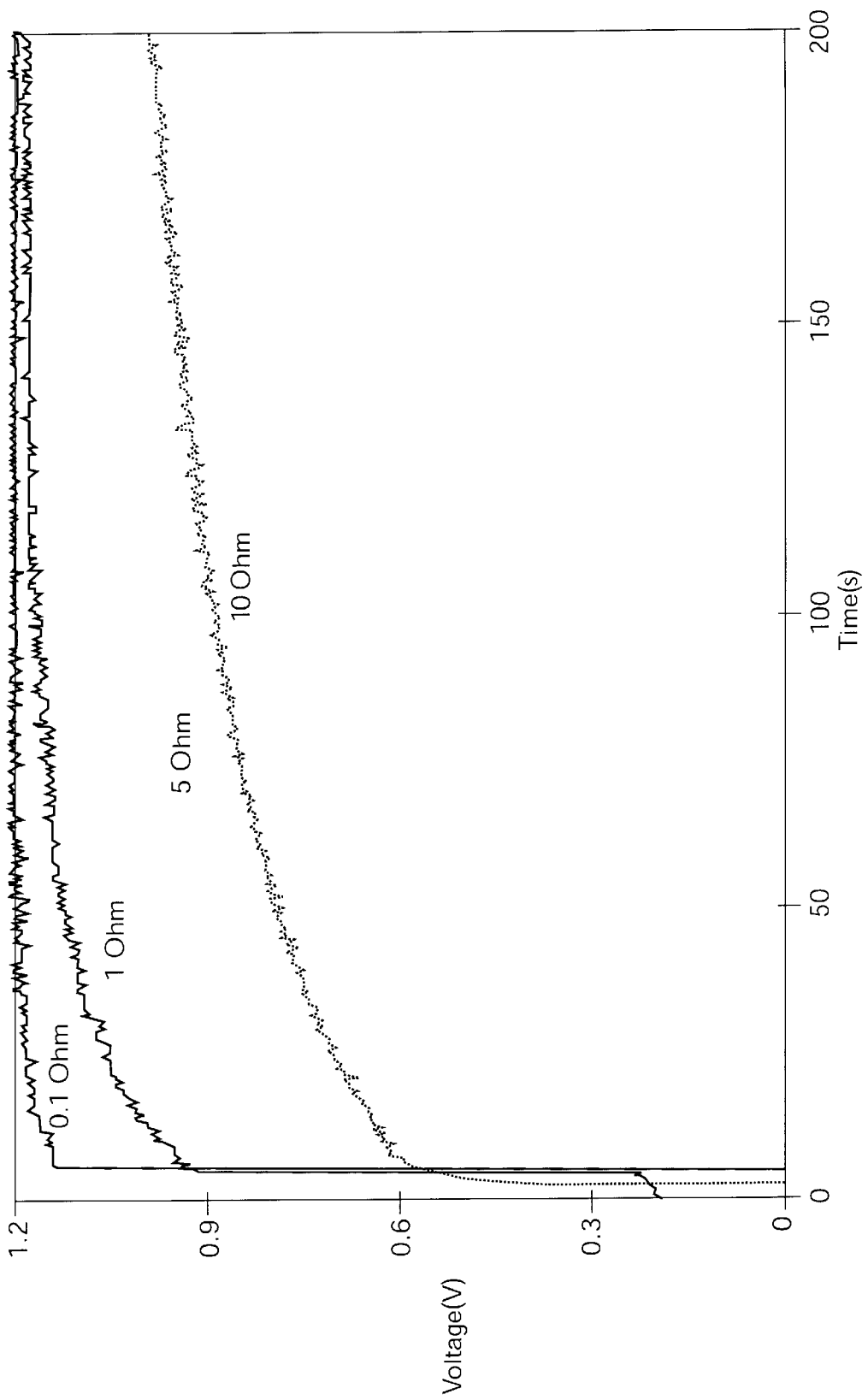
FIG. 38C describes the various shapes that the voltage vs. time curves can follow depending on the circuit resistance parameters.

The voltage applied to the EC cell may consist of a non-linear ramp. The ramp only refers to the time period when the voltage is changing before the voltage settles at the hold potential (e.g., $V_C$ is holding potential in FIG. 38B). Such non-linearity can be obtained, e.g., by having some amount of internal resistance in the power supply. This internal resistance can be intentionally designed into the power supply itself or by inserting an external resistor between the voltage terminal and the EC cell. This is shown in FIG. 38A where resistor R7 is placed in series with the power supply output and EC cell. FIG. 38C describes the various shapes that the voltage vs. time curves can follow depending on the circuit parameters. The applied voltage is across the EC cell and the resistor. During bleaching or coloring times, there will be a large initial surge of current resulting in a sizable ohmic drop in R7 which then limits the voltage applied to the EC cell. At saturation, only a very low amount of current flows, and the voltage drop across R7 becomes negligible and hence the EC cell sees the full potential again. The overall voltage applied to the EC cell during coloring and bleaching processes appears similar to a capacitor charging curve. The sharpness of the curves depends on the value of resistor used; larger resistance results in more gradual and slower saturation.

Switching Power Supply where Output Voltage Varies with Temperature

A switching regulator circuit was constructed similar to the one described previously except that a thermistor was located in place of fixed resistor R5—see FIG. 37B. An example of the thermistor used is KE D331BZ from Thermometrics (Edison, N.J.). It exhibits resistance values of 4000 Ω and 60 Ω at −25° C. and 65° C. respectively. By having another fixed resistor R6 with a value of 3.6 kΩ in series with thermistor R5 and fixed resistor R3 with a value of 5.6 kΩ, the voltage was automatically tuned to 1.3 V and 1 V at −25° C. and 65° C. respectively.

Other variations and modifications of this invention will be obvious to those skilled in the art. This invention is not limited except as set forth in the following claims.

What is claimed is:

1. A method to control an electrochromic device having a light transmission property that responds to a physical or chemical effect, wherein the light transmission property changes in response to an electrical signal, wherein said method comprises the step of:

intermittently applying the electrical signal by controlling the on duration $t_1$ and the off duration $t_2$ of the electrical signal individually, in response to the physical or chemical effect, effective to maintain the light transmission property within a range of about 1% to about 10% of a predetermined value of said light transmission property.

2. A method according to claim 1, wherein said $t_1$ and $t_2$ are controlled in response to the physical effect of temperature.

3. A method according to claim 1, wherein at least one of (i) the current, and (ii) the change of current with time, (iii) output from photosensors, (iv) charge passed through the device, (v) cell potential, to said electrochromic device is used to respond to the change caused in the device by the change in temperature; by changing said $t_1$ and $t_2$.

4. A method according to claim 1, wherein the temperature of the electrochromic cell is used to influence the control circuit so as to adjust $t_1$ and $t_2$.

5. An electrochromic device having a light transmission property that responds to a physical or chemical property, wherein the light transmission property changes in response to an electrical signal, wherein said electrochromic device includes:

a means to intermittently apply the electrical signal by controlling the on duration $t_1$ and the off duration $t_2$ of the electrical signal individually, in response to the physical or chemical property, effective to maintain the light transmission property within a range of about 1% to about 10% of a predetermined value of the light transmission property.

6. An electrochromic device according to claim 5, wherein the means to intermittently apply the electrical signal is a control circuit which includes:

an astable timer that supplies an input to a first RC timing circuit; and a monostable timer that supplies an input to a second RC timing circuit; wherein a first output from the first RC timing circuit and a second output from the second RC timing circuit are applied to the electrochromic device.

7. An electrochromic device according to claim 6, wherein a microcontroller provides $t_1$ and $t_2$.

8. An electrochromic device according to claim 5 or 6, wherein the voltage of the electrical signal is supplied from a regulated power supply that is regulated by a switching voltage regulator.

9. A method to control an electrochromic device having a light transmission property that responds to a physical or chemical property, wherein the light transmission property changes in response to an electrical signal, wherein said method comprises the step of:

intermittently applying the electrical signal by controlling the on duration $t_1$ and the off duration $t_2$ of the electrical signal individually, in response to the physical or chemical property, effective to maintain the light transmission property within a range of about 1% to about 10% of a predetermined value of said light transmission property; wherein the voltage of the applied electrical signal is supplied from a regulated power supply that is regulated by a switching voltage regulator.

* * * * *

UNITED STATES PATENT AND TRADEMARK OFFICE
CERTIFICATE OF CORRECTION

PATENT NO. : 6,449,082 B1
DATED : September 10, 2002
INVENTOR(S) : Anoop Agrawal et al.

It is certified that error appears in the above-identified patent and that said Letters Patent is hereby corrected as shown below:

Column 3,
Line 20, "affects" should read -- affect --.

Column 11,
Line 31, "differences" should read -- difference --; and
Line 41, "m aterials" should read -- materials --.

Column 13,
Line 34, "affect" should read -- effect --.

Column 14,
Line 26, "pair" should read -- pair of --.

Column 15,
Line 62, "are" should read -- is --.

Column 16,
Line 56, "a top" should read -- top --.

Column 22,
Line 38, "the each" should read -- each of the --; and
Line 39, "are" should read -- is --.

Column 27,
Line 54, "optionally," should read -- Optionally, --.

Column 28,
Line 10, "colors, was" should read -- was --.

Column 29,
Line 10, "Means" should read -- ¶ Means --.

UNITED STATES PATENT AND TRADEMARK OFFICE
CERTIFICATE OF CORRECTION

PATENT NO. : 6,449,082 B1
DATED : September 10, 2002
INVENTOR(S) : Anoop Agrawal et al.

It is certified that error appears in the above-identified patent and that said Letters Patent is hereby corrected as shown below:

Column 31,
Line 66, "conductive is" should read -- conductivity is --.

Column 32,
Line 62, "are" should read -- is --.

Column 33,
Line 61, "rib" should read -- $r_{ib}$ --.

Column 34,
Line 46, "allows" should read -- allow --.

Column 39,
Line 7, "conduct or" should read -- conductors --;
Line 8, "s" should be deleted; and
Line 56, "the." should read -- the --.

Column 40,
Line 9, "provide" should read -- provides --; and
Line 48, "Example 3" should read -- Example 3C: --.

Column 45,
Line 41, "is" should read -- are --; and
Line 42, "colored" should read -- color --.

Column 46,
Line 4, "referes" should read -- refers --.

Column 48,
Line 16, "determined" should read -- determine --; and
Line 24, "are" should read -- is --.

UNITED STATES PATENT AND TRADEMARK OFFICE
CERTIFICATE OF CORRECTION

PATENT NO. : 6,449,082 B1
DATED : September 10, 2002
INVENTOR(S) : Anoop Agrawal et al.

It is certified that error appears in the above-identified patent and that said Letters Patent is hereby corrected as shown below:

Column 52,
Line 13, "along" should be deleted; and
Line 14, "such" should read -- so --.

Column 58,
Line 4, "regulates" should read -- regulate --.

Signed and Sealed this

Fifteenth Day of July, 2003

JAMES E. ROGAN
*Director of the United States Patent and Trademark Office*